(12) United States Patent
Yoshihara et al.

(10) Patent No.: US 10,475,670 B2
(45) Date of Patent: Nov. 12, 2019

(54) SUBSTRATE PROCESSING APPARATUS AND SUBSTRATE PROCESSING METHOD

(71) Applicant: SCREEN Holdings Co., Ltd., Kyoto (JP)

(72) Inventors: Naohiko Yoshihara, Kyoto (JP); Kenji Kobayashi, Kyoto (JP); Manabu Okutani, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/021,640

(22) Filed: Jun. 28, 2018

(65) Prior Publication Data

US 2018/0308715 A1 Oct. 25, 2018

Related U.S. Application Data

(62) Division of application No. 14/662,294, filed on Mar. 19, 2015, now abandoned.

(30) Foreign Application Priority Data

Mar. 19, 2014 (JP) .................................. 2014-056768
Mar. 26, 2014 (JP) .................................. 2014-063697

(51) Int. Cl.
*B08B 3/10* (2006.01)
*H01L 21/67* (2006.01)
*H01L 21/687* (2006.01)

(52) U.S. Cl.
CPC .......... *H01L 21/67028* (2013.01); *B08B 3/10* (2013.01); *H01L 21/6715* (2013.01); *H01L 21/67103* (2013.01); *H01L 21/67253* (2013.01); *H01L 21/67288* (2013.01); *H01L 21/68742* (2013.01)

(58) Field of Classification Search
CPC ................. B08B 3/10; H01L 21/67028; H01L 21/67103; H01L 21/6715; H01L 21/67253; H01L 21/67288; H01L 21/68742
USPC ....... 134/18, 56 R, 61, 94.1, 95.2, 105, 153, 134/157, 184, 198, 902
See application file for complete search history.

(56) References Cited

U.S. PATENT DOCUMENTS

| | | | |
|---|---|---|---|
| 5,882,433 A | 3/1999 | Ueno | 134/31 |
| 2006/0231125 A1 | 10/2006 | Yi | 134/33 |
| 2009/0291198 A1 | 11/2009 | Yoshihara et al. | 427/8 |
| 2011/0155177 A1 | 6/2011 | Tamura et al. | 134/18 |
| 2011/0224818 A1 | 9/2011 | Yokouchi et al. | 700/105 |
| 2012/0160274 A1 | 6/2012 | Kasai et al. | 134/26 |
| 2014/0060423 A1 | 3/2014 | Nakai et al. | 118/50 |
| 2014/0127908 A1 | 5/2014 | Okutani | 438/694 |

FOREIGN PATENT DOCUMENTS

| | | | |
|---|---|---|---|
| JP | 2004-214449 A | | 7/2004 |
| JP | 2006-295194 A | | 10/2006 |
| JP | 2007-234809 A | | 9/2007 |
| JP | 2009-279476 A | | 12/2009 |
| JP | 2010-238782 A | | 10/2010 |

(Continued)

*Primary Examiner* — Levon J Shahinian
(74) *Attorney, Agent, or Firm* — Ostrolenk Faber LLP

(57) ABSTRACT

In parallel with a substrate heating step, a liquid surface sensor is used to monitor the raising of an IPA liquid film. An organic solvent removing step is started in response to the raising of the IPA liquid film over the upper surface of the substrate. At the end of the organic solvent removing step, a visual sensor is used to determine whether or not IPA droplets remain on the upper surface of the substrate.

9 Claims, 36 Drawing Sheets

(56) References Cited

FOREIGN PATENT DOCUMENTS

| JP | 2012-138510 A | 7/2012 |
|----|---------------|--------|
| JP | 2014-011426 A | 1/2014 |
| WO | WO 99/16109 | 4/1999 |
| WO | WO 2006/019449 A1 | 2/2006 |

CHUCK CLOSED

CHUCK OPENED

FIG. 43A

LOT A

 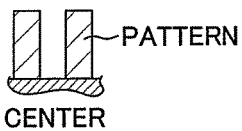—PATTERN

EDGE    CENTER

SURFACE CONDITION
OF THE SUBSTRATE

HEATING TEMPERATURE ---------- LOW

HEATING TIME ----------- SHORT

IPA LIQUID AMOUNT ----- SMALL

TEMPERATURE DISTRIBUTION ----------- UNIFORM

TEMPERATURE SETTINGS
FOR THE HEATERS

FIG. 43B

LOT B

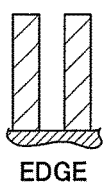 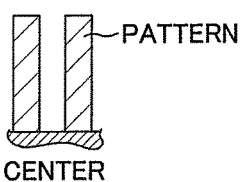—PATTERN

EDGE    CENTER

SURFACE CONDITION
OF THE SUBSTRATE

HEATING TEMPERATURE ----------- HIGH

HEATING TIME ----------- LONG

IPA LIQUID AMOUNT ----- LARGE

TEMPERATURE DISTRIBUTION ----------- UNIFORM

TEMPERATURE SETTINGS
FOR THE HEATERS

FIG. 43C

LOT C

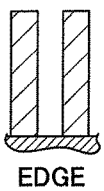 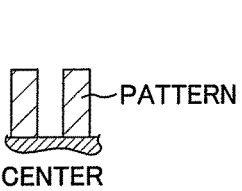—PATTERN

EDGE    CENTER

SURFACE CONDITION
OF THE SUBSTRATE

HEATING TEMPERATURE ----------- HIGH (EDGE)/ LOW (CENTER)

HEATING TIME ----------- LONG

IPA LIQUID AMOUNT ----- LARGE

TEMPERATURE DISTRIBUTION ----------- NON-UNIFORM

TEMPERATURE SETTINGS
FOR THE HEATERS

LOW TEMPERATURE    HIGH TEMPERATURE    LOW TEMPERATURE

LOW TEMPERATURE    HIGH TEMPERATURE    LOW TEMPERATURE

SUBSTRATE PROCESSING APPARATUS AND SUBSTRATE PROCESSING METHOD

CROSS REFERENCE TO RELATED APPLICATION

This application is a divisional of U.S. patent application Ser. No. 14/662,294, filed Mar. 19, 2015, which claims the benefit of Japanese Patent Application Nos. 2014-056768, filed Mar. 19, 2014 and 2014-063697, filed Mar. 26, 2014, which are all incorporated herein by reference.

BACKGROUND OF THE INVENTION

1. Field of the Invention

The present invention relates to a substrate processing apparatus and a substrate processing method which process a substrate. Examples of the substrate to be processed include semiconductor wafers, substrates for liquid crystal display devices, substrates for plasma display devices, substrates for FED (Field Emission Display) devices, substrates for optical disks, substrates for magnetic disks, substrates for magneto-optical disks and substrates for photo masks.

2. Description of the Related Art

In semiconductor device manufacturing processes, the front surface of substrates such as semiconductor wafers is processed with processing liquid. Substrate processing apparatuses of a single substrate processing type, in which substrates are processed one by one, include a spin chuck arranged to rotate a substrate while holding the substrate thereon approximately horizontally and a nozzle arranged to supply processing liquid therethrough onto the front surface of the substrate rotated by the spin chuck.

In such substrate processing apparatuses of a single substrate processing type, chemical solution is supplied onto the substrate held on the spin chuck. Thereafter, rinse liquid is supplied onto the substrate. The chemical solution on the substrate is thus replaced with the rinse liquid. Thereafter, a spin drying step is performed to remove the rinse liquid on the substrate. In the spin drying step, the substrate undergoes a high-speed rotation so that the rinse liquid adhering to the substrate is spun off and removed (for drying).

In such a spin drying step, it may not be possible to sufficiently remove rinse liquid getting into a pattern formed on the substrate, which may result in poor drying. To resolve this problem, there has been proposed a technique in which organic solvent solution such as isopropyl alcohol (IPA) liquid is supplied onto the front surface of a substrate after rinse processing to replace rinse liquid getting into a pattern with the organic solvent solution and thereby to dry the front surface of the substrate, as described in Japanese Patent Application Publication No. 9-38595, for example.

SUMMARY OF THE INVENTION

The inventor has considered a technique of drying the upper surface of a substrate in a substrate processing apparatus of single substrate processing type as follows.

Specifically, organic solvent is supplied onto the upper surface (front surface) of a substrate after rinse processing. The underside of the substrate is then heated to raise a liquid film of organic solvent on the upper surface of the substrate over the upper surface of the substrate. In this state, a force toward the periphery of the substrate is applied to the liquid film to remove the liquid film of organic solvent from over the substrate. The upper surface of the substrate is thus dried.

As will be described hereinafter, the inventor has found that in the case of performing the technique, it is necessary to monitor the condition of the organic solvent on the substrate. That is, it is necessary to monitor, for example, that the liquid film of organic solvent is raised reliably over the substrate during heating of the organic solvent on the substrate and that when the liquid film of organic solvent is removed, droplets do not remain on the substrate.

An object of the present invention is thus to successfully detect the condition of processing liquid on a substrate and thereby to successfully dry the upper surface of the substrate.

A preferred embodiment of the present invention provides a substrate processing apparatus including a processing liquid supplying unit arranged to supply processing liquid onto the upper surface of a substrate that is held horizontally, a substrate heating unit arranged to heat the substrate to heat the processing liquid on the upper surface of the substrate, a processing liquid removing unit arranged to remove the processing liquid from the upper surface of the substrate, a processing liquid condition detecting unit arranged to detect the condition of the processing liquid on the upper surface of the substrate, and a controller arranged to control at least one of the processing liquid supplying unit, the substrate heating unit, and the processing liquid removing unit based on a detection result from the processing liquid condition detecting unit.

If a pattern is formed on the upper surface of the substrate, the upper surface of the substrate includes the upper surface of the base material (silicon wafer, for example) and the surface of the pattern.

In accordance with the arrangement above, the condition of the processing liquid on the upper surface of the substrate is detected by the processing liquid condition detecting unit. This allows the controller to control at least one of the processing liquid supplying unit, the substrate heating unit, and the processing liquid removing unit to perform processing according to the condition of the processing liquid on the upper surface of the substrate. The substrate processing apparatus provided can thus successfully dry the upper surface of the substrate on which the processing liquid is supplied.

In the preferred embodiment, the processing liquid condition detecting unit may include a liquid surface detecting unit arranged to detect a liquid surface of a liquid film of the processing liquid covering the upper surface of the substrate.

In accordance with the arrangement above, the controller can determine the level of the liquid surface of the liquid film of the processing liquid on the substrate based on a signal from the liquid surface detecting unit. It is therefore possible to successfully detect the condition of the liquid film of the processing liquid on the substrate. This allows the controller to control at least one of the processing liquid supplying unit, the substrate heating unit, and the processing liquid removing unit to perform processing according to the condition of the processing liquid on the upper surface of the substrate. The substrate processing apparatus provided can thus successfully dry the upper surface of the substrate on which the processing liquid is supplied.

In the preferred embodiment, the liquid surface detecting unit may be arranged to detect the liquid surface of the liquid film of the processing liquid covering the upper surface of the substrate in parallel with the supply of the processing liquid by the processing liquid supplying unit. The controller may be arranged to stop the supply of the processing liquid by the processing liquid supplying unit based on a detection result from the liquid surface detecting unit.

In accordance with the arrangement above, the controller determines the timing to stop the supply of the processing liquid onto the substrate based on the level of the liquid film from the upper surface of the substrate (corresponding to the thickness of the liquid film). That is, when the liquid surface of the liquid film reaches a predetermined level, the controller controls the processing liquid supplying unit to stop the supply of the processing liquid. If the predetermined level is equal to or slightly greater than, for example, the minimum thickness of the liquid film of the processing liquid with which the entire upper surface of the substrate can be covered and when the controller thus controls the processing liquid supplying unit, the entire upper surface of the substrate can be covered reliably with the processing liquid in a reduced amount of consumption. This allows the supply of the processing liquid onto the upper surface of the substrate by the processing liquid supplying unit to be stopped at the appropriate timing.

In the preferred embodiment, the liquid surface detecting unit may be arranged to detect the liquid surface of the liquid film of the processing liquid covering the upper surface of the substrate in parallel with the heating of the processing liquid by the substrate heating unit. The controller may be arranged to stop the heating of the processing liquid by the substrate heating unit based on a detection result from the liquid surface detecting unit.

In accordance with the arrangement above, it is possible to stop the heating of the processing liquid by the substrate heating unit at the appropriate timing.

In the preferred embodiment, the processing liquid condition detecting unit may include an in-plane condition detecting unit arranged to detect the in-plane condition of the processing liquid that represents the distribution of the processing liquid on the upper surface of the substrate in parallel with the heating of the substrate by the substrate heating unit. The controller may be arranged to determine whether or not the form of the liquid film on the upper surface of the substrate is abnormal (for example, occurrence of a break, a crack, or a hole) based on a detection result from the in-plane condition detecting unit.

In accordance with the arrangement above, the controller can appropriately determine whether or not the form of the film of the processing liquid on the upper surface of the substrate is abnormal and, if It is determined that the form of the liquid film is abnormal, the controller can perform error processing. For example, if the controller performs error processing of storing a log including the details of the abnormality in the form and the identification number of the substrate with the abnormality occurrence in a storage section, it is possible to identify the substrate with the abnormality occurrence and the details of the abnormality after processing the substrate. If the form of the liquid film is abnormal, there may be trouble with the substrate after drying. In this arrangement, it is possible to recognize the presence of such trouble.

In the preferred embodiment, the processing liquid condition detecting unit may include an in-plane condition detecting unit arranged to detect the in-plane condition of the processing liquid that represents the distribution of the processing liquid on the upper surface of the substrate in parallel with the removal of the processing liquid by the processing liquid removing unit. The controller may be arranged to determine whether or not droplets of the processing liquid remain on the upper surface of the substrate based on a detection result from the in-plane condition detecting unit.

In accordance with the arrangement above, the controller can appropriately determine whether or not droplets of the processing liquid remain on the upper surface of the substrate and, if it is determined that droplets remain, the controller can perform error processing.

In the preferred embodiment, the substrate heating unit may include a plurality of heaters arranged to heat the entire upper surface of the substrate. The controller may include an information receiving section arranged to receive substrate information including the surface condition of the substrate and a temperature setting section arranged to set a temperature for each of the plurality of heaters based on the substrate information received by the information receiving section. The controller may be arranged to perform a uniform heating step of uniformly heating the substrate at a temperature equal to or higher than the boiling point of the processing liquid, with the entire upper surface of the substrate being covered with the film of the processing liquid, to vaporize the processing liquid and form a gaseous phase between the liquid film of the processing liquid and the upper surface of the substrate. The processing liquid removing unit may be arranged to move the liquid film of the processing liquid with respect to the substrate, with the gaseous phase existing between the liquid film of the processing liquid and the upper surface of the substrate, to remove the liquid film of the processing liquid from the substrate.

In accordance with the arrangement above, processing liquid is supplied onto the upper surface of the substrate that is held horizontally and a liquid film of the processing liquid covering the entire upper surface of the substrate is formed. Thereafter, the substrate is heated at a temperature equal to or higher than the boiling point of the processing liquid, so that the substrate reaches a temperature equal to or higher than the boiling point of the processing liquid. This causes the processing liquid to be vaporized at the interface with the upper surface of the substrate and a gaseous phase to be formed between the liquid film of the processing liquid and the upper surface of the substrate. In this case, since the liquid film of the processing liquid is raised over the upper surface of the substrate, only a small frictional resistance, which may be considered zero, acts on the liquid film of the processing liquid on the substrate. Accordingly, the liquid film of the processing liquid is easily slidable along the upper surface of the substrate. The processing liquid removing unit removes the liquid film of the processing liquid raised over the upper surface of the substrate.

In a spin drying step of causing a substrate to undergo a high-speed rotation for drying, a liquid surface (gas-liquid interface) is formed across two adjacent structures. A surface tension that may destroy a pattern acts at the position of contact between the liquid surface and the pattern (gas-liquid-solid interface). On the other hand, if the substrate has a temperature equal to or higher than the boiling point of the processing liquid, the processing liquid, even if the processing liquid may come into contact with the upper surface of the substrate, the liquid is vaporized immediately. For this reason, a liquid surface such as in the spin drying step is not formed, so that surface tension does no act on and destroys the pattern. It is therefore possible to reduce the occurrence of pattern destruction.

Further, vaporization of liquid film on a substrate may cause defects such as watermarks and/or particles. On the other hand, in the present invention, the liquid film is moved and removed with respect to the substrate. It is therefore possible to reduce the occurrence of watermarks and/or particles. In particular, since the gaseous phase exists between the liquid film of the processing liquid and the upper surface of the substrate and the liquid film of the processing liquid is easily slidable along the upper surface of the substrate, the liquid film can be removed quickly in a short time. This allows the time for which the upper surface of the substrate is exposed partially through the liquid film of the processing liquid to be reduced and thereby the substrate may be processed more uniformly.

The temperature setting section of the controller sets a temperature for each of the multiple heaters based on the substrate information received by the information receiving section of the controller. More specifically, the temperature setting section sets a temperature for each of the multiple heaters based on at least one of the shape, size, and material of a pattern. For example, if a pattern formed on a peripheral portion of the upper surface of the substrate has a relatively high aspect ratio, the controller sets a temperature for each of the multiple heaters such that the peripheral portion of the upper surface of the substrate is heated at a temperature higher than that of a central portion of the upper surface of the substrate. This allows the liquid film of the processing liquid on the substrate to be heated uniformly regardless of the surface condition of the substrate and thereby the gaseous phase existing between the liquid film of the processing liquid and the upper surface of the substrate to be formed across the upper surface of the substrate.

In the preferred embodiment, the substrate information may include at least one of the shape, size, and material of a pattern.

In the preferred embodiment, the processing liquid removing unit may include a guiding member arranged to remove the processing liquid from the upper surface of the substrate. The guiding member includes, for example, an outward guiding surface arranged to come into contact with a peripheral portion of the liquid film of the processing liquid on the substrate with the gaseous phase existing between the liquid film of the processing liquid and the upper surface of the substrate, the guiding member arranged to guide the processing liquid from the upper surface of the substrate to around the substrate through contact between the outward guiding surface and the liquid film of the processing liquid.

In accordance with the arrangement above, the outward guiding surface of the guiding member comes into contact with the peripheral portion of the liquid film of the processing liquid on the substrate with the gaseous phase existing between the liquid film of the processing liquid and the upper surface of the substrate. The processing liquid in contact with the outward guiding surface is removed through the guiding member to around the substrate. With this contact between the guiding member and the liquid film, an outward flow toward the peripheral portion of the substrate occurs in the liquid film of the processing liquid, so that the liquid film of the processing liquid on the substrate is removed from the substrate directly as a mass without being split into a number of small droplets. This allows the film of the processing liquid to be removed quickly from the substrate in a short time.

In the preferred embodiment, the processing liquid removing unit may include a gas discharging unit arranged to discharge gas toward the upper surface of the substrate, with the gaseous phase being formed between the liquid film of the processing liquid and the upper surface of the substrate, to form a dried region from which the processing liquid is removed in a region of the upper surface of the substrate.

In accordance with the arrangement above, gas is blown to a blow position, a region of the upper surface of the substrate, with a gaseous phase being formed between the liquid film of the processing liquid and the upper surface of the substrate. When the gas is thus supplied, the processing liquid at the blow position is displaced to the periphery. This causes a dried region to be formed at the blow position. Further, when the gas is thus supplied, the processing liquid moves from the blow position to the periphery, which causes an outward flow toward the peripheral portion of the substrate to from in the liquid film of the processing liquid. Thus, the liquid film of the processing liquid on the substrate is removed from the substrate directly as a mass without being split into a number of small droplets. This allows the liquid film of the processing liquid to be removed quickly from the substrate in a short time.

In the preferred embodiment, the controller may be arranged to further perform a temperature difference generating step of, after the uniform heating step, forming a low-temperature region with a temperature equal to or higher than the boiling point of the processing liquid and a high-temperature region with a temperature higher than that of the low-temperature region in the upper surface of the substrate with the gaseous phase being formed between the liquid film of the processing liquid and the upper surface of the substrate.

In accordance with the arrangement above, the substrate is heated uniformly at a temperature equal to or higher than the boiling point of the processing liquid. This causes a gaseous phase to be formed between the liquid film of the processing liquid and the upper surface of the substrate. Thereafter, a high-temperature region and a low-temperature region having their respective different temperatures are formed in the upper surface of the substrate. This generates a temperature difference in the liquid film of the processing liquid, and a flow toward the lower temperature is formed in the liquid film of the processing liquid. Thus, the flow causes the liquid film of the processing liquid on the substrate to be removed from the substrate directly as a mass without being split into a number of small droplets. This allows the film of the processing liquid to be removed quickly from the substrate in a short time.

In the preferred embodiment, the processing liquid removing unit may include an attitude changing unit arranged to tilt the substrate while keeping constant a relative attitude between the substrate heating unit and the substrate.

In accordance with the arrangement above, the upper surface of the substrate is tilted with the gaseous phase being formed between the film of the processing liquid and the upper surface of the substrate. This causes the liquid film of the processing liquid on the substrate to flow downward along the upper surface of the substrate. It is therefore possible to remove the liquid film of the processing liquid quickly from the substrate in a short time. In addition, since the gap between the substrate heating unit and the substrate in a direction perpendicular to the upper surface of the substrate is kept constant, uneven heating is less likely to occur compared to the case where only the substrate is tilted, whereby it is possible to continuously heat the substrate stably.

Another preferred embodiment of the present invention provides a substrate processing method of drying the upper surface of a substrate that is held horizontally. The substrate processing method includes a processing liquid supplying step of supplying processing liquid onto the upper surface of the substrate, a substrate heating step of heating the substrate to heat the processing liquid on the upper surface of the substrate, a processing liquid removing step of removing the processing liquid from the upper surface of the substrate, a processing liquid condition detecting step of detecting the condition of the processing liquid on the upper surface of the substrate in parallel with at least one of the processing liquid supplying step, the substrate heating step, and the processing liquid removing step, and a controlling step of controlling at least one of the processing liquid supplying step, the substrate heating step, and the processing liquid removing step based on a detection result in the processing liquid condition detecting step. The method offers the same operational advantages as described above.

In another preferred embodiment, the processing liquid condition detecting step may detect the level of a liquid surface of a liquid film of the processing liquid covering the upper surface of the substrate in parallel with the processing liquid supplying step. The controlling step may stop the supply of the processing liquid in the processing liquid supplying step based on the level of the liquid surface of the liquid film detected in the processing liquid condition detecting step. The method offers the same operational advantages as described above.

In another preferred embodiment, the processing liquid condition detecting step may detect the level of a liquid surface of a liquid film of the processing liquid covering the upper surface of the substrate in parallel with the substrate heating step. The controlling step may stop the heating of the processing liquid in the substrate heating step based on the level of the liquid surface of the liquid film detected in the processing liquid condition detecting step. The method offers the same operational advantages as described above.

In another preferred embodiment, the processing liquid condition detecting step may detect the form of a liquid film of the processing liquid on the upper surface of the substrate in parallel with the substrate heating step. The controlling step may determine whether or not the form of the liquid film of the processing liquid is abnormal based on the form of the liquid film detected in the processing liquid condition detecting step. The method offers the same operational advantages as described above.

In another preferred embodiment, the processing liquid condition detecting step may detect the condition of the processing liquid on the upper surface of the substrate in parallel with the processing liquid removing step. The controlling step may determine whether or not droplets of the processing liquid remain on the upper surface of the substrate based on the condition of the processing liquid detected in the processing liquid condition detecting step. The method offers the same operational advantages as described above.

In another preferred embodiment, the substrate heating step may cause the upper surface of the substrate to reach a temperature equal to or higher than the boiling point of the processing liquid, with the upper surface of the substrate being covered with a liquid film of the processing liquid, to form a gaseous phase of the processing liquid across the upper surface of the substrate between the liquid film of the processing liquid and the upper surface of the substrate and raise the liquid film of the processing liquid over the substrate. The method offers the same operational advantages as described above.

The above and yet other objects, features, and effects of the present invention shall be made clear by the following description of preferred embodiments in reference to the attached drawings.

BRIEF DESCRIPTION OF THE DRAWINGS

FIG. 43A is a schematic view showing a first example of the relationship between the surface condition of the substrate and the corresponding temperature setting for heaters.

FIG. 43B is a schematic view showing a second example of the relationship between the surface condition of the substrate and the corresponding temperature setting for heaters.

FIG. 43C is a schematic view showing a third example of the relationship between the surface condition of the substrate and the corresponding temperature setting for heaters.

DETAILED DESCRIPTION OF PREFERRED EMBODIMENTS

First Preferred Embodiment

Figure 1:
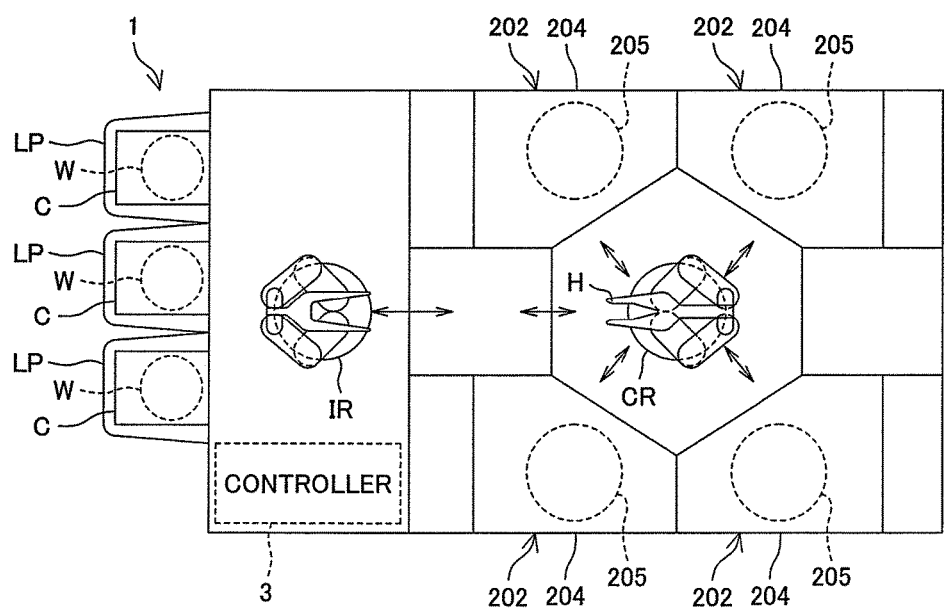
FIG. 1 is a schematic plan view of a substrate processing apparatus according to a first preferred embodiment of the present invention.
Figure 2:
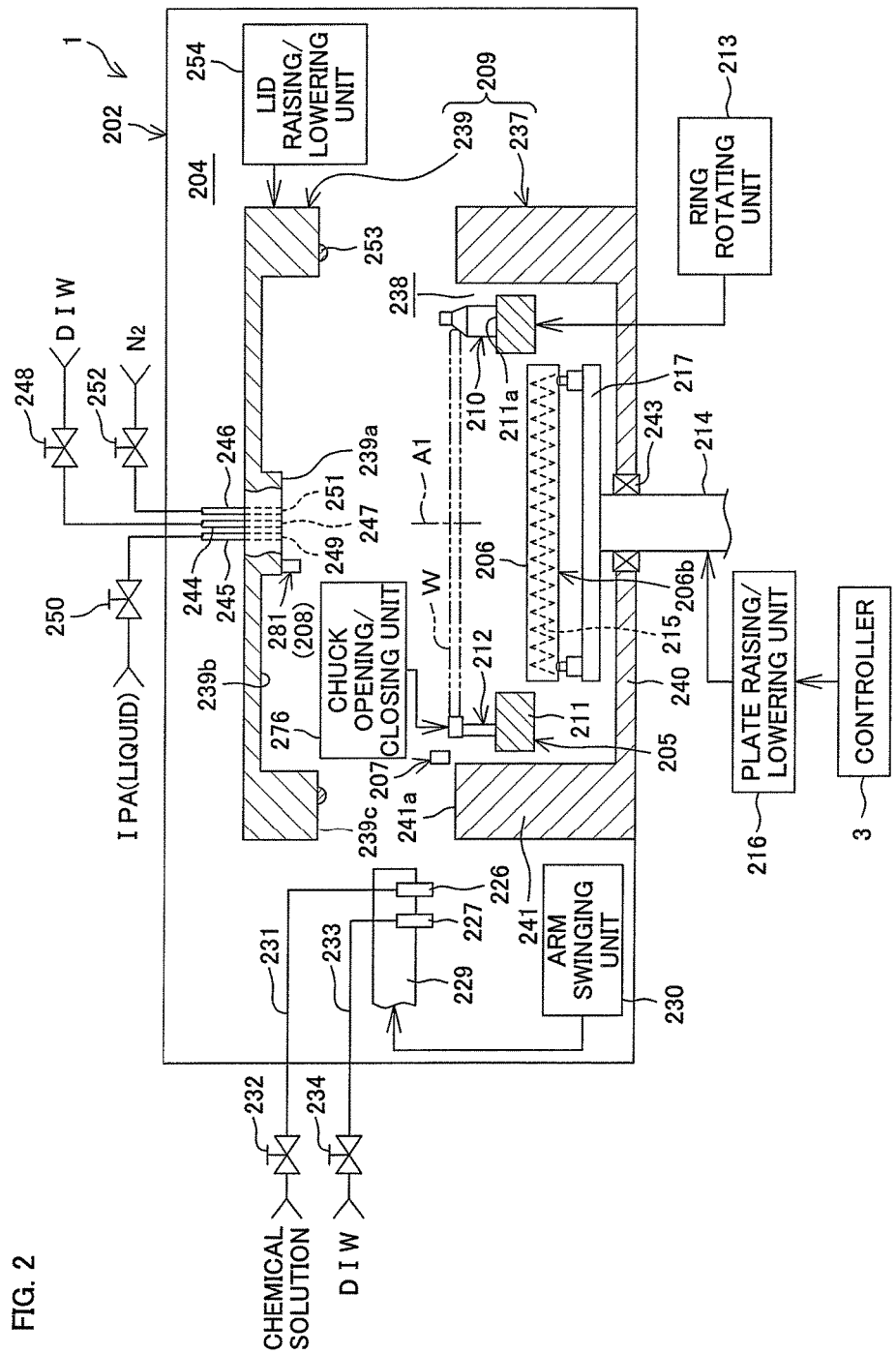
FIG. 2 is a schematic vertical cross-sectional view of a processing unit included in the substrate processing apparatus shown in FIG. 1.

FIG. 1 is a schematic plan view of a substrate processing apparatus 1 according to a first preferred embodiment of the present invention. FIG. 2 is a schematic vertical cross-sectional view of a processing unit 202 included in the substrate processing apparatus 1 shown in FIG. 1.

The substrate processing apparatus 1 is a single substrate processing type in which disk-shaped substrates W such as silicon wafers are processed one by one. As shown in FIG. 1, the substrate processing apparatus 1 includes multiple processing units 202 arranged to process the substrates W with processing liquid, load ports LP on which carriers C are placed to house the respective multiple substrates W to be processed in the processing units 202 therein, delivery robot IR and delivery robot CR arranged to deliver the substrates W between the load ports LP and the processing units 202, and a controller 3 arranged to control the substrate processing apparatus 1.

The processing units 202 are single substrate processing type in which chemical solution processing using a chemical solution is performed on the front surface (pattern formed surface) of the disk-shaped substrates W. Each of the processing units 202 includes a box-shaped outer chamber 204 having an interior space, a first substrate holding unit 205 serving as a substrate holding and rotating unit arranged to rotate one of the substrates W about a vertical axis of rotation A1 passing through the center of the substrate W while keeping the substrate W in a horizontal attitude within the outer chamber 204, a second substrate holding unit 206b including a hot plate (substrate heating unit) 206 arranged to heat the substrate W, and an openable/closable inner chamber 209 to house the first substrate holding unit 205 and the second substrate holding unit 206b therein.

The processing unit 202 further includes a processing liquid supplying unit arranged to supply processing liquid such as the chemical solution and rinse liquid onto the substrate W held on the first substrate holding unit 205, an organic solvent supplying unit arranged to supply IPA liquid, an example of organic solvent solution having a surface tension lower than that of water, onto the upper surface of the substrate W held on the first substrate holding unit 205 or the second substrate holding unit 206b, a liquid surface sensor (liquid surface detecting unit) 207 arranged to detect the level of a liquid surface of an IPA liquid film 111 (see FIG. 9, for example) formed on the substrate W that is heated by the hot plate 206, and a visual sensor (in-plane condition detecting unit) 208 arranged to visually detect the in-plane condition of IPA that represents the distribution of IPA on the upper surface of the substrate W.

Figure 3:
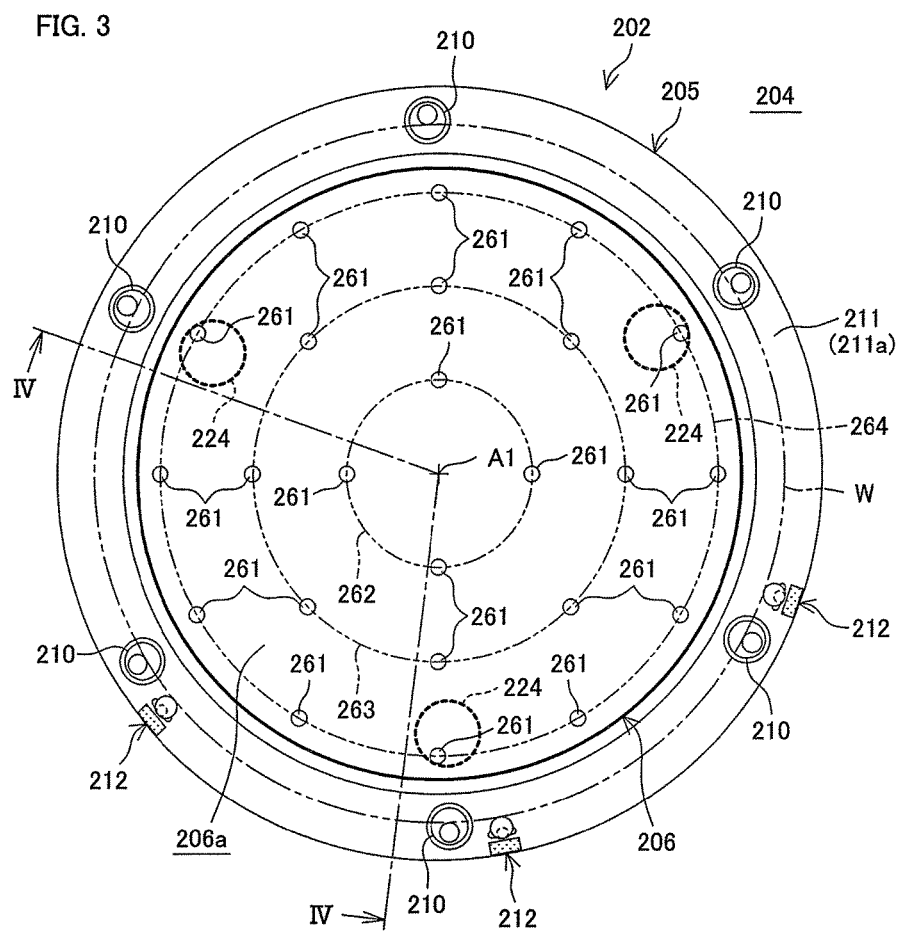
FIG. 3 is a plan view of the first substrate holding unit and the second substrate holding unit shown in FIG. 2.
Figure 4:
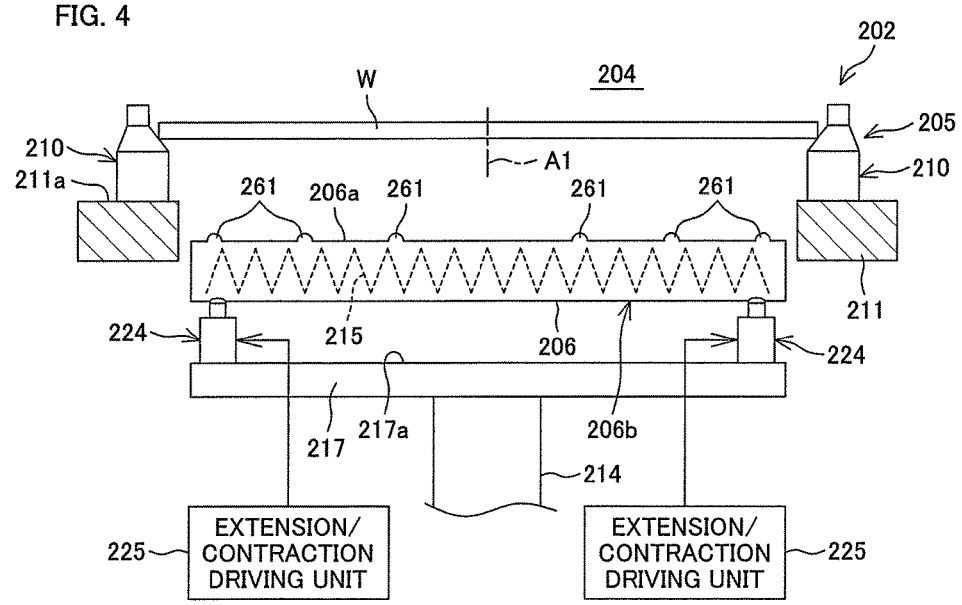
FIG. 4 is a first cross-sectional view taken along the line IV-IV in FIG. 3.
Figure 5:
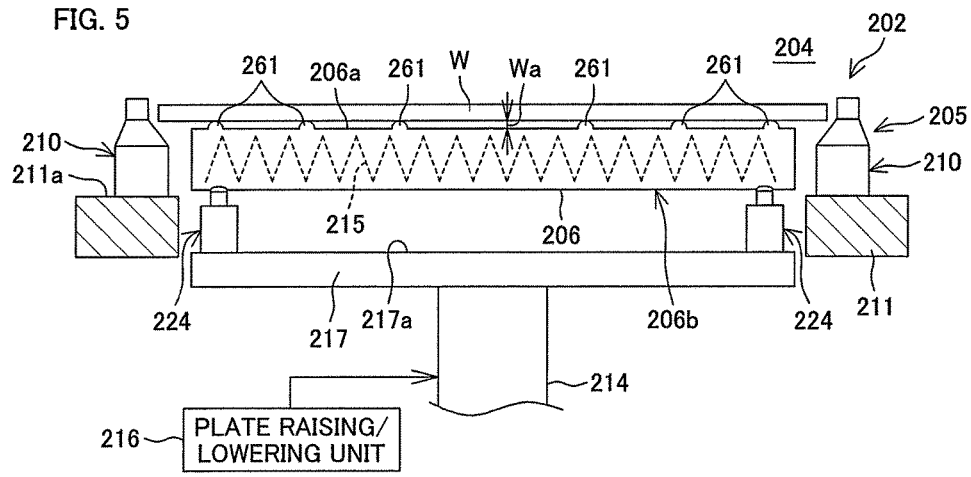
FIG. 5 is a second cross-sectional view taken along the line IV-IV in FIG. 3.
Figure 6:
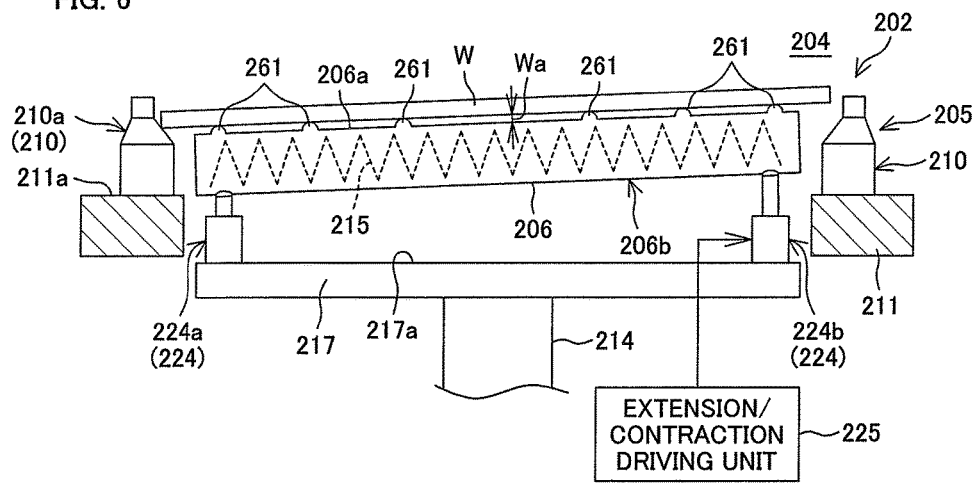
FIG. 6 is a third cross-sectional view taken along the line IV-IV in FIG. 3.

FIG. 3 is a plan view of the first substrate holding unit 205 and the second substrate holding unit 206b. FIGS. 4 to 6 are cross-sectional views taken along the line IV-IV in FIG. 3. FIG. 4 shows a state where the second substrate holding unit 206b is located at a lower position. FIG. 5 shows a state where the second substrate holding unit 206b is located at an upper position. FIG. 6 shows where the second substrate holding unit 206b is in a tilted attitude.

As shown in FIGS. 2 to 6, the first substrate holding unit 205 has an annular rotational ring 211 having an outer diameter greater than that of the substrate W. The rotational ring 211 is made of a chemical-resistant resin material and has a rotational center concentric with the rotational axis A1 of the substrate W. The rotational ring 211 also has a horizontal and flat annular upper surface 211a. The upper surface 211a is provided with multiple (six, for example) fixed pins 210 fixed with respect to the rotational ring 211 and multiple (three, for example) movable pins 212 movable with respect to the rotational ring 211.

The multiple fixed pins 210 are disposed in an equally spaced manner in the circumferential direction on the upper surface 211a of the rotational ring 211. The multiple movable pins 212 are disposed in the circumferential direction on the upper surface 211a of the rotational ring 211. The three movable pins 212 are associated one for one with three of the fixed pins 210 arranged continuously in the circumferential direction. The three movable pins 212 are disposed, respectively, in the vicinity of the associated three fixed pins 210. The three movable pins 212 are thus disposed unevenly in the circumferential direction.

The rotational ring 211 is coupled with a ring rotating unit 213 arranged to rotate the rotational ring 211 about the rotational axis A1. The ring rotating unit 213 includes, for example, an electric motor and a transmitting mechanism arranged to transmit the power of the electric motor.

As shown in FIGS. 2 to 6, the hot plate 206 is a disk-shaped member made of, for example, ceramic or silicon carbide (SiC). The upper surface of the hot plate 206 has a flat circular substrate opposing surface 206a. The outer diameter of the substrate opposing surface 206a is smaller than the inner diameter of the rotational ring 211. The hot plate 206 does not overlap the rotational ring 211 of the first substrate holding unit 205 in the vertical direction. An electric heater 215, for example, is provided in an embedded manner inside the hot plate 206. The heater 215, when energized, produces heat. This causes the entire hot plate 206 including the substrate opposing surface 206a to be heated.

As shown in FIGS. 5 and 6, the hot plate 206 has multiple support pins 261 protruding upward from the substrate opposing surface 206a. The multiple support pins 261 may be disposed across the substrate opposing surface 206a or only in a peripheral portion of the substrate opposing surface 206a. The support pins 261 may be separated from or integrated with the hot plate 206. The substrate W is supported at a position at which the lower surface of the substrate W is separated above from the substrate opposing surface 206a by small gap Wa through contact between the multiple support pins 261 and the lower surface of the substrate W.

It is noted that the hot plate 206 may not have the support pin 261 on the substrate opposing surface 206a. That is, the substrate W may be placed directly on the substrate opposing surface 206a.

When the heater 215 produces heat with the substrate W being held on the hot plate 206, the heat is transferred to the substrate W. Specifically, the heat from the heater 215 is transferred to the substrate W through fluid between the substrate opposing surface 206a and the substrate W and/or the support pins 261. The heat from the heater 215 is also transferred to the substrate W by heat radiation. This causes the substrate W held on the hot plate 206 to be heated.

As shown in FIGS. 2 and 4 to 6, a vertically extending plate support shaft 214 is fixed to the underside of the hot plate 206. The plate support shaft 214 is, for example, hollow. Power feeder wire (not shown) for the heater 215 is inserted into the plate support shaft 214. The plate support shaft 214 is coupled with a plate raising/lowering unit 216 arranged to raise/lower the plate support shaft 214 (see FIG. 2, for example). The plate raising/lowering unit 216 includes, for example, an electric motor and a transmitting mechanism (ball screw mechanism or the like) arranged to transmit the power of the electric motor.

When the plate raising/lowering unit 216 raises/lowers the plate support shaft 214, multiple extensible units 224 to be described hereinafter, a support member 217, and the hot plate 206 are raised/lowered integrally with the plate support shaft 214. When the plate raising/lowering unit 216 is thus driven, the hot plate 206 is raised/lowered between a lower position (as shown in FIG. 4) and a higher position (as shown in FIG. 5). At the lower position, the position at which the substrate W is supported by the hot plate 206 is over the position at which the substrate W is supported by the multiple fixed pins 210. At the upper position, the position at which the substrate W is supported by the hot plate 206 is over the position at which the substrate W is supported by the multiple fixed pins 210. As described above, since the hot plate 206 does not overlap the rotational ring 211 of the first substrate holding unit 205 in the vertical direction, the hot plate 206 and the first substrate holding unit 205 cannot interfere with each other even during the raising/lowering of the hot plate 206.

As shown in FIGS. 2 and 6, the hot plate 206 is supported by a plate support shaft 214 via multiple (three, for example) extensible units 224 and a support member 217 supporting the extensible units 224. The support member 217 is, for example, a disk-shaped or ring-shaped member. FIG. 2 shows an example of the support member 217 being disk-shaped. The support member 217 has a horizontal and flat support surface 217a and is fixed to the upper end of the plate support shaft 214. The three extensible units 224 are disposed in a peripheral portion of the support surface 217a of the support member 217 in an equally spaced manner in the circumferential direction. The extensible units 224 are disposed medial to three of the fixed pins 210, respectively, in a plan view.

The extensible units 224 are cylinders including a cylinder main body provided on and fixed to the support member 217 and an extensible rod protruding vertically upward from the cylinder main body. The length of the extensible units 224 is adjusted continuously within a range from a maximally contracted state where the amount of protrusion of the extensible rod is minimum and a maximally extended state where the amount of protrusion of the extensible rod is maximum. The extensible units 224 support a peripheral portion of the hot plate 206 thereon. The multiple extensible units 224 have the same specifications. Accordingly, the multiple extensible units 224 have the same length in the maximally contracted state. Each of the extensible units 224 is coupled with an extension/contraction driving unit 225 arranged to supply driving fluid to extend/contract the extensible rod in the vertical direction. Although in this preferred embodiment, the extensible unit 224 and the extension/contraction driving unit 225 are provided as separate members, the extensible unit 224 may be configured as a single member such as an electromagnetic actuator.

In the states shown in FIG. 4 or FIG. 5, all the extensible units 224 are in the maximally contracted state. All the extensible units 224 also have the same length. This causes the hot plate 206 to be kept in the horizontal attitude. In this state, the substrate opposing surface 206a of the hot plate 206 is disposed in a horizontal plane. The substrate W on the hot plate 206 does not move on the hot plate 206 but remains in rest state due to a frictional force acting between the substrate W and the support pins 261.

In the state shown in FIG. 6, one of the three extensible units 224 is kept in the maximally contracted state, while the other two are extended relative to the maximally contracted state. This causes the hot plate 206 to be kept at the tilted attitude. The attitude changing unit, with a simple structure including the multiple extensible units 224, can thus cause the hot plate 206 to undergo an attitude change between the horizontal attitude and the tilted attitude.

The attitude change of the hot plate 206 will hereinafter be described in detail with reference to FIG. 6. In the description, one of the three extensible units 224 is referred to as an extensible unit 224a, while the other two are referred to as extensible units 224b.

In order to change the hot plate 206 from the horizontal attitude to the tilted attitude, the other two extensible units 224b (only one of them is shown in FIG. 6) are lengthened while the length of the extensible unit 224a is maintained. In this case, the amount of extension of the two extensible units 224b is the same. This allows the hot plate 206 to undergo an attitude change to the tilted attitude.

When the hot plate 206 is at the tilted attitude, the substrate opposing surface 206a is tilted with respect to the horizontal surface. The tilt angle is, for example, about 1 degree. That is, when the hot plate 206 is at the tilted attitude, the substrate opposing surface 206a is tilted by, for example, about 1 degree with respect to the horizontal surface. Thus, the upper surface of the substrate W supported by the hot plate 206 is also tilted by, for example, about 1 degree with respect to the horizontal surface. In this case, the hot plate 206 is highest at the position in the circumferential direction of the hot plate 206 corresponding to the midpoint of the two extensible units 224b, while the position of the extensible unit 224a is the lowest.

When the hot plate 206 is tilted as shown in FIG. 6, the substrate W supported by the hot plate 206 is also tilted. When the substrate W and the hot plate 206 are at the tilted attitude, a force acts on the substrate W along the substrate opposing surface 206a (as a component of the substrate's own weight). If the force is larger than the frictional force between the substrate W and the support pins 261, the substrate W may move along the substrate opposing surface 206a.

The lowest portion of the peripheral portion of the substrate W (the left end portion of the substrate W in FIG. 6) is located medial to one of the six fixed pins 210 (fixed pin 210a). When the hot plate 206 is at the tilted attitude, the fixed pin 210a is aligned with the shortest extensible unit 224a in the radial direction of the hot plate 206. When the hot plate 206 is at the tilted attitude as shown in FIG. 6, even when the substrate W may move along the substrate opposing surface 206a with respect to the hot plate 206, the substrate W comes into contact with the fixed pin 210a, so that the movement of the substrate W with respect to the hot plate 206 is restricted. It is therefore possible to keep both the substrate W and the hot plate 206 at the tilted attitude while reliably preventing the substrate W from sliding off the hot plate 206.

As shown in FIG. 2, the processing liquid supplying unit includes a chemical solution nozzle 226 arranged to discharge chemical solution therethrough and a rinse liquid nozzle 227 arranged to discharge rinse liquid therethrough. The chemical solution nozzle 226 and the rinse liquid nozzle 227 are mounted at the leading end of a horizontally extensible arm 229 with the discharge ports being directed downward. The arm 229 is provided in a manner swingable about a predetermined axis of rotation. The chemical solution nozzle 226 and the rinse liquid nozzle 227 are arranged in the direction in which the arm 229 is swung. The arm 229 is coupled with an arm swinging unit 230 arranged to swing the arm 229 within a predetermined angular range. When the arm 229 is swung, the chemical solution nozzle 226 and the rinse liquid nozzle 227 are caused to move between a position over the central portion of the substrate W held on the first substrate holding unit 205 or the second substrate holding unit 206b and a retracted position set outside the inner chamber 209.

As shown in FIG. 2, the chemical solution nozzle 226 is, for example, a straight nozzle arranged to discharge the chemical solution downward therethrough to form a continuous flow of the chemical solution. The chemical solution nozzle 226 is connected with a chemical solution pipe 231 that forms a supply passage through which the chemical solution from a chemical solution source flows. A chemical solution valve 232 arranged to control the supply of the chemical solution is installed in the chemical solution pipe 231. When the chemical solution valve 232 is opened, the chemical solution is supplied through the chemical solution pipe 231 to the chemical solution nozzle 226. When the chemical solution valve 232 is closed, the supply of the chemical solution through the chemical solution pipe 231 to the chemical solution nozzle 226 is stopped. The chemical solution may employ liquid containing at least one of sulfuric acid, acetic acid, nitric acid, hydrochloric acid, hydrofluoric acid, ammonia water, oxygenated water, organic acid (such as citric acid, oxalic acid), organic alkali (such as TMAH (tetramethylammonium hydroxide)), surface-active agent, and corrosion inhibitor.

As shown in FIG. 2, the rinse liquid nozzle 227 is, for example, a straight nozzle arranged to discharge the rinse liquid downward therethrough to form a continuous flow of the rinse liquid. The rinse liquid nozzle 227 is connected with a rinse liquid pipe 233 that forms a supply passage through which the rinse liquid from a rinse liquid source flows. A rinse liquid valve 234 arranged to control the supply of the rinse liquid is installed in the rinse liquid pipe 233. When the rinse liquid valve 234 is opened, the rinse liquid is supplied through the rinse liquid pipe 233 to the rinse liquid nozzle 227. When the rinse liquid valve 234 is closed, the supply of the rinse liquid through the rinse liquid pipe 233 to the rinse liquid nozzle 227 is stopped.

It is noted that although FIG. 2 shows the case where the chemical solution nozzle 226 and the rinse liquid nozzle 227 are disposed on the single arm 229, the chemical solution nozzle 226 and the rinse liquid nozzle 227 may be held, respectively, on different arms.

As shown in FIG. 2, the inner chamber 209 includes a chamber main body 237 to house the first substrate holding unit 205 and the second substrate holding unit 206b and a lid member 239 to close the opening 238 of the chamber main body 237. The lid member 239 closing the opening 238 of the chamber main body 237 forms a sealed space inside the inner chamber 209 serving as a sealed chamber.

The chamber main body 237 has a bottomed cylindrical shape with the circular opening 238 provided on top thereof. The chamber main body 237 integrally includes a disk-shaped bottom wall portion 240 and a peripheral wall portion 241 standing upward from the bottom wall portion 240. The peripheral wall portion 241 has a cylindrical shape concentric with the rotational axis A1. The peripheral wall portion 241 also has an annular upper end face 241a. The upper surface of the bottom wall portion 240 is connected with one end of a waste liquid passage (not shown). The other end of the waste liquid passage is connected to waste liquid equipment (not shown) installed outside the substrate processing apparatus 1.

A receiver cup (not shown) arranged to receive processing liquid splattering from the substrate W held on the first substrate holding unit 205 or the second substrate holding unit 206b is disposed around the peripheral wall portion 241. The receiver cup is connected to the waste liquid equipment (not shown) installed outside the substrate processing apparatus 1. An annular sealing member 243 is provided for sealing between the plate support shaft 214 and the central portion of the bottom wall portion 240.

The lid member 239 is disposed over the chamber main body 237 in a horizontal attitude such that the center thereof is positioned on the rotational axis A1 of the substrate W. The lid member 239 is connected with a lid raising/lowering unit 254. The lid raising/lowering unit 254 includes, for example, an electric motor and a transmitting mechanism (ball screw mechanism or the like) arranged to transmit the power of the electric motor. When the lid raising/lowering unit 254 is driven, the lid member 239 is raised/lowered between a lid closed position at which the opening 238 of the chamber main body 237 is closed and a lid opened position at which the lid member is retracted to a higher position than that of the chamber main body 237 and the opening 238 of the chamber main body 237 is opened.

The lower surface of the lid member 239 includes a horizontal and flat circular central portion 239a. The central portion 239a of the lower surface of the lid member 239 is opposed to the central portion of the upper surface of the substrate W held on the first substrate holding unit 205 or the central portion of the upper surface of the substrate W held on the hot plate 206.

A sealing ring 253 is provided over the entire circumference of a peripheral portion 239c of the lower surface of the lid member 239. The sealing ring 253 is made of, for example, an elastic material such as synthetic resin. When the lid member 239 is at the lid closed position, the sealing ring 253, which is disposed in the peripheral portion 239c of the lower surface of the lid member 239, comes into contact with the upper end face 241a of the chamber main body 237 over the entire circumference for sealing between the lid member 239 and the chamber main body 237. A cylindrical upper annular groove 239b concentric with the lid member 239 is defined in the region of the lower surface of the lid member 239 excluding the central portion 239a and the peripheral portion 239c.

As shown in FIG. 2, a rinse liquid upper pipe 244, an organic solvent upper pipe 245, and a nitrogen gas upper pipe 246 are inserted into a hole opened in the central portion 239a of the lower surface of the lid member 239.

The lower end of the rinse liquid upper pipe 244 is opened in the central portion 239a of the lower surface of the lid member 239 to form a rinse liquid discharge port 247. The rinse liquid upper pipe 244 is connected with a rinse liquid source. The rinse liquid is supplied from the rinse liquid source into the rinse liquid upper pipe 244. A rinse liquid upper valve 248 arranged to control the supply of the rinse liquid is installed in the rinse liquid upper pipe 244.

The lower end of the organic solvent upper pipe 245 is opened in the central portion 239a of the lower surface of the lid member 239 to form an organic solvent discharge port 249. The organic solvent upper pipe 245 is connected with an organic solvent source. IPA is supplied from an IPA source into the organic solvent upper pipe 245. An organic solvent valve 250 arranged to control the supply of the IPA is installed in the organic solvent upper pipe 245. The organic solvent upper pipe 245 and the organic solvent valve 250 constitute an organic solvent supplying unit. The organic solvent supplying unit is also an example of the processing liquid supplying unit.

The lower end of the nitrogen gas upper pipe 246 is opened in the central portion 239a of the lower surface of the lid member 239 to form a nitrogen gas discharge port 251 arranged to discharge nitrogen gas ($N_2$), an example of inert gas, therethrough. The nitrogen gas upper pipe 246 is connected with a nitrogen gas source. Nitrogen gas from the nitrogen gas source is supplied through the nitrogen gas upper pipe 246 that forms a nitrogen gas supply passage to the nitrogen gas discharge port 251. A nitrogen gas valve 252 arranged to control the supply of the nitrogen gas is installed in the nitrogen gas upper pipe 246.

Figure 7:
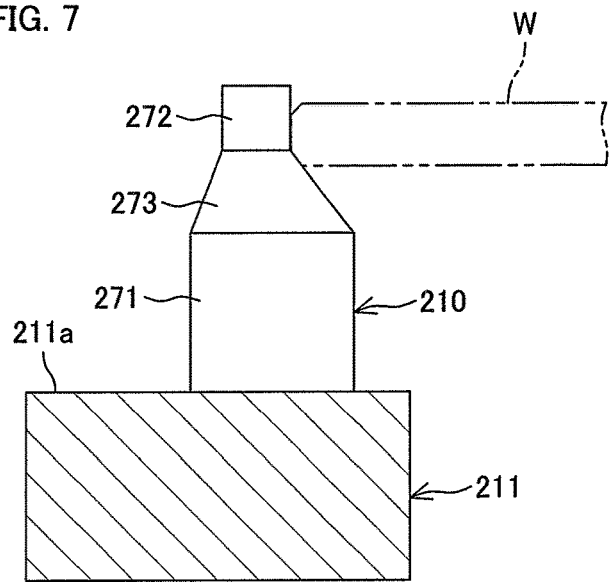
FIG. 7 is a schematic view of a fixed pin when viewed horizontally.

FIG. 7 is a schematic view of a fixed pin 210 when viewed horizontally. As shown in FIG. 7, the fixed pin 210 includes a first lower shaft portion 271 coupled to the rotational ring 211 and a first upper shaft portion 272 formed integrally with the upper end of the first lower shaft portion 271. The first lower shaft portion 271 and the first upper shaft portion 272 each have a columnar shape. The first upper shaft portion 272 is eccentric with respect to the central axis of the first lower shaft portion 271. A tapered surface 273 narrowed upward is formed in the portion in which the first lower shaft portion 271 is coupled to the first upper shaft portion 272.

Figure 8:
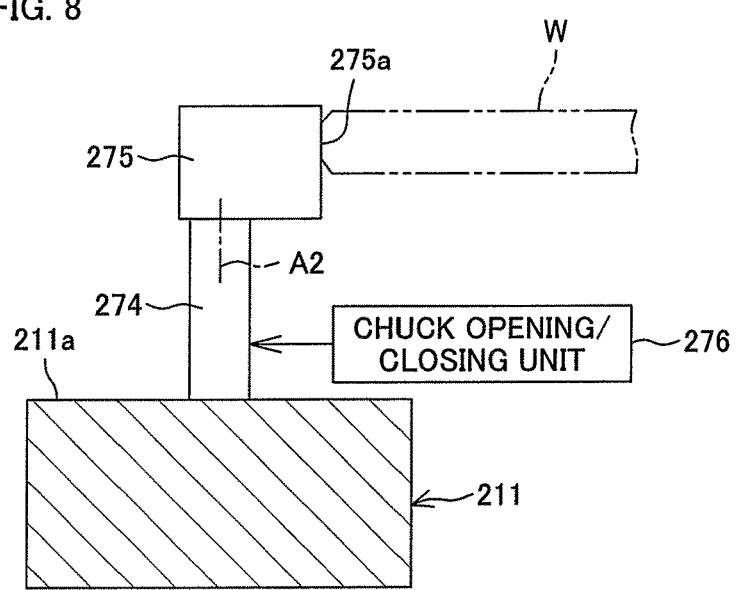
FIG. 8 is a schematic view of a movable pin and a chuck opening/closing unit when viewed horizontally.

FIG. 8 is a schematic view of one of the movable pins 212 and a chuck opening/closing unit 276 when viewed horizontally. The movable pin 212 includes a second lower shaft portion 274 coupled to the rotational ring 211 in a manner rotatable about a rotational axis A2 and extending in the vertical direction and a second upper shaft portion 275 fixed to the second lower shaft portion 274 with the central axis thereof being eccentric with respect to the rotational axis A2. The second upper shaft portion 275 has a cylindrical surface 275a contactable with the peripheral end of the substrate W. When the second lower shaft portion 274 is rotated, the cylindrical surface 275a of the second upper shaft portion 275 is repositioned between a releasing position at which the cylindrical surface 275a of the second upper shaft portion 275 is set away from the rotational axis A1 of the substrate W (see FIG. 2) and a holding position at which the cylindrical surface 275a of the second upper shaft portion 275 is set closer to the rotational axis A1. The movable pin 212 is connected to the chuck opening/closing unit 276. The chuck opening/closing unit 276 is arranged to start or stop holding the substrate W by repositioning the second upper shaft portion 275 between the releasing position and the holding position.

When the substrate W is held by the multiple fixed pins 210, the peripheral end of the substrate W is in contact with the tapered surface 273 of each fixed pin 210, as shown in FIG. 7. In this state, the second upper shaft portion 275 of each of the multiple movable pins 212 is repositioned from the releasing position to the holding position (see FIG. 8). When the second upper shaft portion 275 is thus repositioned from the releasing position to the holding position, the cylindrical surface 275a comes into contact with the peripheral end of the substrate W and the portion in contact with the cylindrical surface 275a (a portion of the peripheral end of the substrate W) is pressed toward the inside of the substrate W. This causes the portion positioned opposite to the contact portion with respect to the rotational axis A1 (another portion of the peripheral end of the substrate W) to be pressed against the first upper shaft portion 272 of the fixed pin 210 positioned opposite to the movable pin 212 with respect to the rotational axis A1. When the second upper shaft portion 275 of each of the multiple movable pins 212 is thus repositioned from the releasing position to the holding position, the multiple movable pins 212 are brought into a holding state. This causes the substrate W to be held in the horizontal attitude by the multiple fixed pins 210 and the multiple movable pins 212.

It is noted that instead of pressing the peripheral end of the substrate W with the cylindrical surface 275a, the cylindrical surface 275a of each of the multiple movable pins 212 may have a V-shaped groove opposed to the rotational axis A1 and opened horizontally. Even with the multiple movable pins 212, the substrate W can be held by bringing the upper and lower tapered surfaces constituting the V-shaped groove into contact with the peripheral end of the substrate W.

As shown in FIG. 1, the controller 3 is constituted by, for example, a microcomputer. The controller 3 is arranged to control the operation of the plate raising/lowering unit 216, the ring rotating unit 213, the arm swinging unit 230, the lid raising/lowering unit 254, the chuck opening/closing unit 276, and the like according to a predefined program. The controller 3 is also arranged to adjust the power to be supplied to the heater 215. The controller 3 is further arranged to control the opening/closing of the chemical solution valve 232, the rinse liquid valve 234, the rinse liquid upper valve 248, the organic solvent valve 250, the nitrogen gas valve 252, and the like.

Figure 9:
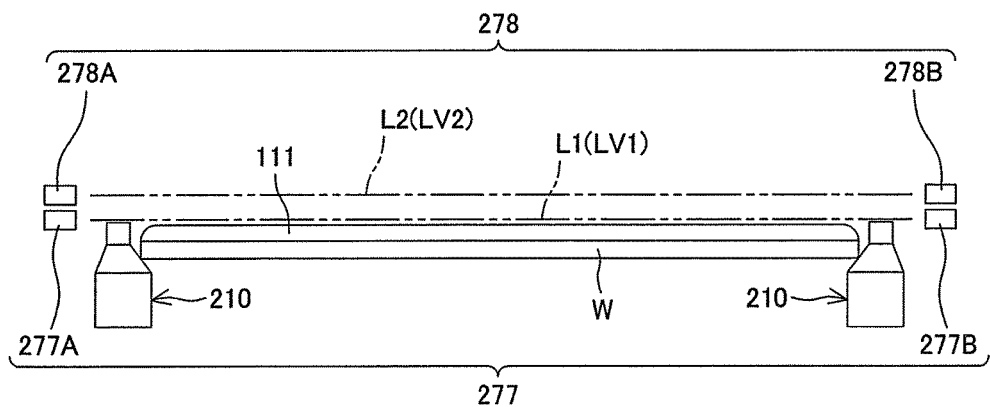
FIG. 9 is a first view of a liquid surface sensor when viewed horizontally.
Figure 10:
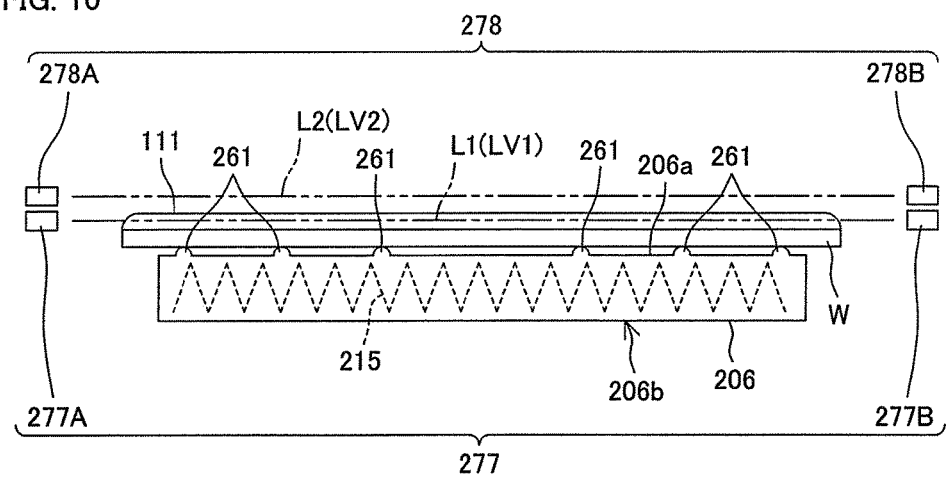
FIG. 10 is a second view of the liquid surface sensor when viewed horizontally.
Figure 11:
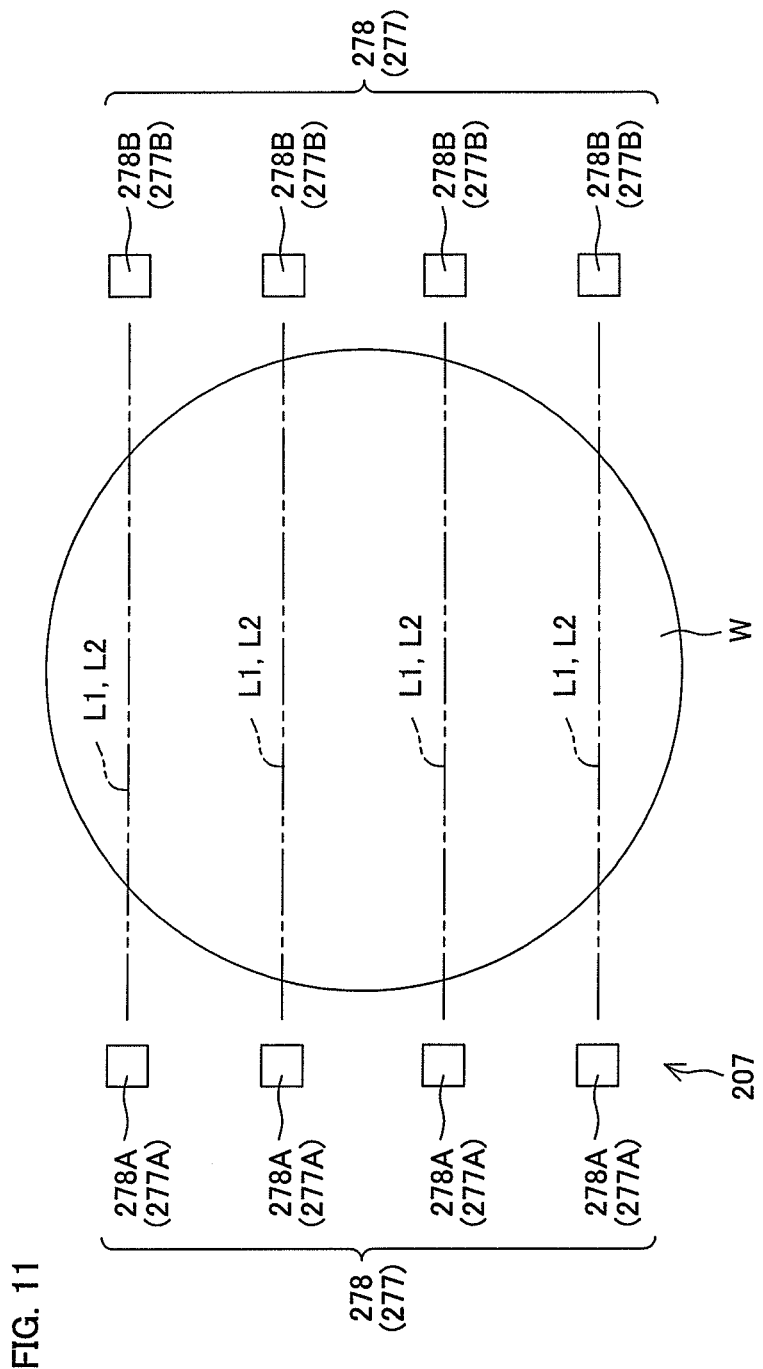
FIG. 11 is a plan view of the liquid surface sensor.

FIGS. 9 and 10 are views of the liquid surface sensor 207 when viewed horizontally. FIG. 11 is a plan view of the liquid surface sensor 207.

The liquid surface sensor 207 is a position sensor arranged to determine whether or not the liquid surface of the IPA liquid film 111 formed on the substrate W reaches a predetermined level. The liquid surface sensor 207 is, for example, a photoelectric sensor arranged to optically detect the IPA liquid film 111. The liquid surface sensor 207 determines that the liquid surface of the IPA liquid film 111 reaches a predefined first level LV1 or a predefined second level LV2. The second level LV2 is higher than the first level LV1.

As shown in FIGS. 9 and 10, the liquid surface sensor 207 includes a first liquid surface sensor 277 and a second liquid surface sensor 278.

The first liquid surface sensor 277 is arranged to determine whether or not the IPA liquid film 111 reaches a first detection line L1 set at the first level LV1. The first level LV1 is set equal to or higher than the level of the liquid surface of the IPA liquid film 111 having a minimum thickness with which the upper surface of the substrate W held on the first substrate holding unit 205 can be covered completely, that is, the entire upper surface of the substrate W can be covered. Accordingly, when the liquid surface of the IPA liquid film 111 on the substrate W is detected by the first liquid surface sensor 277, it is determined that the IPA liquid film is formed to cover the upper surface of the substrate W completely.

The second liquid surface sensor 278 is arranged to determine whether or not the IPA liquid film 111 reaches a second detection line L2 set at the second level LV2. The second level LV2 is set equal to the level of the liquid surface of the IPA liquid film 111 on the substrate W that is held on the hot plate 206 when the IPA liquid film 111 is raised successfully over the substrate W in a substrate heating step (S6) to be described hereinafter. Accordingly, when the liquid surface of the IPA liquid film 111 on the substrate W that is held on the hot plate 206 is detected by the second liquid surface sensor 278, it is determined that the IPA liquid film 111 is raised successfully over the substrate W.

As shown in FIG. 9, the first liquid surface sensor 277 is a transmissive sensor including one or more pairs of a light emitting device 277A and a light receiving device 277B. Similarly, the second liquid surface sensor 278 is a transmissive sensor including one or more pairs of a light emitting device 278A and light receiving device 278B. FIG. 11 shows an example in which multiple pairs of a light emitting device and a light receiving device are provided. Detection values from the first liquid surface sensor 277 and the second liquid surface sensor 278 are provided to the controller (see FIG. 1).

As shown in FIG. 11, the substrate W is disposed between the pairs of the light emitting device 277A and the light receiving device 277B in a plan view as well as disposed between the pairs of the light emitting device 278A and the light receiving device 278B in a plan view. Light from the light emitting devices 277A and the light emitting devices 278A passes over the substrate W to enter the light receiving devices 277B and the light receiving devices 278B. In FIGS. 9 to 11, light from the light emitting devices 277A to the light receiving devices 277B is indicated by the detection lines L1, while light from the light emitting devices 278A to the light receiving devices 278B is indicated by the detection lines L2.

As shown in FIGS. 9 and 10, the first liquid surface sensor 277 and the second liquid surface sensor 278 are disposed such that the detection line L1 runs a position lower than the detection line L2. As shown in FIG. 11, the first liquid surface sensor 277 is disposed such that the multiple detection lines L1 extend horizontally in parallel with each other. Similarly, the second liquid surface sensor 278 is disposed such that the multiple detection lines L2 extend horizontally in parallel with each other. The detection lines L1 may not be in parallel with the respective detection lines L2.

Figure 12:
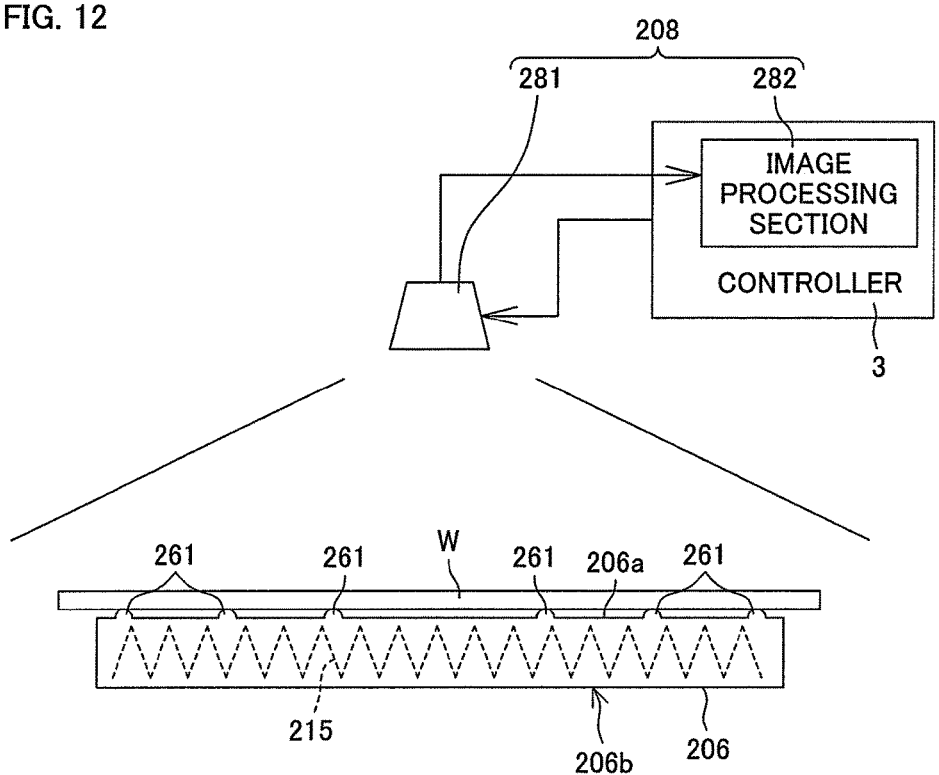
FIG. 12 is a view of a visual sensor when viewed horizontally.

FIG. 12 is a view of a visual sensor 208 when viewed horizontally.

The visual sensor 208 includes a camera 281 arranged to shoot (image) the upper surface of the substrate W and an image processing section (in-plane condition determining section) 282 arranged to acquire and process (reproduce) an image taken by the camera 281 as well as analyze the image.

The camera 281 incorporates an image sensor such as a CCD or a CMOS. The camera 281 is fixedly attached to, for example, the lower surface of the lid member 239 with the light incident plane thereof being directed downward. In this case, the imaging range of the camera 281 includes the entire upper surface of the substrate W held on the first substrate holding unit 205 or the second substrate holding unit 206b.

Although FIG. 2 exemplifies the case where the camera 281 is disposed in the central portion 239a of the lower surface of the lid member 239, the camera 281 may be disposed in a portion of the lower surface of the lid member 239 excluding the central portion 239a or may be supported by a member separate from the lid member 239. That is, the camera 281 is only required to be positioned over the substrate W.

The image processing section 282 is included in, for example, the controller 3. The image processing section 282 is arranged to process (reproduce) an image taken by the camera 281 as well as analyze the image based on an electrical signal provided from the camera 281 to the controller 3.

The camera 281 images the upper surface of the substrate W and the image processing section 282 acquires a planar image of the upper surface of the substrate W. Based on the planar image, the image processing section 282 obtains X coordinates and Y coordinates of the boundary between the upper surface of the substrate W and the IPA liquid film 111 in a plan view (coordinates along the X axis and coordinates along the Y axis when a plane in parallel with the upper surface of the substrate W is defined as an X-Y plane). That is, the image processing section 282 determines the in-plane condition of the IPA liquid film 111. The visual sensor 208 can thus visually detect the in-plane condition of IPA on the upper surface of the substrate W. The controller 3 controls the imaging operation of the camera 281.

Figure 13:
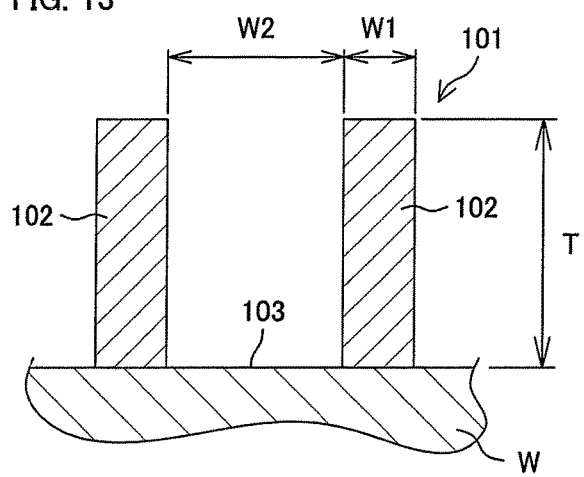
FIG. 13 is an enlarged cross-sectional view showing a surface of a substrate to be processed.

FIG. 13 is an enlarged cross-sectional view showing a surface of a substrate W to be processed by the processing unit 202. The substrate W to be processed is, for example, a silicon wafer. A pattern 101 is formed on a surface (upper surface 100), that is, a pattern formed surface of the substrate W. As shown in FIG. 13, the pattern 101 may have convex (columnar) structures 102 arranged in a matrix manner.

In this case, the line width W1 of the structures 102 is, for example, about 10 to 45 nm. The gap W2 of the pattern 101 is, for example, about 10 nm to a few micrometers. The film thickness T of the pattern 101 is, for example, about 50 nm to 5 μm. The aspect ratio (the ratio of the film thickness T to the line width W1) of the pattern 101 may be, for example, about 5 to 500 (typically about 5 to 50).

The pattern 101 includes, for example, an insulating film. The pattern 101 may also include a conductor film. More specifically, the pattern 101 may be formed of a multi-layer film of multiple layered films. The multi-layer film may include an insulating film and a conductor film. The pattern 101 may alternatively be formed of a single-layer film. The insulating film may be a silicon oxide film ($SiO_2$ film) or a silicon nitride film (SiN film). The conductor film may be an amorphous silicon film into which impurities are introduced for resistance reduction or a metal film (metal wiring film, for example).

It is noted that the pattern 101 may include repetitively arranged linear patterns each defined by a fine trench. Alternatively, the pattern 101 may be defined by providing multiple fine holes (voids or pores) in a thin film.

Figure 14:
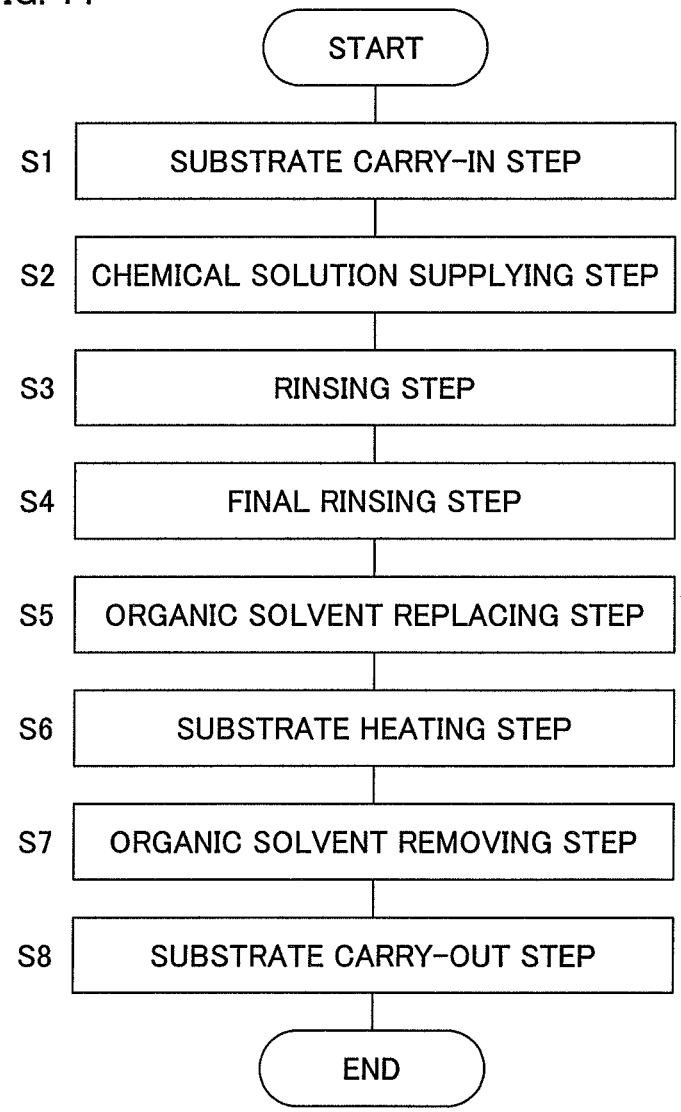
FIG. 14 is a process chart for illustrating an example of processing to be performed on the substrate in the processing unit.
Figure 15A:
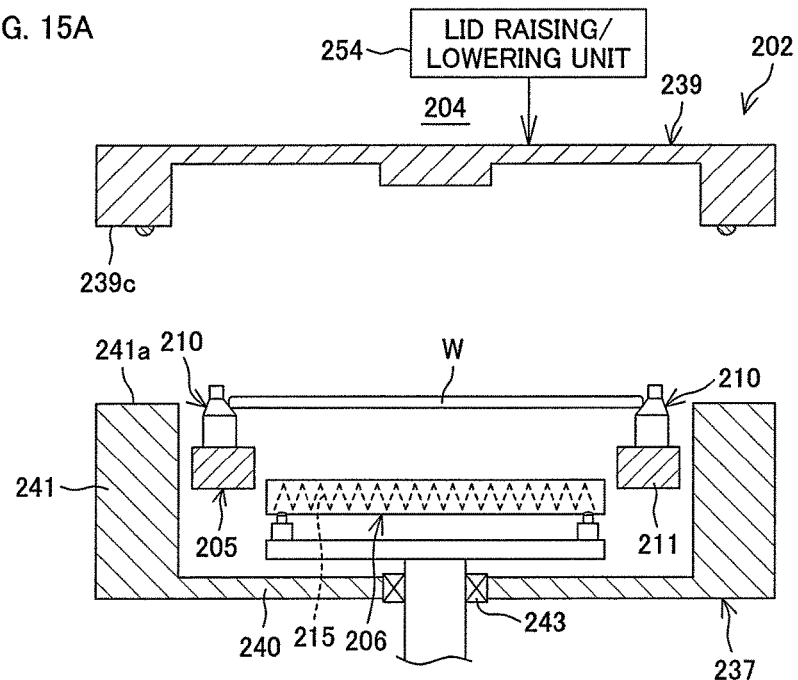
FIG. 15A is a schematic view for illustrating the example of processing shown in FIG. 14.
Figure 16A:
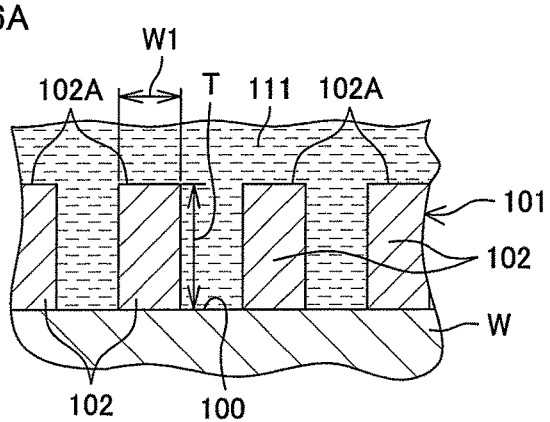
FIG. 16A is a schematic cross-sectional view for illustrating the condition of the upper surface of the substrate in the example of processing shown in FIG. 14.
Figure 16B:
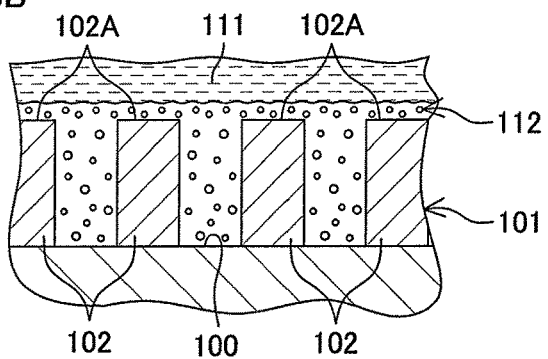
FIG. 16B is a schematic cross-sectional view for illustrating the condition of the upper surface of the substrate in the example of processing shown in FIG. 14.
Figure 16C:
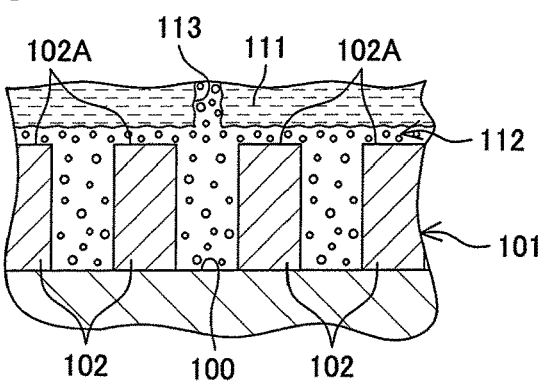
FIG. 16C is a schematic cross-sectional view for illustrating the condition of the upper surface of the substrate in the example of processing shown in FIG. 14.
Figure 17:
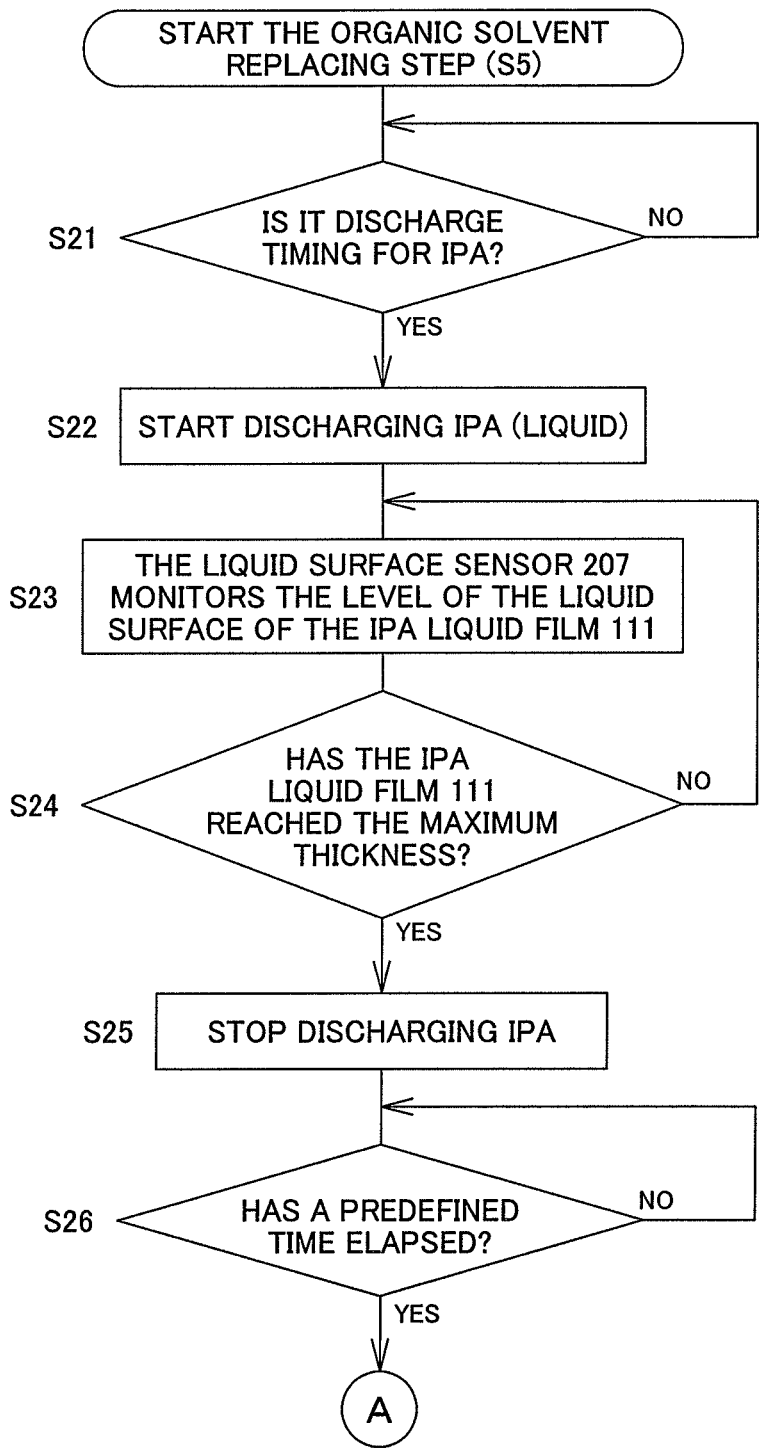
FIG. 17 is a first flow chart showing the flow of processing in the organic solvent replacing step, the substrate heating step, and the organic solvent removing step.
Figure 18:
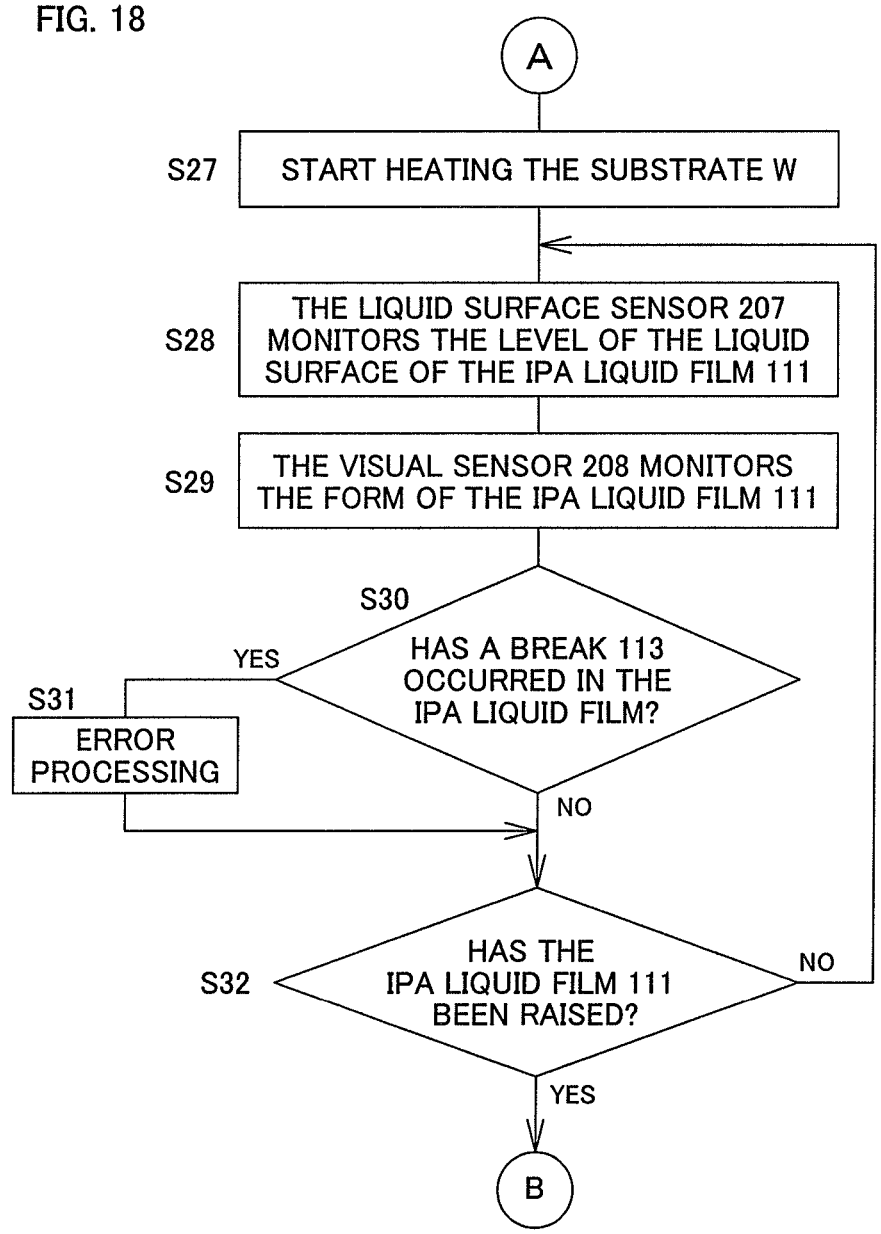
FIG. 18 is a second flow chart showing the flow of processing in the organic solvent replacing step, the substrate heating step, and the organic solvent removing step.
Figure 19:
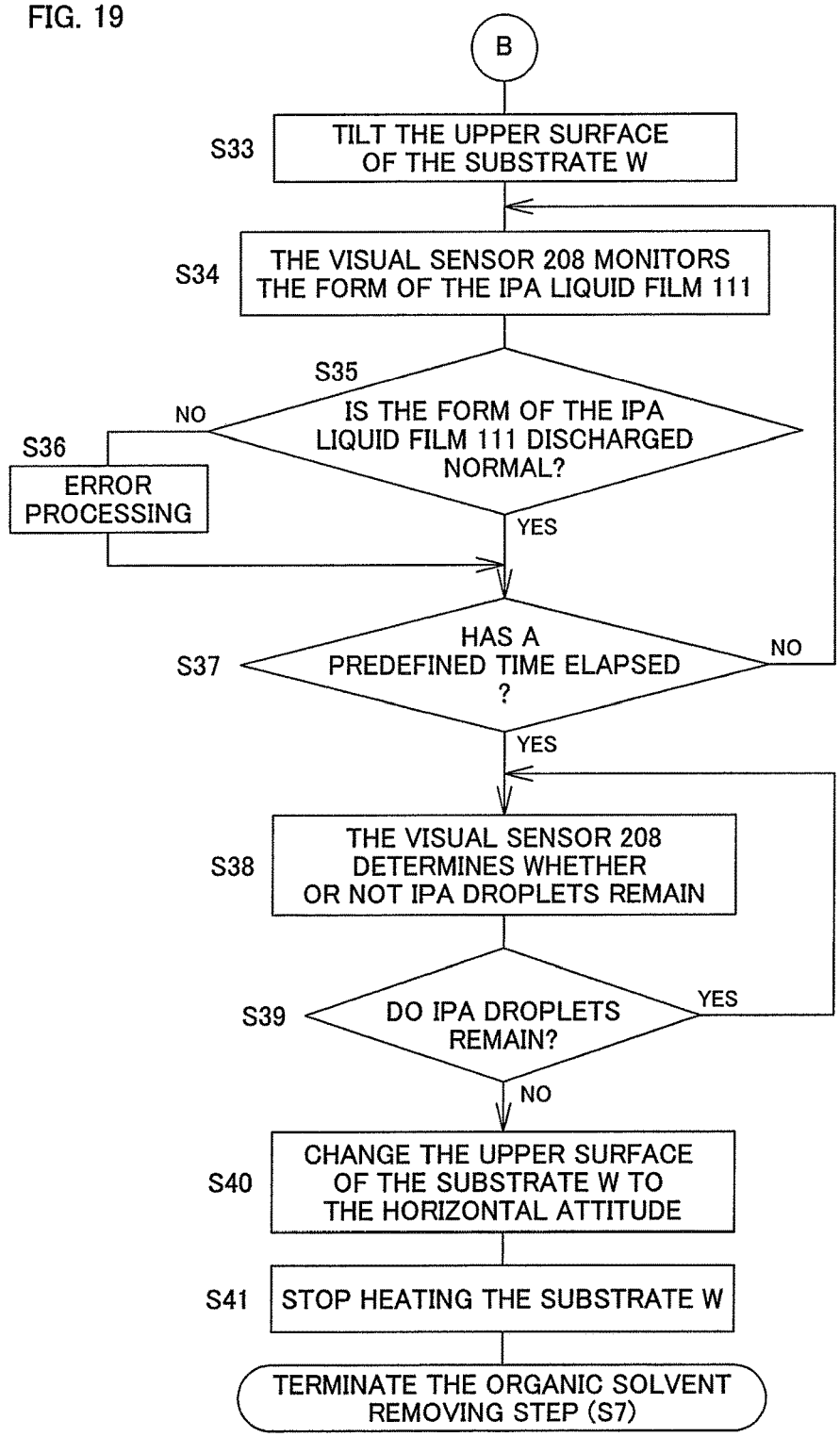
FIG. 19 is a third flow chart showing the flow of processing in the organic solvent replacing step, the substrate heating step, and the organic solvent removing step.
Figure 21:
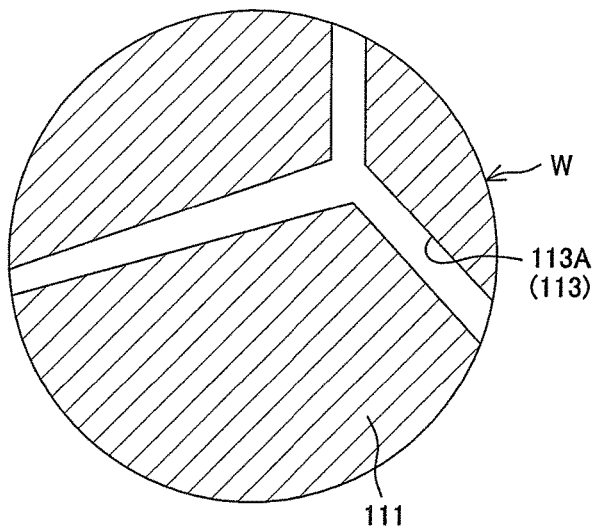
FIG. 21 is a plan view showing a break according to an aspect occurring in the IPA liquid film in the substrate heating step.
Figure 22:
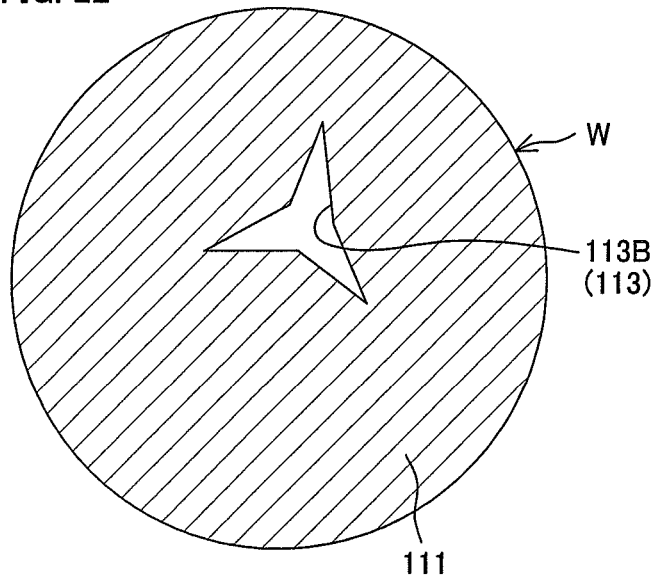
FIG. 22 is a plan view showing a break according to another aspect occurring in the IPA liquid film in the substrate heating step.
Figure 23:
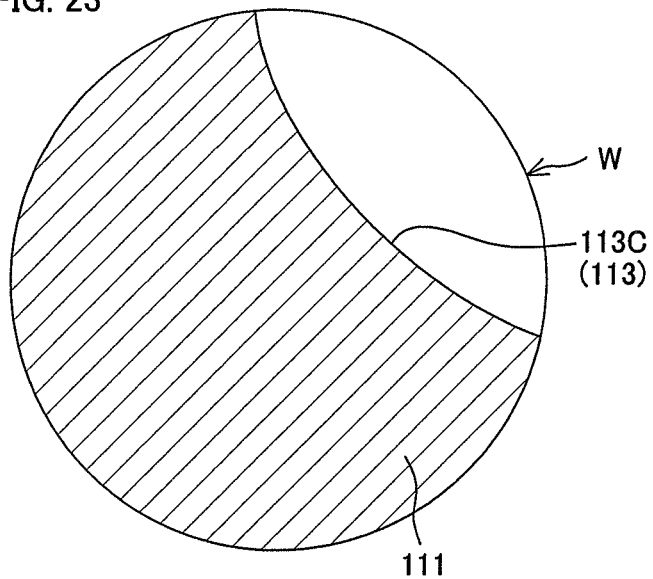
FIG. 23 is a plan view showing a break according to a further aspect occurring in the IPA liquid film in the substrate heating step.
Figure 24:
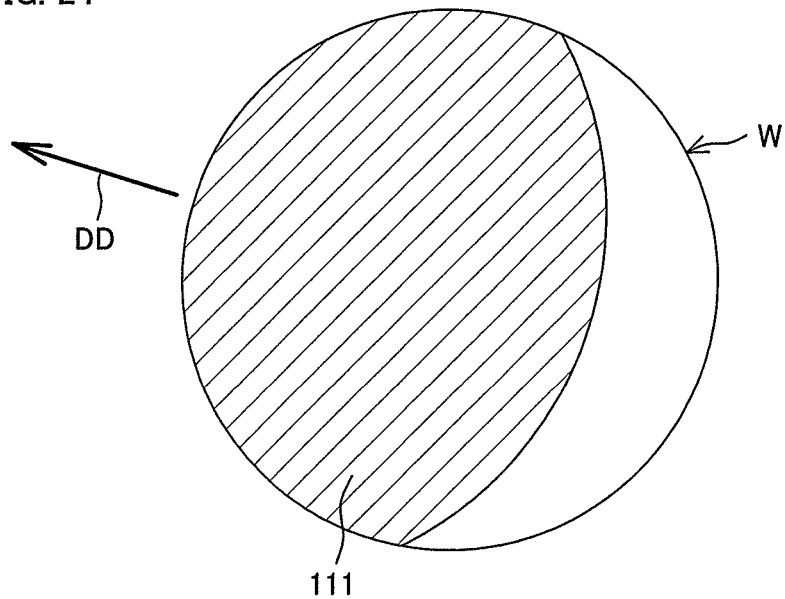
FIG. 24 is a first plan view showing a state where the IPA liquid film is discharged normally in the organic solvent removing step.
Figure 25:
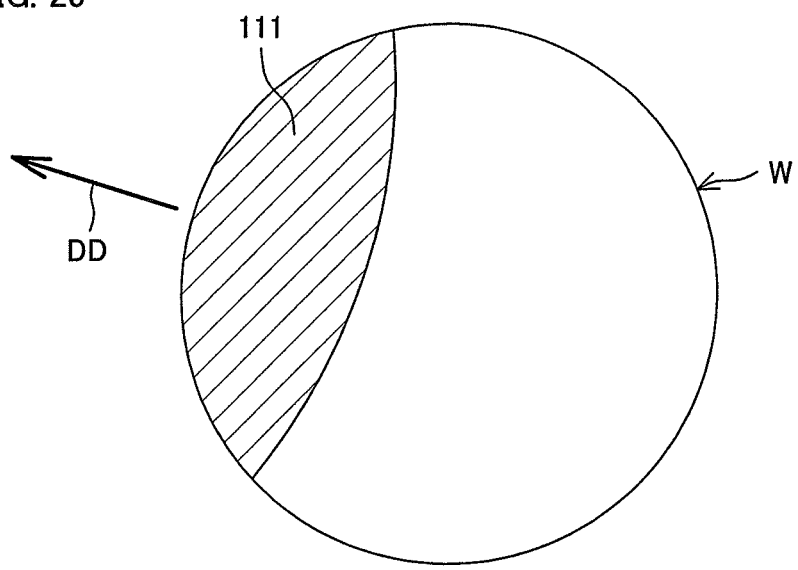
FIG. 25 is a second plan view showing a state where the IPA liquid film is discharged normally in the organic solvent removing step.
Figure 26:
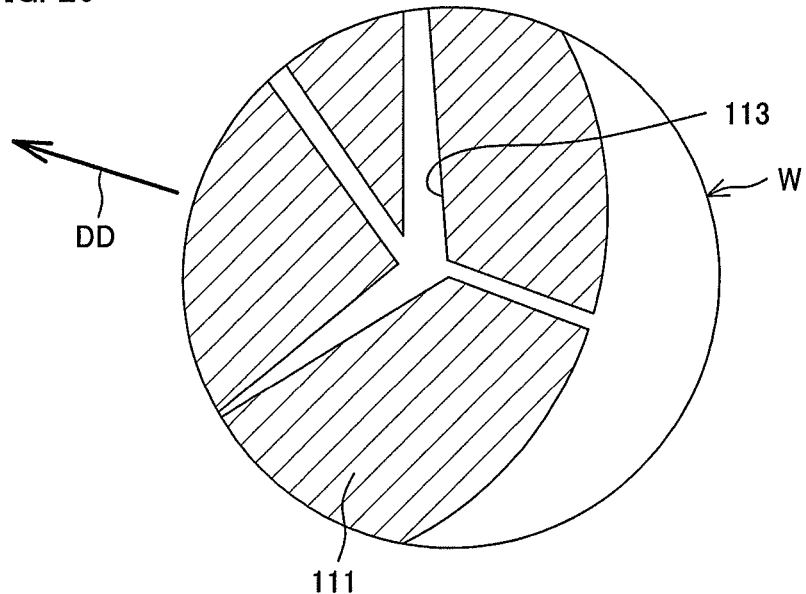
FIG. 26 is a first plan view showing a state where the IPA liquid film is discharged in a split manner in the organic solvent removing step.
Figure 27:
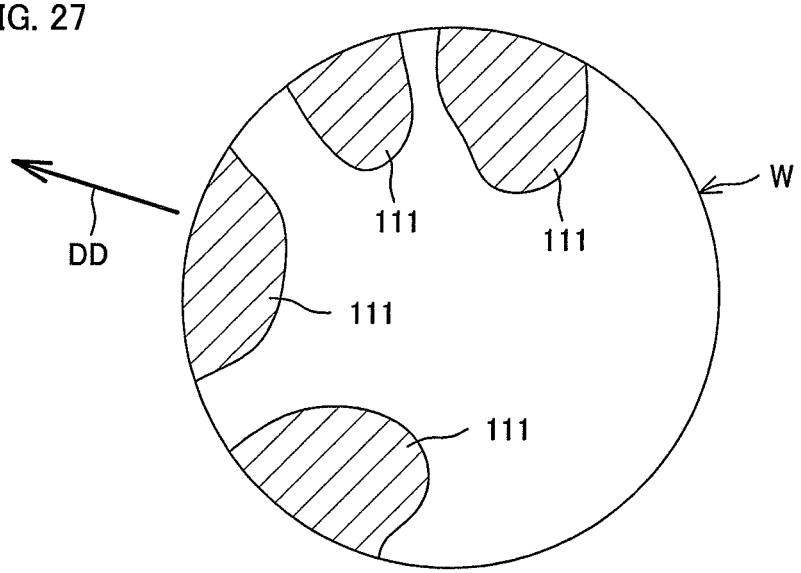
FIG. 27 is a second plan view showing a state where the IPA liquid film is discharged in a split manner in the organic solvent removing step.
Figure 28:
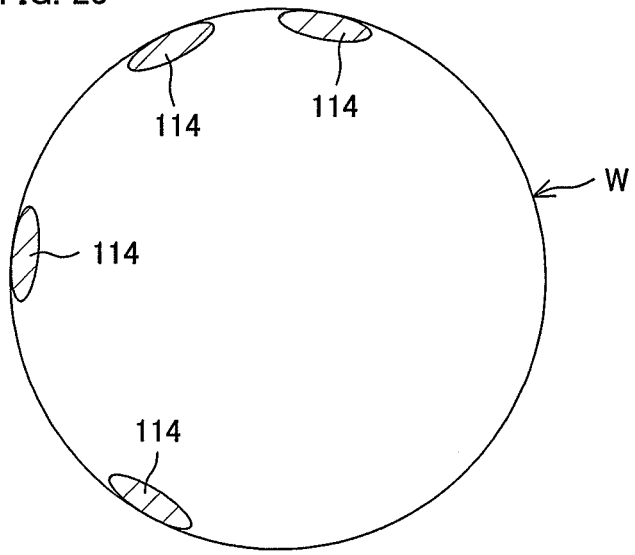
FIG. 28 is a third plan view showing a state where the IPA liquid film is discharged in a split manner in the organic solvent removing step.

FIG. 14 is a process chart for illustrating an example of processing to be performed on the substrate W in the processing unit 202. FIGS. 15A to 15H are schematic views for illustrating the example of processing. FIGS. 16A to 16C are schematic cross-sectional views for illustrating the condition of the upper surface of the substrate W in the example of processing. FIGS. 17 to 19 are flow charts showing the flow of processing in the organic solvent replacing step (S5), the substrate heating step (S6), and the organic solvent removing step (S7). FIGS. 21 to 23 are plan views showing a break 113 according to an aspect occurring in the IPA liquid film 111 in the substrate heating step (S6). FIG. 23 is a schematic view of the IPA liquid film in the substrate heating step (S6) when viewed horizontally. FIGS. 24 and 25 are plan views showing a state where the IPA liquid film 111 is discharged normally in the organic solvent removing step (S7). FIGS. 26 to 28 are plan views showing a state where the IPA liquid film is discharged in a split manner in the organic solvent removing step (S7).

Hereinafter, reference will be made to FIGS. 1, 2, and 14. Reference to FIGS. 4 to 6 and 9 to 28 will be made appropriately. It is noted that "the front surface (upper surface) of the substrate W" in the description below includes the front surface (upper surface) of the substrate W itself and the front surface (upper surface) of the pattern 101.

For processing of the substrate W in the processing unit 202, a substrate carry-in step (step S1) is performed to carry the unprocessed substrate W into the outer chamber 204. Prior to the substrate carry-in step (S1), the controller 3 sets the heater 215 ON (energized) and locates the hot plate 206 at the lower position, at which the hot plate 206 is retracted substantially downward from the position at which the substrate W is to be held on the first substrate holding unit 205. The controller 3 also retracts all the nozzles from above the first substrate holding unit 205. The controller 3 also causes all the movable pins 212 to have a releasing state.

In the substrate carry-in step (S1), the controller causes a hand H of the delivery robot CR holding the substrate W (see FIG. 1) to enter the outer chamber 204 and causes the delivery robot CR to place the substrate W on the first substrate holding unit 205. This causes the underside of the substrate W to be supported by the multiple fixed pins 210 of the first substrate holding unit 205 with the pattern formed surface (front surface) facing upward. Thereafter, the controller 3 brings all of the multiple movable pins 212 into a holding state. This causes the substrate W to be held horizontally by the multiple fixed pins 210 and the multiple movable pins 212, as shown in FIG. 15A (only the fixed pins 210 are shown in FIG. 15A). After the substrate W is transferred to the first substrate holding unit 205, the controller 3 retracts the hand H of the delivery robot CR from inside the outer chamber 204.

After the substrate W is thus held by the multiple fixed pins 210 and the multiple movable pins 212, the controller 3 controls the ring rotating unit 213 to start rotating the substrate W. The rotational speed of the substrate W is increased to a predefined liquid processing rotational speed (about 100 to 1500 rpm, for example) and kept at the liquid processing rotational speed.

It is noted that the heater 215 is controlled to be ON and the hot plate 206 is caused to produce heat as in the substrate carry-in step (S1). However, since the space between the hot plate 206 at the lower position and the substrate W held on the first substrate holding unit 205 is sufficiently large, heat from the hot plate 206 cannot be transferred sufficiently to the substrate W.

Next, a chemical solution supplying step (step S2) is performed to supply chemical solution onto the substrate W.

Figure 15B:
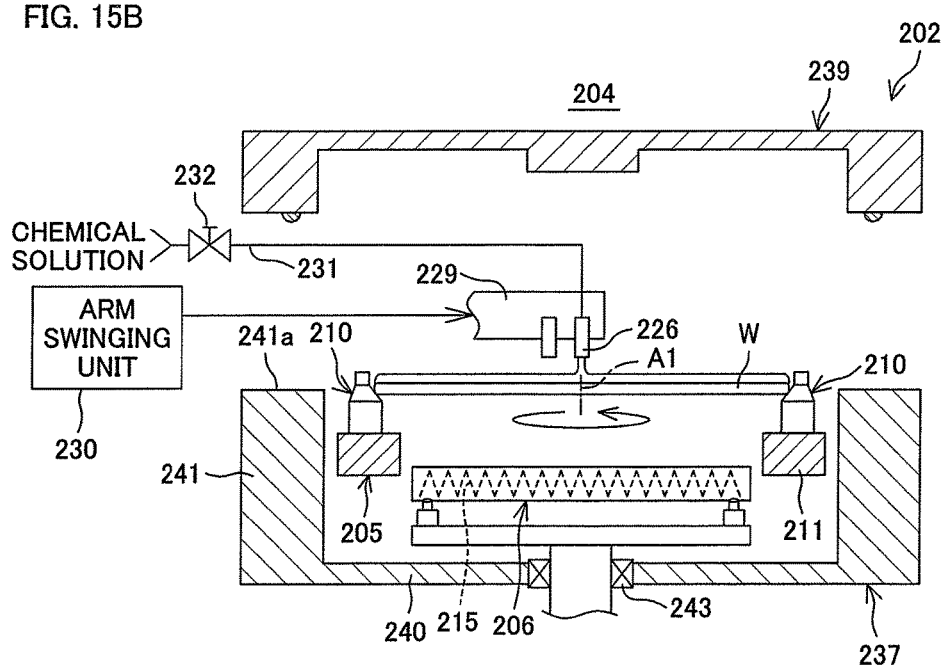
FIG. 15B is a schematic view for illustrating a step following that shown in FIG. 15A.

Specifically, as shown in FIG. 15B, the controller 3 controls the arm swinging unit 230 to swing the arm 229 from its home position and move the chemical solution nozzle 226 from its retracted position to above the substrate W. This causes the chemical solution nozzle 226 to be located at its processing position (at which the chemical solution nozzle 226 is opposed to the central portion of the upper surface of the substrate W). After the chemical solution nozzle 226 is thus located at the processing position, the controller 3 opens the chemical solution valve 232. This causes chemical solution to be discharged through the discharge port of the chemical solution nozzle 226 and supplied onto the upper surface of the substrate W.

The chemical solution supplied onto the central portion of the upper surface of the substrate W undergoes a centrifugal force due to the rotation of the substrate W to flow on the upper surface of the substrate W toward the peripheral portion of the substrate W. This causes the entire upper surface of the substrate W to be supplied with and processed by the chemical solution. The chemical solution reaching the peripheral portion of the upper surface of the substrate W splatters laterally from the substrate W. As a result, droplets of the chemical solution fly outward from the peripheral portion of the substrate W.

The chemical solution splattering from the peripheral portion of the substrate W is received by the inner wall of the receiver cup and sent through the waste liquid passage (not shown) to the waste liquid equipment (not shown). The chemical solution is processed at the waste liquid equipment. The chemical solution may be sent not to the waste liquid equipment but to recovery equipment to be reused.

When a predefined time has elapsed since the start of the discharge of the chemical solution, the controller 3 closes the chemical solution valve 232 to stop the discharge of the chemical solution through the chemical solution nozzle 226.

Next, a rinsing step (step S3) is performed to remove the chemical solution from the substrate W.

Figure 15C:
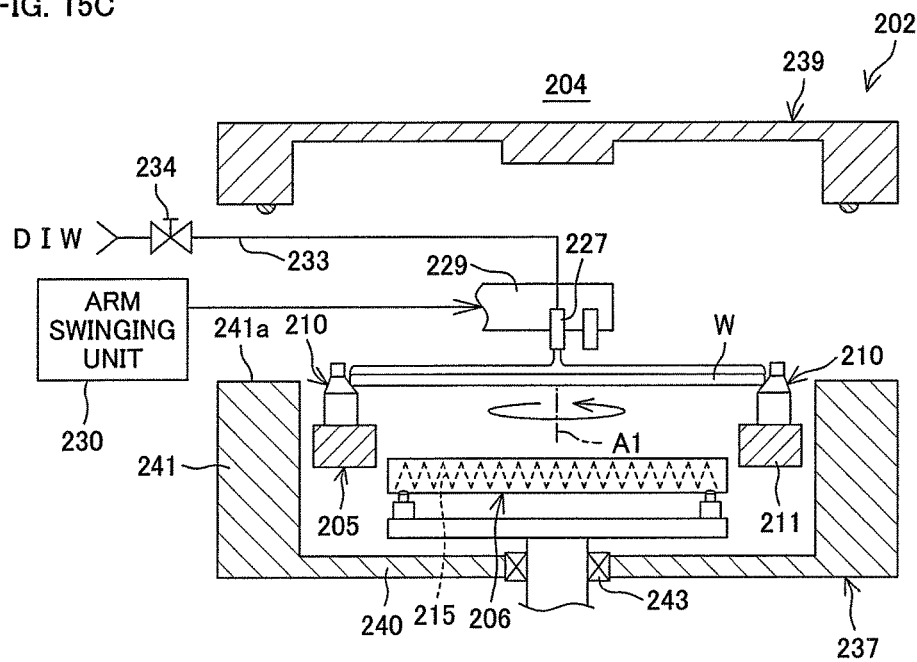
FIG. 15C is a schematic view for illustrating a step following that shown in FIG. 15B.

Specifically, as shown in FIG. 15C, the controller 3 controls the arm swinging unit 230 to swing the arm 229 and locate the rinse liquid nozzle 227 at its processing position. After the rinse liquid nozzle 227 is thus located at the processing position, the controller 3 opens the rinse liquid valve 234. This causes rinse liquid to be discharged through the discharge port of the rinse liquid nozzle 227.

The rinse liquid supplied onto the central portion of the upper surface of the substrate W undergoes a centrifugal force due to the rotation of the substrate W to flow on the upper surface of the substrate W toward the peripheral portion of the substrate W. This causes the entire upper surface of the substrate W to be supplied with the rinse liquid and the chemical solution adhering to the upper surface of the substrate W to be rinsed off. The rinse liquid supplied onto the upper surface of the substrate W splatters laterally from the peripheral portion of the substrate W.

The rinse liquid splattering from the peripheral portion of the substrate W is received by and runs down the inner wall of the peripheral wall portion 241 of the chamber main body 237 to collect at the bottom of the chamber main body 237. The rinse liquid collecting at the bottom of the chamber main body 237 is sent through the waste liquid passage (not shown) to the waste liquid equipment (not shown). The rinse liquid is processed at the waste liquid equipment.

When a predefined time has elapsed since the start of the discharge of the rinse liquid, the controller 3 closes the rinse liquid valve 234 to stop the discharge of the rinse liquid through the rinse liquid nozzle 227 and controls the arm swinging unit 230 to put the arm 229 back to its home position. This causes the chemical solution nozzle 226 and the rinse liquid nozzle 227 to be put back to the retracted position.

Figure 15D:
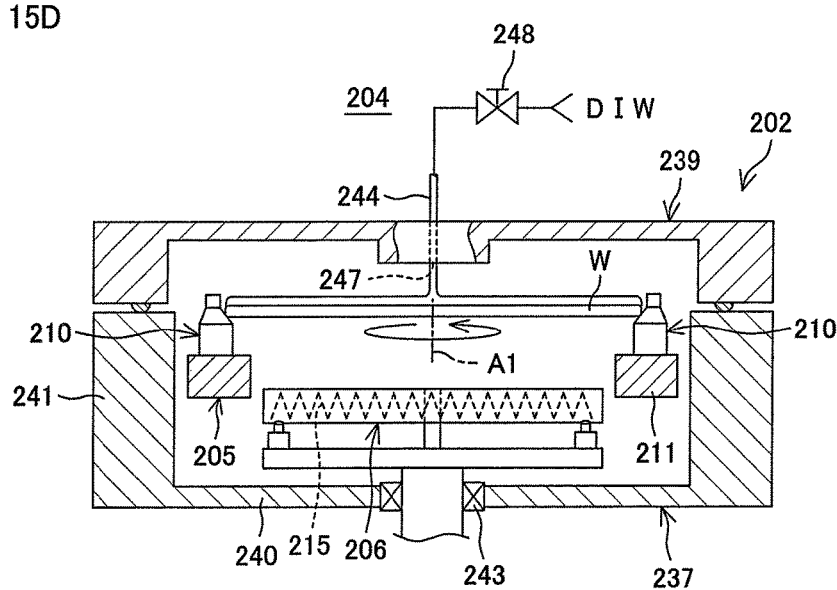
FIG. 15D is a schematic view for illustrating a step following that shown in FIG. 15C.

Next, the controller 3 controls the lid raising/lowering unit 254 to lower the lid member 239 to the lid closed position, as shown in FIG. 15D. The lid member 239 thus lowered to the lid closed position closes the opening 238 of the chamber main body 237. In this state, when the lid member 239 and the chamber main body 237 are coupled using a locking member (not shown), the sealing ring 253, which is disposed in the peripheral portion 239c of the lower surface of the lid member 239, comes into contact with the upper end face 241a of the chamber main body 237 over the entire circumference for sealing between the chamber main body 237 and the lid member 239. This causes the interior space between the chamber main body 237 and the lid member 239 to be sealed. In this state, the rinse liquid discharge port 247, the organic solvent discharge port 249, and the nitrogen gas discharge port 251 are respectively disposed in a manner opposed to the upper surface of the substrate W.

Next, a final rinsing step (step S4) is performed on the substrate W.

Specifically, as shown in FIG. 15D, the controller 3 opens the rinse liquid upper valve 248 to cause rinse liquid to be discharged through the rinse liquid discharge port 247 of the rinse liquid upper pipe 244. The rinse liquid discharged through the rinse liquid discharge port 247 lands on the central portion of the upper surface of the substrate W.

The rinse liquid supplied onto the central portion of the upper surface of the substrate W undergoes a centrifugal force due to the rotation of the substrate W to flow on the upper surface of the substrate W toward the peripheral portion of the substrate W. This causes the entire upper surface of the substrate W to be supplied with the rinse liquid and the upper surface of the substrate W to be rinse-processed. In the final rinsing step (S4), the rinse liquid reaches the bottom of the gap of the pattern 101 formed on the upper surface 100 of the substrate W (fairly close to the upper surface 100 of the substrate W itself in the gap) (see also FIG. 13).

The rinse liquid splattering from the peripheral portions of the substrate W is also received by and runs down the inner wall of the peripheral wall portion 241 of the chamber main body 237 to collect at the bottom of the chamber main body 237. The rinse liquid collecting at the bottom of the chamber main body 237 is sent through the waste liquid passage (not shown) to the waste liquid equipment (not shown). The rinse liquid is processed at the waste liquid equipment.

When a predefined time has elapsed since the start of the discharge of the rinse liquid, the controller 3 closes the rinse liquid upper valve 248 to stop the discharge of the rinse liquid through the rinse liquid discharge port 247.

Next, an organic solvent replacing step (step S5) is performed to supply IPA liquid onto the upper surface of the substrate W to replace the rinse liquid on the upper surface of the substrate W with the IPA.

Figure 15E:
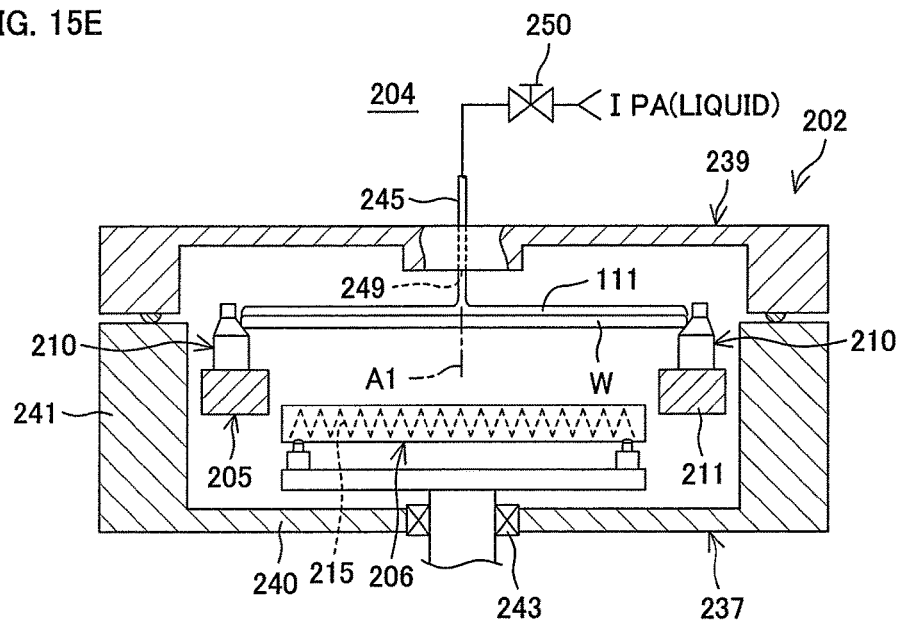
FIG. 15E is a schematic view for illustrating a step following that shown in FIG. 15D.

In the organic solvent replacing step (step S5), when the time has come to discharge IPA (YES in step S21), the controller 3 opens the organic solvent valve 250 to cause IPA liquid to be discharged through the organic solvent discharge port 249 of the organic solvent upper pipe 245, as shown in FIG. 15E. This causes the discharge of IPA to start (step S22). The IPA discharged through the organic solvent discharge port 249 is room-temperature (25° C., for example) liquid, that is, having a temperature lower than the boiling point of IPA (82.4° C.). The IPA liquid discharged through the organic solvent discharge port 249 lands on the central portion of the upper surface of the substrate W. With the start of the discharge of IPA, the organic solvent replacing step (S5) starts.

The IPA liquid supplied onto the central portion of the upper surface of the substrate W undergoes a centrifugal force due to the rotation of the substrate W to flow on the upper surface of the substrate W toward the peripheral portion of the substrate W. The IPA liquid supplied onto the central portion of the upper surface of the substrate W can thus spread toward the peripheral portion. This allows the IPA liquid to reach the entire upper surface of the substrate W. During this time, the hot plate 206 is at the lower position and heat from the hot plate 206 is not transferred sufficiently to the substrate W. As a result, the upper surface of the substrate W has, for example, a room temperature, and the IPA liquid flows on the upper surface of the substrate W while remaining at the room temperature. As shown in FIG. 15E, this causes an IPA liquid film 111 covering the upper surface of the substrate W to be formed on the upper surface (see also FIG. 9, for example). After the start of the discharge of IPA, the controller 3 uses the liquid surface sensor 207 to monitor the level of the liquid surface of the IPA liquid film 111 (step S23 (liquid surface level detecting step)).

Since the IPA supplied onto the upper surface of the substrate W is liquid, the rinse liquid existing in the gap of the pattern 101 can be replaced successfully, as shown in FIG. 16A. Also, since the IPA liquid film 111 covers the entire upper surface of the substrate W, the rinse liquid can be replaced successfully with the IPA liquid across the upper surface of the substrate W.

When the level of the liquid surface of the IPA liquid film 111 reaches the first level LV1 (see FIG. 9), the controller 3 determines that the IPA liquid film 111 has a preset thickness (YES in step S24) to stop the discharge of the IPA liquid through the organic solvent discharge port 249 (step S25). The first level LV1 corresponds to the minimum thickness of the IPA liquid film 111 with which the upper surface of the substrate W held on the first substrate holding unit 205 can be covered completely.

Since the supply of IPA is stopped after the IPA liquid film 111 has a desired thickness, it is possible to reduce the amount of IPA consumption. It is also possible to prevent the IPA liquid film 111 from having an unnecessarily increased thickness. As a result, the thickness of the IPA liquid film 111 can be reduced, which is to be raised over the substrate W in the substrate heating step (S6) to be described next. It is therefore possible to shorten the duration of operation of the following organic solvent removing step (S7).

It is noted that in the organic solvent replacing step (S5), the rotation of the substrate W may be stopped or the substrate W may be rotated at a speed as low as about 10 rpm (puddling speed). With the deceleration of the substrate W, the centrifugal force acting on the IPA liquid on the substrate W becomes zero or small, so that the centrifugal force acting on the IPA becomes smaller than the force acting between the IPA and the surface of the substrate. As a result, the IPA remains on the upper surface of the substrate W without being discharged from the peripheral portion of the substrate W, so that the IPA liquid film in a puddle state is maintained on the upper surface of the substrate W.

The first level LV1 may vary depending on the rotation of the substrate W in the organic solvent replacing step (S5). Specifically, if the substrate W is rotated at the puddling speed, the first level LV1 may be set higher than in the case of rotating the substrate W at a speed higher than the puddling speed. That is, the first level LV1 may vary depending on the rotational speed of the substrate W.

Figure 15F:
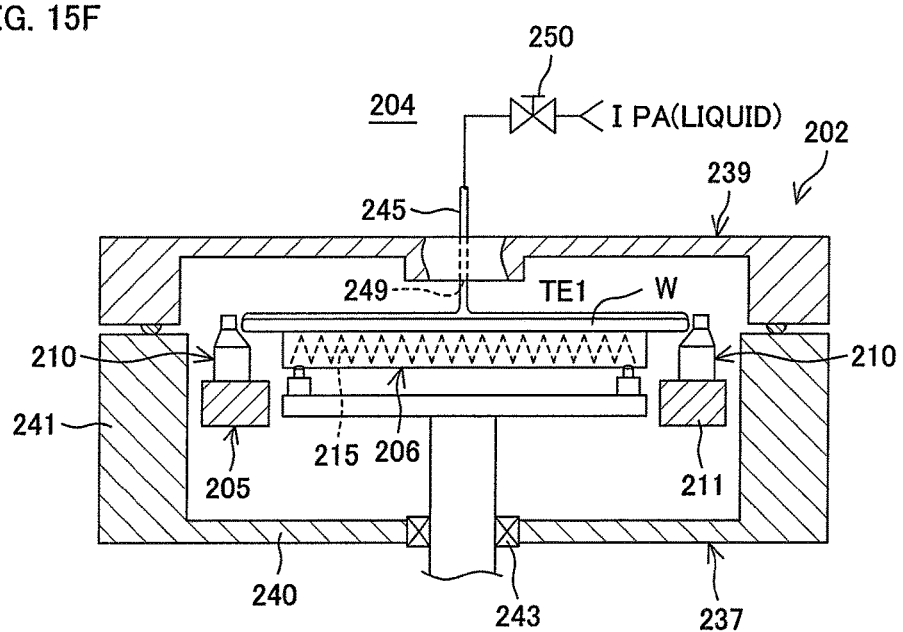
FIG. 15F is a schematic view for illustrating a step following that shown in FIG. 15E.

When a predefined time has elapsed since the start of the supply of IPA (YES in step S26), the controller 3 controls the plate raising/lowering unit 216 to raise the hot plate 206 from the lower position (as shown in FIG. 4) to the upper position (as shown in FIG. 5). The hot plate 206, when raised to the same height as the rotational ring 211, comes into contact with the lower surface of the substrate W. When the controller 3 continuously raises the hot plate 206, the substrate W moves away from the first substrate holding unit 205 to be held only on the hot plate 206. The substrate W is thus transferred from the first substrate holding unit 205 to the hot plate 206. The substrate W transferred to the hot plate 206 is supported by the multiple support pins 261. Even after the substrate W is thus transferred, the hot plate 206 continues to be raised to reach the upper position, at which the raising of the hot plate 206 is stopped. FIGS. 15F and 5 show the state where the hot plate 206 is located at the upper position.

When the substrate W is thus transferred to the hot plate 206, the lower surface of the substrate W starts to be heated (step S27) and thus the substrate heating step (step S6) begins. Since the heater 215 is controlled to be constantly ON, the hot plate 206 produces heat (on the substrate opposing surface 206a). When the substrate W is placed on the hot plate 206, heat from the substrate opposing surface 206a is provided to the lower surface of the substrate W. This causes the substrate W to be heated and thereby the IPA liquid film 111 on the substrate W to be also heated. The amount of heat per unit area provided to the substrate W is approximately the same across the substrate W.

After the start of the heating of the substrate W, the controller 3 performs a liquid surface level detecting step (step S28) to monitor the level of the liquid surface of the IPA liquid film 111 with the liquid surface sensor 207. After the start of the heating of the substrate W, the controller 3 also performs a first form abnormality detecting step (step S29) to monitor the form of the IPA liquid film 111 with the camera 281 of the visual sensor 208.

In the substrate heating step (S6), the hot plate 206 heating the substrate W causes the upper surface of the substrate W to be heated to a predefined liquid film raising temperature (predetermined temperature) TE1 set 40 to 120° C. higher than the boiling point of IPA (82.4° C.)

Referring to FIGS. 16A and 16B, the temperature of the upper surface of the substrate W (the upper surface of the pattern 101, more particularly the upper end face 102A of each structure 102), after having reached the liquid film raising temperature TE1, is kept at the liquid film raising temperature TE1. The entire upper surface of the substrate W is kept at the liquid film raising temperature TE1. During this time, the amount of heat generation per unit time from the heater 215 is set such that the upper surface of the substrate W placed on the hot plate 206 is kept at the liquid film raising temperature TE1.

When a period of time has elapsed after the temperature of the upper surface of the substrate W reaches the liquid film raising temperature TE1, the gap of the pattern 101 is filled with IPA vapor generated from the IPA liquid film 111. Further, the IPA vapor forms an IPA gaseous phase 112 in a space over the upper surface of the substrate W (the upper end face 102A of each structure 102). This causes the IPA liquid film 111 to be raised from the upper surface of the substrate W (the upper end face 102A of each structure 102) (see FIG. 16B).

Since the gap of the pattern 101 is thus filled with the IPA gaseous phase, only a fairly small surface tension acts between adjacent structures 102. It is therefore possible to suppress or prevent destruction of the pattern 101 due to a surface tension. Also, in the state of FIG. 16B, since the IPA liquid film 111 is raised over the upper surface of the substrate W (the upper end face 102A of each structure 102), a frictional force of approximately zero is generated between the upper surface of the substrate W and the IPA liquid film 111.

Figure 20:
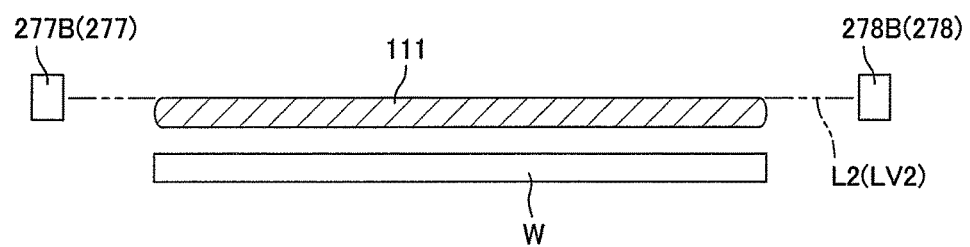
FIG. 20 is a schematic view of an IPA liquid film in the substrate heating step when viewed horizontally.

Further, when the level of the liquid surface of the IPA liquid film 111 detected by the liquid surface sensor 207 reaches the second level LV2 (YES in step S32), as shown in FIG. 20, the controller 3 determines that the IPA liquid film 111 is raised successfully. That is, in the substrate heating step (S6), since the level of the liquid surface of the IPA liquid film 111 becomes high with the raising of the IPA liquid film 111, it is possible to determine whether or not the IPA liquid film 111 is raised by detecting the level of the liquid surface of the IPA liquid film 111. It is thus possible to confirm that the IPA liquid film 111 is raised in the substrate heating step (S6).

Meanwhile, a break 113 may occur in the IPA liquid film 111 raised over the substrate W. A crack 113A shown in FIG. 21, a hole 113B shown in FIG. 22, and an arc-shaped notch 113C shown in FIG. 23 can be exemplified as aspects of such a break 113. As a result of such a break 113, a liquid-solid interface between IPA droplets and the substrate W is formed in the portion, which may result in pattern destruction due to a surface tension during drying. Also, defects such as watermarks may occur after drying in the portion of such a break 113 on the upper surface of the substrate W. It is therefore possible to determine whether or not a break 113 (form abnormality) occurs in the raised IPA liquid film 111.

Local overheating of the substrate W may be a factor in the occurrence of a break 113 in the raised IPA liquid film 111. The substrate W, if heated unevenly by the hot plate 206, would undergo overheating in a portion in which the IPA is vaporized in a larger amount. The vaporization of IPA in a larger amount would result in that the IPA gaseous phase 112 cuts through the IPA liquid film 111 located over the IPA gaseous phase 112 and spouts upward through the IPA liquid film 111. As a result, a break 113 could occur in the IPA liquid film 111 (see also FIG. 16C).

In the substrate heating step (S6), a break 113 may also occur in the IPA liquid film 111 before raising.

If a break 113 is detected in the IPA liquid film 111 (YES in step S30), the controller 3 performs an error processing step (step S31). Since the image processing section 282 obtains X coordinates and Y coordinates of the boundary between the upper surface of the substrate W and the IPA liquid film 111, the controller 3 can obtain the position, size, shape, etc., of a break 113, if it has occurred, using an image signal from the camera 281. In the error processing (S31), the controller 3 stores the occurrence of the form abnormality in the substrate W as a log in the storage section of the controller 3 as well as stores the position, size, shape, etc., of the break 113 in the log.

After it is confirmed that the IPA liquid film 111 is raised (YES in step S32), the controller 3 stops the discharge of IPA through the organic solvent discharge port 249 and terminates the substrate heating step (S6). Subsequently, the controller 3 performs an organic solvent removing step (step S7) to remove the IPA liquid film 111 raised over the upper surface of the substrate W.

Figure 15G:
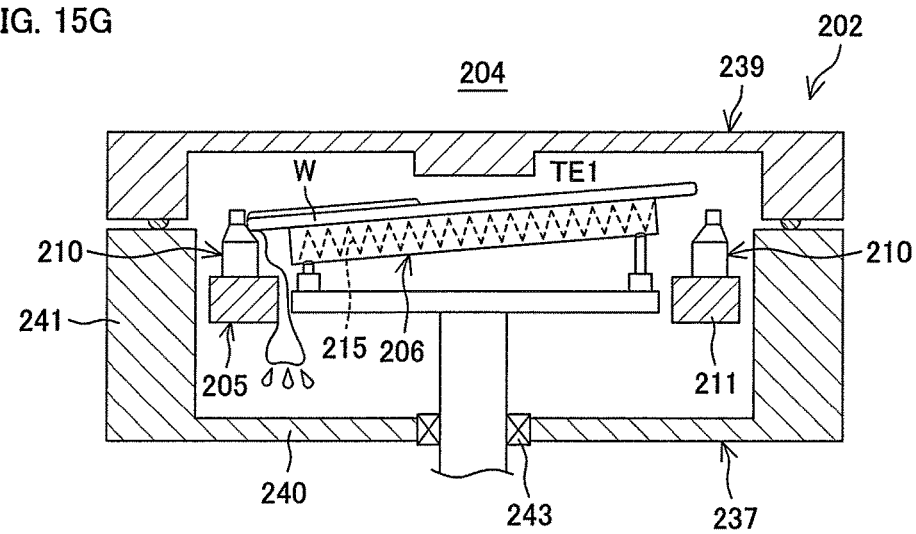
FIG. 15G is a schematic view for illustrating a step following that shown in FIG. 15F.

After it is confirmed that the IPA liquid film 111 is raised (YES in step S32), the controller 3 immediately causes a force for moving the IPA liquid film 111 laterally from the substrate W to act on the liquid film 111. Specifically, as shown in FIGS. 15G and 6, the controller 3 controls the extension/contraction driving unit 225 to change the hot plate 206 (the upper surface of the substrate W) from the horizontal attitude to the tilted attitude (step S33).

After the upper surface of the substrate W is thus tilted, the controller 3 performs a second form abnormality detecting step (step S34) to monitor the form of the IPA liquid film 111 with the camera 281 of the visual sensor 208. This allows for determining whether or not the IPA liquid film 111 is removed from the substrate W while maintaining its normal form (without being split, for example).

At the start of the organic solvent removing step (S7), a frictional force of approximately zero is generated between the upper surface of the substrate W and the IPA liquid film 111, as described above. Thus, the IPA liquid film 111 is easily movable along the upper surface of the substrate W. In the organic solvent removing step (S7), since the upper surface of the substrate W is tilted with respect to the horizontal surface, the IPA liquid film 111 moves under its own weight in a discharge direction DD toward the lowest portion of the peripheral portion of the tilted substrate W along the upper surface of the substrate W, as shown in FIGS. 24 and 25. The IPA liquid film 111 moves while remaining in a liquid mass without being split into a number of small droplets. This causes the IPA liquid film 111 to be removed from over the substrate W.

Meanwhile, in the organic solvent removing step (S7), if a break 113 as shown in FIG. 26 occurs in the IPA liquid film 111 discharged in the discharge direction DD, the IPA liquid film 111 cannot remain in a liquid mass to be discharged out of the substrate W by being split, as shown in FIG. 27. In this case, a number of watermarks may occur on the upper surface of the substrate W after drying.

Watermarks may occur in a portion from which the IPA is last vaporized on the upper surface of the substrate W after drying. It is desirable that watermarks occur in the peripheral portion of the upper surface of the substrate W and, additionally, not in a number of portions but only in one portion if possible. It is therefore necessary, in the organic solvent removing step (S7), to remove the IPA liquid film 111 in a liquid mass and vaporize IPA contained in the IPA liquid film 111 in one portion in the peripheral portion of the substrate W. In the organic solvent removing step (S7), if the IPA liquid film 111 is removed from the substrate W without being kept in a liquid mass, multiple small IPA droplets 114 and multiple dried regions are mixed in the peripheral portion of the upper surface of the substrate W, as shown in FIG. 28. Thereafter, as a result of vaporization of the small IPA droplets 114, a number of watermarks may occur on the upper surface of the substrate W after drying.

If such a form abnormality as shown in FIGS. 26 to 28 is detected in the IPA liquid film 111 removed from over the substrate W (NO in step S35), the controller 3 performs an error processing step (step S36). In the error processing step (S36), the controller 3 stores the occurrence of the form abnormality in the substrate W as a log.

Figure 29:
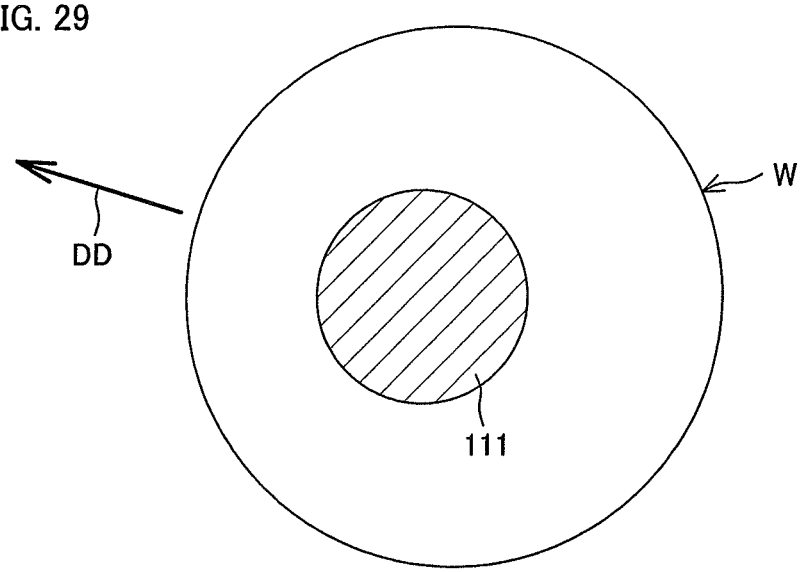
FIG. 29 is a plan view showing a form abnormality according to an aspect occurring in the IPA liquid film in the organic solvent removing step.

The form abnormality of the IPA liquid film 111 detected in step S35 of FIG. 19 is not limited to split of the IPA liquid film 111. For example, in the organic solvent removing step (S7), the controller 3 may also perform an error processing step (S36) for a form abnormality of the IPA liquid film 111 if it is detected that the entire peripheral portion of the upper surface of the substrate W is a dried region and the IPA liquid film 111 is formed in the central portion of the upper surface of the substrate W, as shown in FIG. 29.

When a predefined time has elapsed since the start of the organic solvent removing step (S7) (YES in step S37), the controller 3 performs a droplet residue detecting step (step S38) to determine whether or not IPA droplets remain on the upper surface of the substrate W with the camera 281 of the visual sensor 208.

If no IPA droplets are detected on the upper surface of the substrate W (NO in step S39), the controller 3 controls the extension/contraction driving unit 225 to put the hot plate 206 back to the horizontal attitude (step S40) as well as controls the plate raising/lowering unit 216 to lower the hot plate 206 from the upper position (as shown in FIG. 5) to the lower position (as shown in FIG. 4).

When the hot plate 206 is thus lowered, the substrate W is set away from the hot plate 206 and transferred to the first substrate holding unit 205. The substrate W thus received by the first substrate holding unit 205 is supported by the multiple fixed pins 210. Upon this, since the movable pins 212 are at the open position, the substrate W cannot be held by, for example, the fixed pins 210 or the movable pins 212.

After the hot plate 206 is lowered to the lower position, the space between the hot plate 206 and the substrate W held on the first substrate holding unit 205 is much larger than when the hot plate 206 is at the upper position, heat from the hot plate 206 cannot be transferred sufficiently to the substrate W. This means a termination of the heating of the substrate W by the hot plate 206 (step S41), and the temperature of the substrate W decreases gradually to a room temperature.

On the other hand, in the droplet detection in step S38 of FIG. 19, if it is determined that IPA droplets remain on the upper surface of the substrate W (YES in step S39), the controller 3 waits until the IPA droplets become undetected and then puts the hot plate 206 back to the horizontal attitude as well as lowers the hot plate 206 to the lower position (as shown in FIG. 4). Since the organic solvent removing step (step S7) is terminated after the IPA droplets become undetected, no IPA droplets remain on the upper surface of the substrate W after the organic solvent removing step.

Figure 15H:
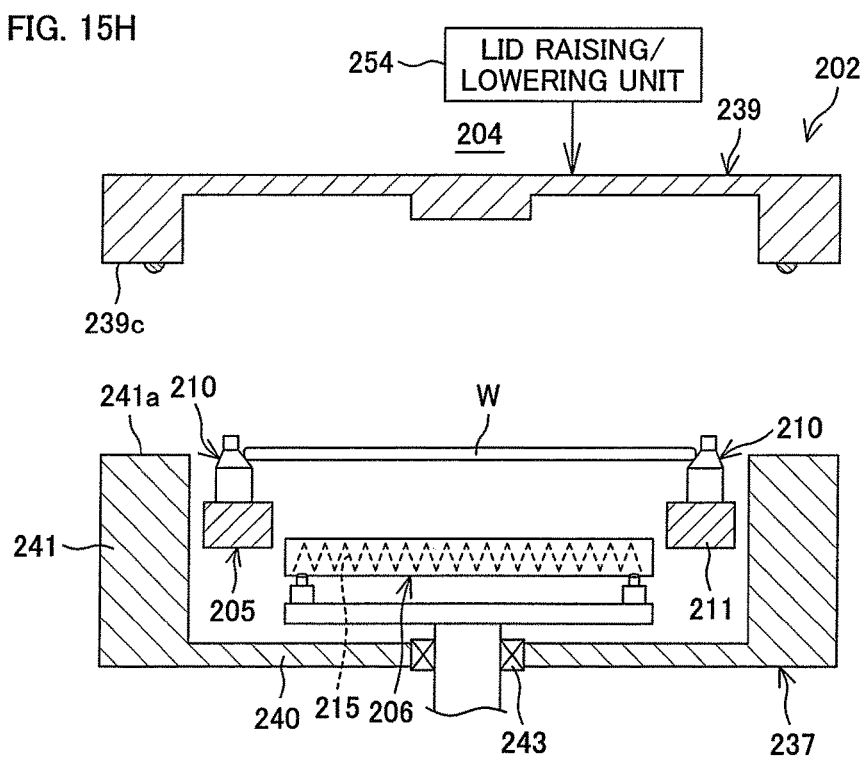
FIG. 15H is a schematic view for illustrating a step following that shown in FIG. 15G.

The controller 3 also drives the locking member (not shown) to release the coupling between the lid member 239 and the chamber main body 237. The controller 3 then controls the lid raising/lowering unit 254 to raise the lid member 239 to the lid opened position, as shown in FIG. 15H. Thereafter, a substrate carry-out step (step S8) is performed to carry the processed substrate W out of the outer chamber 204 with the delivery robot CR (see FIG. 1).

After the substrate carry-out step, the operator can see the log stored in the storage section of the controller 3 on, for example, a display section of the substrate processing apparatus 1. This allows the operator to identify a substrate W at the occurrence of trouble after drying and to identify a region of the upper surface (front surface) of the substrate W at the occurrence of trouble.

As described heretofore, the liquid surface of the IPA liquid film 111 is detected in parallel with the substrate heating step (S6). In the substrate heating step (S6), since the level of the liquid surface of the IPA liquid film 111 becomes high with the raising of the IPA liquid film 111, it is possible to determine whether or not the IPA liquid film 111 is raised by detecting the level of the liquid surface of the IPA liquid film 111. It is thus possible to confirm that the IPA liquid film 111 is raised in the substrate heating step (S6).

Also, the organic solvent removing step (S7) is started in response to the raising of the IPA liquid film 111 over the upper surface of the substrate W. In this case, the total processing time can be reduced compared to the case where the organic solvent removing step (S7) is started after a predetermined time has elapsed since the start of the substrate heating step (S6).

Also, a form abnormality of the IPA liquid film 111 is detected in parallel with the substrate heating step (S6). It is therefore possible to accurately detect a break 113 in the raised IPA liquid film 111. This allows the operator to identify a substrate W at the occurrence of trouble after drying. If a break occurs in the IPA liquid film 111 in the substrate heating step (S6), there may be trouble (i.e. defective) with the substrate W after drying. It is possible to recognize the presence of such trouble.

Further, since it is determined in the organic solvent removing step (S7) whether or not IPA droplets remain, it is possible to reliably prevent IPA droplets from remaining on the upper surface of the substrate W after the organic solvent removing step (S7).

Also, a form abnormality of the IPA liquid film 111 removed from over the substrate W is detected in parallel with the organic solvent removing step (S7). It is therefore possible to determine whether or not the IPA liquid film 111 is removed from the substrate W while maintaining its normal form (without being split, for example). If the liquid film of organic solvent is discharged out of the substrate W in a split manner, there may be trouble with the substrate W after drying. It is possible to recognize the presence of such trouble.

It is noted that although the example of processing shown in FIG. 14 has been described based on the arrangement that the final rinsing step (S4) is performed with the interior space between the chamber main body 237 and the lid member 239 being sealed, the final rinsing step (S4) may be performed with the interior space between the chamber main body 237 and the lid member 239 being opened (the lid member 239 being at the lid opened position). The rinse liquid may be supplied onto the upper surface of the substrate W through the rinse liquid discharge port 247 of the rinse liquid upper pipe 244 or through the rinse liquid nozzle 227 disposed in a manner opposed to upper surface of the substrate W. In this case, the interior space between the chamber main body 237 and the lid member 239 is to be sealed after the final rinsing step (S4).

Although the example of processing shown in FIG. 14 exemplified the case where the chemical solution supplying step (S2) is performed one time, the chemical solution supplying step may be repeated multiple times (two times or more).

Although the example of processing shown in FIG. 14 has been described with the example in which the chemical solution supplying step (S2) and the rinsing step (S3) are performed only on the upper surface of the substrate W, the steps (S2, S3) may be performed on both the upper and lower surfaces.

Further, the rinsing step (S3) may be omitted in the example of processing shown in FIG. 14.

Although the first preferred embodiment of the present invention has heretofore been described, the present invention may be embodied as follows.

Figure 30:
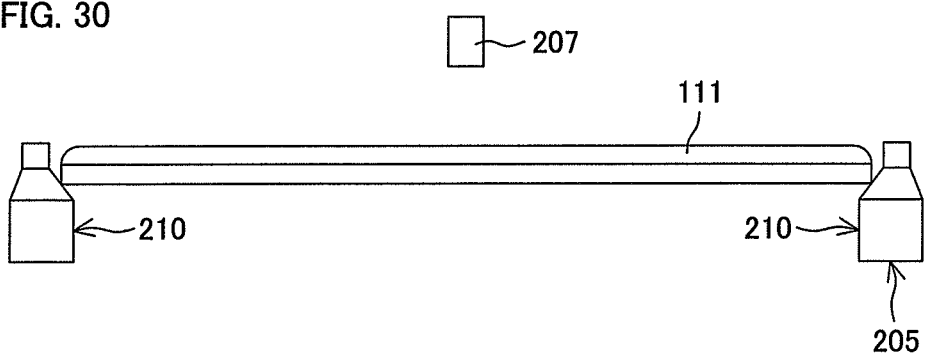
FIG. 30 shows a liquid surface sensor according to a first exemplary variation of the first preferred embodiment.
Figure 31:
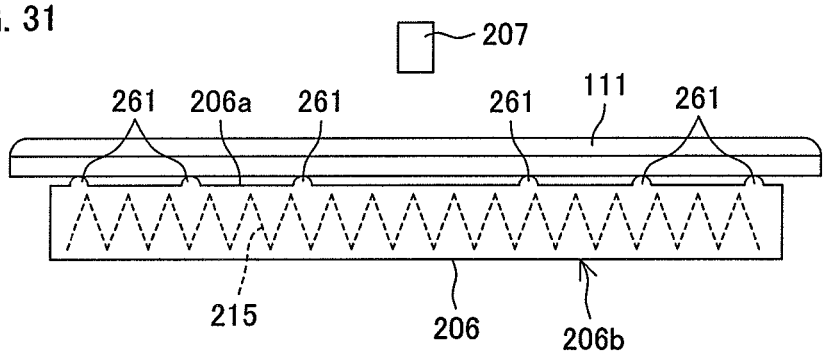
FIG. 31 shows a liquid surface sensor according to a second exemplary variation of the first preferred embodiment.

For example, the liquid surface sensor 207 may employ a displacement sensor arranged to detect the distance to the liquid surface of the IPA liquid film 111 on the substrate W, as shown in FIGS. 30 and 31. In this case, the liquid surface sensor 207 may be an optical sensor arranged to detect the IPA liquid optically using, for example, a laser beam or an ultrasonic sensor arranged to detect the IPA liquid ultrasonically or a displacement sensor of another type.

In the organic solvent removing step (S7) in the example of processing shown in FIG. 14, both the substrate W and the hot plate 206 undergo an attitude change to the tilted attitude to move the IPA liquid film 111 laterally from the substrate W. Instead of the configuration and the method, a guiding member (guiding pin or guiding ring) having a guiding surface may be provided in a manner opposed to the peripheral portion of the substrate and, in the organic solvent removing step (S7), the guiding member may be moved toward the substrate W to bring the guiding surface of the guiding member into contact with the raised IPA liquid film 111.

Since the frictional force generated between the upper surface of the substrate W and the IPA liquid film 111 is of approximately zero, the raised IPA liquid film 111 is guided on the guiding surface laterally from the substrate W while remaining in a liquid mass (without being split into a number of small droplets) through contact between the guiding surface of the guiding member and the IPA liquid film 111. This allows the IPA liquid film 111 to be removed completely from over the substrate W. In the case of employing the configuration and the method of this kind, it is possible in the organic solvent removing step (S7) to keep both the substrate W and the hot plate 206 in the horizontal attitude.

In the case above, the second form abnormality detecting step (step S34 in FIG. 19) is performed in parallel with the organic solvent removing step (S7).

Also, instead of the configuration and the method in which both the substrate W and the hot plate 206 undergo an attitude change to the tilted attitude in the organic solvent removing step (S7), the nitrogen gas valve 252 may be opened and nitrogen gas may be discharged through the nitrogen gas discharge port 251 and blown to the central portion of the upper surface of the substrate W. This causes a circular dried region with a small diameter to be formed in the central portion of the raised IPA liquid film 111. Since the frictional force generated between the upper surface of the substrate W and the IPA liquid film 111 is of approximately zero, the dried region expands with the discharge of nitrogen gas through the nitrogen gas discharge port 251 across the upper surface of the substrate W. This causes the raised IPA liquid film 111 to be guided laterally from the substrate W while remaining in a liquid mass (without being split into a number of small droplets). As a result, the IPA liquid film 111 can be removed completely from over the substrate W.

Also in the case above, the second form abnormality detecting step (step S34 in FIG. 19) is performed in parallel with the organic solvent removing step (S7).

Also, in the case above, the occurrence of a dried region formed in the central portion of the IPA liquid film 111 may be detected through in-plane condition detection using the visual sensor 208.

Further, in the organic solvent removing step (S7), nitrogen gas may be blown to the central portion of the upper surface of the substrate W while the guiding member is moved toward the IPA liquid film 111 on the substrate W or the hot plate 206 and the substrate W are tilted. In this case, the occurrence of a dried region formed in the central portion of the IPA liquid film 111 may be detected through in-plane condition detection using the visual sensor 208. Further, the movement of the guiding member or the tilt of the hot plate 206 (substrate W) may be started according to the detection of the occurrence of a dried region.

Although the preferred embodiment above has been described based on the arrangement that the liquid surface level detecting steps (step S23 in FIG. 17 and step S28 in FIG. 18) are performed in parallel with the organic solvent replacing step (S5) and the substrate heating step (S6), the liquid surface level detecting steps may be performed in parallel only with the substrate heating step (S6).

Also, the liquid surface level detecting steps (step S23 in FIG. 17 and step S28 in FIG. 18), which have been described to be performed in parallel with the organic solvent replacing step (S5) and the substrate heating step (S6), may be performed in parallel further with the organic solvent removing step (S7).

Also, the IPA in-plane condition detection using the visual sensor 208 (step S29 in FIG. 18 and step S34 in FIG. 19), which has been described to be performed in parallel with the substrate heating step (S6) and the organic solvent removing step (S7), may be performed in parallel with the organic solvent replacing step (S5) in addition to the substrate heating step (S6) and the organic solvent removing step (S7). In this case, the visual sensor 208 may be used to determine whether or not the IPA liquid film covers the entire upper surface of the substrate W (the coverage of the entire upper surface of the substrate W is completed).

Although the visual sensor 208 including the camera 281 is employed as an in-plane condition detecting unit, multiple displacement sensors disposed over the substrate W along the upper surface of the substrate, for example, may be used instead of or together with the visual sensor 208 including the camera 281. In this case, the displacement sensors may be used to detect the in-plane condition of IPA on the upper surface of the substrate W by detecting the level of the liquid surface of IPA in portions opposed to the respective displacement sensors.

Also, when a break 113 occurring in the IPA liquid film 111 is detected in the substrate heating step (S6), the heating of the substrate W may be stopped or the temperature of the hot plate 206 may be reduced.

Further, if the raising of the IPA liquid film 111 cannot be detected (NO in step S32 of FIG. 18) even when a predefined time has elapsed since the start of the substrate heating step (S6), the controller 3 may perform error processing of poor heating (unsuccessful raising). Also, in this case, the controller 3 may increase the temperature at which the hot plate 206 produces heat.

Also, the substrate processing apparatus 1, which has been described for the case where the liquid surface sensor 207 and the visual sensor 208 are used to detect both the level of the liquid surface and the in-plane condition of IPA, may be arranged to detect only one of the level of the liquid surface and the in-plane condition of IPA.

Although the preferred embodiment above has been described with the example in which the hot plate 206 is raised/lowered to transfer the substrate W between the hot plate 206 and the first substrate holding unit 205, the first substrate holding unit 205 may be raised/lowered to transfer the substrate W. Alternatively, both the hot plate 206 and the first substrate holding unit 205 may be raised/lowered to transfer the substrate W between the first substrate holding unit 205 and the hot plate 206.

Although the preferred embodiment above has been described based on the arrangement that the substrate W is heated by being placed on the hot plate 206 in the substrate heating step (S6), the hot plate 206 may be located near the lower surface of the substrate W held on the first substrate holding unit 205 to heat the substrate W in the substrate heating step (S6). In this case, the amount of heat provided to the substrate W can be adjusted by changing the space between the hot plate 206 and the substrate W.

Although in the description above, IPA is exemplified as organic solvent having a surface tension lower than that of water, methanol, ethanol, acetone, and HFE (hydrofluoroether), for example, may also be employed other than IPA.

Further, the substrate W may be processed using not only one type but multiple (two or more) types of chemical solution.

Although in the preferred embodiment above, the chemical solution processing (etching processing, washing processing, etc.) is performed under the atmospheric pressure, the pressure of the processing atmosphere is not limited thereto. For example, the atmosphere in the sealed space defined by the lid member 239 and the chamber main body 237 may be pressurized or depressurized using a predetermined pressure adjusting unit so as to be adjusted to a high-pressure atmosphere higher than the atmospheric pressure or a low-pressure atmosphere lower than the atmospheric pressure for etching processing, washing processing, etc., in each preferred embodiment.

Second Preferred Embodiment

Figure 32:
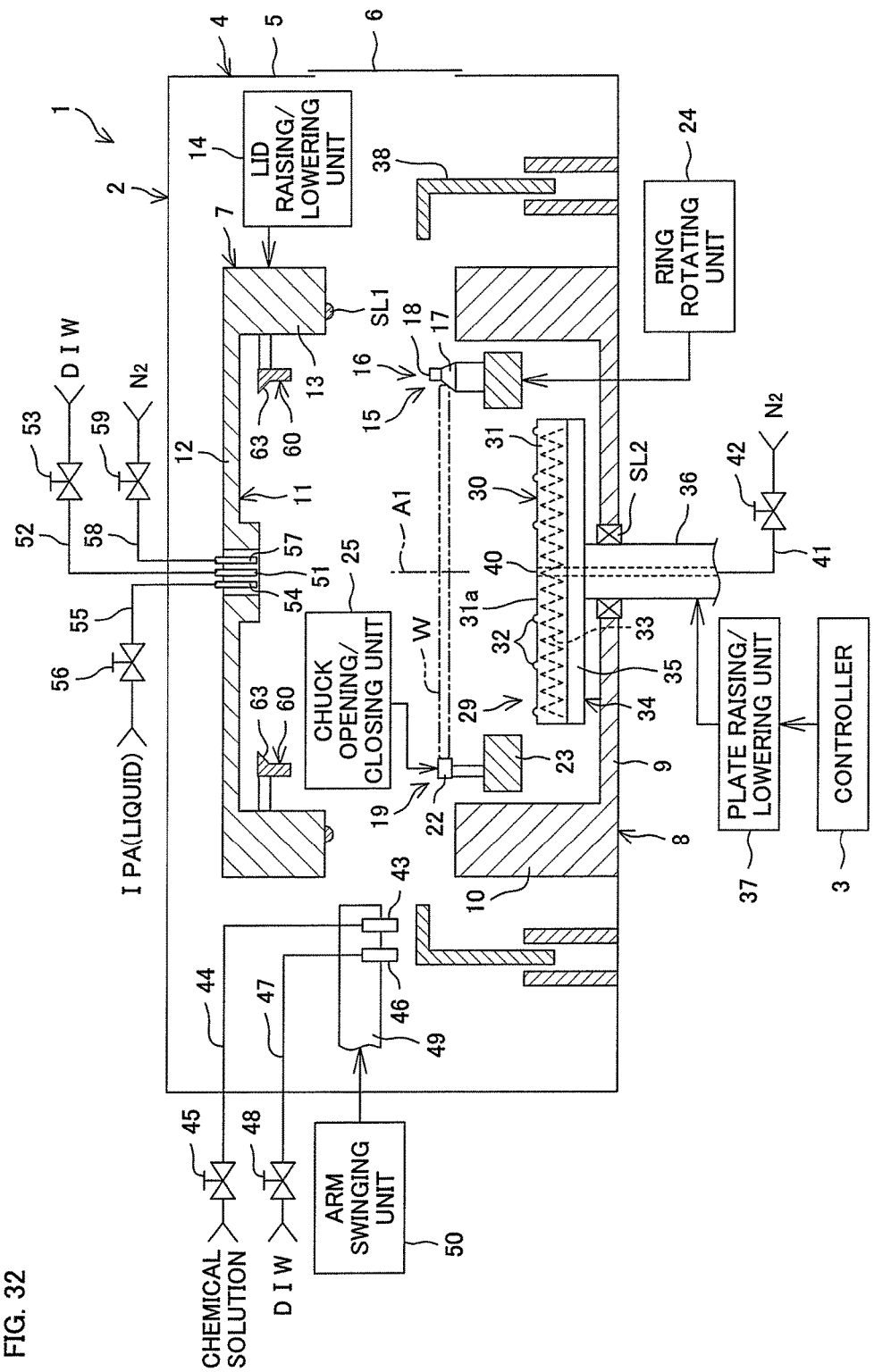
FIG. 32 is a schematic vertical cross-sectional view of a processing unit according to a second preferred embodiment of the present invention.

Next will be described a second preferred embodiment of the present invention. In FIG. 32 and the following figures, components equivalent to those shown in FIGS. 1 to 31 are designated by the same reference symbols as in, for example, FIG. 1 and description thereof shall be omitted.

As shown in FIG. 32, the processing unit 2 includes a first substrate holding unit 15 arranged to rotate a substrates W about a vertical axis of rotation A1 passing through the center of the substrate W while keeping the substrate W in a horizontal attitude and a second substrate holding unit 29 arranged to heat the substrate W while keeping the substrate W in a horizontal attitude. The first substrate holding unit 15 and the second substrate holding unit 29 are examples of the substrate holding unit.

As shown in FIG. 32, the processing unit 2 further includes an openable/closable inner chamber 7 to house the first substrate holding unit 15 and the second substrate holding unit 29 therein, a cylindrical cup 38 surrounding the inner chamber 7 about the rotational axis A1, and an outer chamber 4 to house the inner chamber 7 and the cup 38 therein.

As shown in FIG. 32, the outer chamber 4 includes a box-shaped chamber main body 5 to house, for example, the first substrate holding unit 15 and the second substrate holding unit therein and a shutter 6 arranged to open/close a carry-in/carry-out port provided on the chamber main body 5. The outer chamber 4 further includes a shutter opening/closing unit arranged to move the shutter 6 between an opened position at which the carry-in/carry-out port is opened and a closed position at which the carry-in/carry-out port is closed, though not shown.

As shown in FIG. 32, the inner chamber 7 includes a bottomed cylindrical chamber main body 8 to house the first substrate holding unit 15 and the second substrate holding unit therein, a top lid 11 arranged to open/close an opening provided at the upper end of the chamber main body 8, and a lid raising/lowering unit 14 arranged to vertically raise/lower the top lid 11 within the outer chamber 4 between an upper position at which the opening of the chamber main body 8 is opened and a closed position at which the opening of the chamber main body 8 is closed with the top lid 11.

As shown in FIG. 32, the chamber main body 8 includes a disk-shaped bottom wall portion 9 disposed along the floor of the outer chamber 4 and a cylindrical lower peripheral wall portion 10 extending upward from an outer peripheral portion of the bottom wall portion 9. The top lid 11 includes a disk-shaped top wall portion 12 held in a horizontal attitude over the chamber main body 8 and a cylindrical upper peripheral wall portion 13 extending downward from an outer peripheral portion of the top wall portion 12. The top wall portion 12 of the top lid 11 is disposed over the first substrate holding unit 15 and the second substrate holding unit 29. The lower peripheral wall portion 10 of the chamber main body 8 surrounds the first substrate holding unit 15 and the second substrate holding unit 29. The upper peripheral wall portion 13 of the top lid 11 is disposed over the lower peripheral wall portion 10 of the chamber main body 8. The chamber main body 8 is connected to a waste liquid pipe (not shown) arranged to guide liquid discharged from inside the chamber main body 8.

Figure 35:
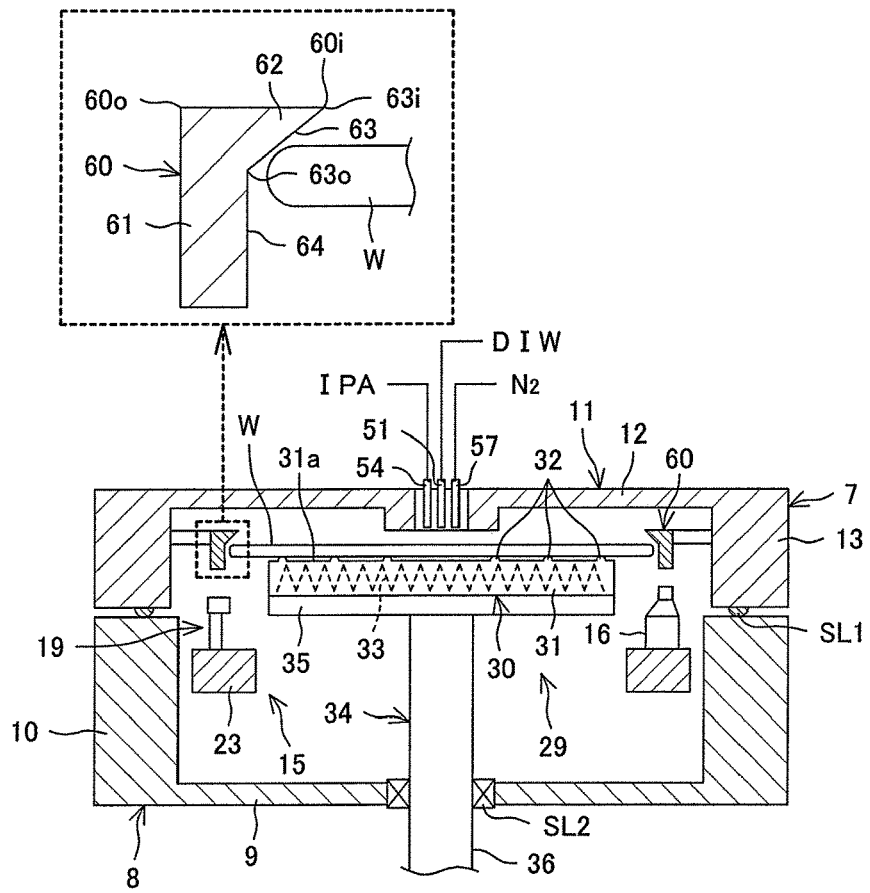
FIG. 35 is a partial schematic view of the processing unit, showing a cross-section of a guiding member.

As shown in FIGS. 32 and 35, the lid raising/lowering unit 14 is arranged to vertically raise/lower the top lid 11 between an upper position (as shown in FIG. 32) and a lower position (as shown in FIG. 35). The lower position is a sealed position at which the opening of the chamber main body 8 is closed. The upper position is a retracted position at which the top lid 11 is retracted upward from the chamber main body 8. When the lid raising/lowering unit 14 moves the top lid 11 to the lower position, the annular lower surface of the upper peripheral wall portion 13 comes close to the annular upper surface of the lower peripheral wall portion 10, and the gap between the upper peripheral wall portion 13 and the lower peripheral wall portion 10 is sealed with an annular sealing member SL1 held on the upper peripheral wall portion 13. This results in a higher degree of sealing of the interior of the inner chamber 7. On the other hand, when the lid raising/lowering unit 14 moves the top lid 11 to the upper position, the annular lower surface of the upper peripheral wall portion 13 gets away upward from the annular upper surface of the lower peripheral wall portion 10, and the gap between the lower surface of the upper peripheral wall portion 13 and the upper surface of the lower peripheral wall portion 10 is expanded such that a scan nozzle can get between the upper peripheral wall portion 13 and the lower peripheral wall portion 10.

As shown in FIG. 32, the first substrate holding unit 15 includes multiple (six, for example) fixed pins 16 arranged to support the substrate W in a horizontal attitude and multiple (three, for example) movable pins 19 arranged to grip the substrate in the horizontal attitude in cooperation with the multiple fixed pins 16. The first substrate holding unit 15 further includes a support ring 23 holding the multiple fixed pins 16 and the multiple movable pins 19 thereon, a chuck opening/closing unit 25 arranged to move the multiple movable pins 19 with respect to the support ring 23, and a ring rotating unit 24 arranged to rotate the support ring 23 about the rotational axis A1. The ring rotating unit 24 includes a rotor rotatable about the rotational axis A1 together with the support ring 23 and a stator held on the chamber main body 8 of the inner chamber 7, though not shown.

Figure 33:
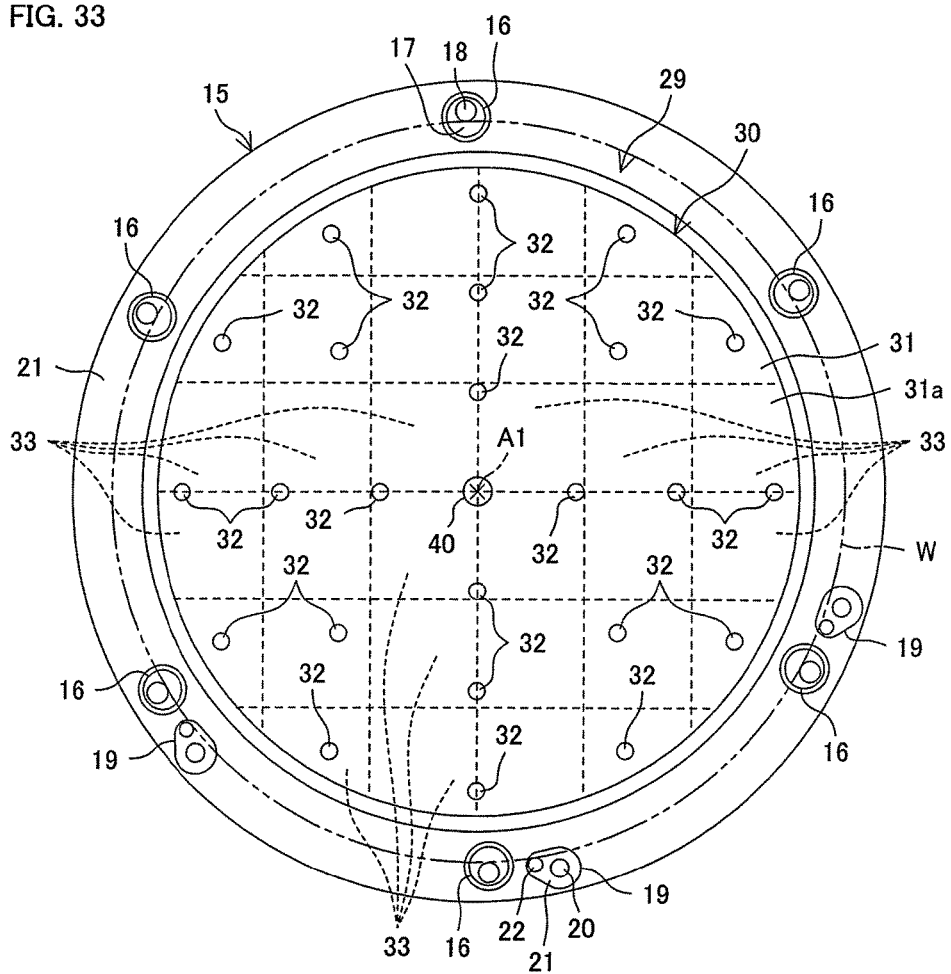
FIG. 33 is a plan view of a first substrate holding unit and a second substrate holding unit.

As shown in FIG. 32, the fixed pins 16 and the movable pins 19 protrude upward from the support ring 23. The fixed pins 16 and the movable pins 19 are held on the support ring 23. As shown in FIG. 33, the six fixed pins 16 are arranged in an equally spaced manner in the circumferential direction. The three movable pins 19 are disposed, respectively, in the vicinity of circumferentially adjacent three of the fixed pins 16. The central angle of the arc covering the three movable pins 19 is smaller than 180 degrees in a plan view, and the three movable pins 19 are thus disposed unevenly in the circumferential direction. The fixed pins 16 are not movable with respect to the support ring 23, while the movable pins 19 are movable with respect to the support ring 23. The support ring 23 has an outer diameter greater than that of the substrate W. The support ring 23 is held within the chamber main body 8 of the inner chamber 7.

Figure 37:
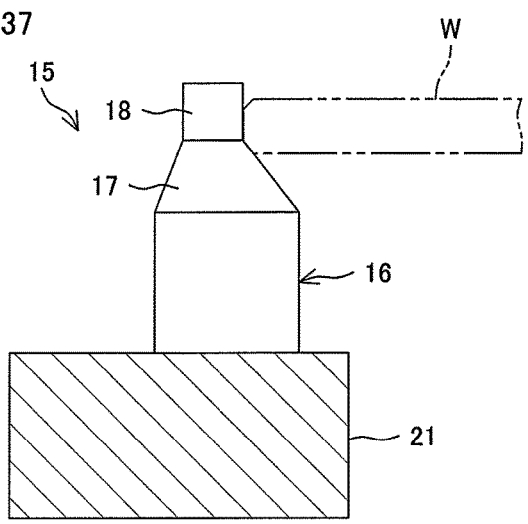
FIG. 37 is a schematic view of a fixed pin when viewed horizontally.

As shown in FIG. 37, each of the fixed pins 16 includes a fixed support portion 17 arranged to come into contact with the peripheral portion of the lower surface of the substrate W to support the substrate W in the horizontal attitude and a fixed gripping portion 18 arranged to be pressed against the peripheral portion of the substrate W supported by the fixed support portion 17. The fixed support portion 17 includes a support surface extending obliquely downward and inward. The multiple fixed pins 16 are each arranged to hold the substrate W in the horizontal attitude through contact between the fixed support portion 17 and the peripheral portion of the lower surface of the substrate W. The positions at which the substrate W is supported by the multiple fixed pins 16 are at a higher position than that of the upper end of the lower peripheral wall portion 10 of the inner chamber 7.

Figure 34:
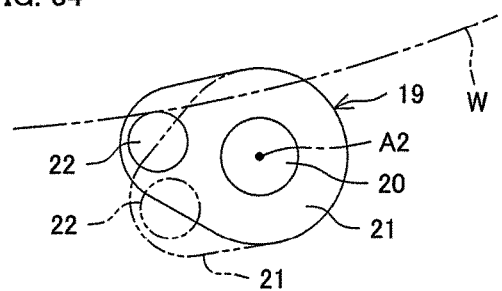
FIG. 34 is a plan view of a movable pin.

As shown in FIG. 34, each of the movable pins 19 includes a vertically extending shaft portion 20, a base portion 21 supported by the shaft portion 20, and a columnar movable gripping portion 22 protruding upward from the base portion 21. The movable pin 19 is movable with respect to the support ring 23 about a vertical rotational axis A2 (centerline of the shaft portion 20) between a closed position at which the movable gripping portion 22 is pressed against the peripheral portion of the substrate W (as indicated by the solid line) and an open position at which the movable gripping portion 22 is set away from the substrate W (as indicated by the alternate long and two short dashed line). The multiple movable pins 19 are arranged to grip the substrate W in cooperation with the fixed gripping portions 18 of the multiple fixed pins 16. The positions at which the substrate W is gripped by the fixed pins 16 and the movable pins 19 are the same as the positions at which the substrate W is supported by the multiple fixed pins 16.

Figure 39A:
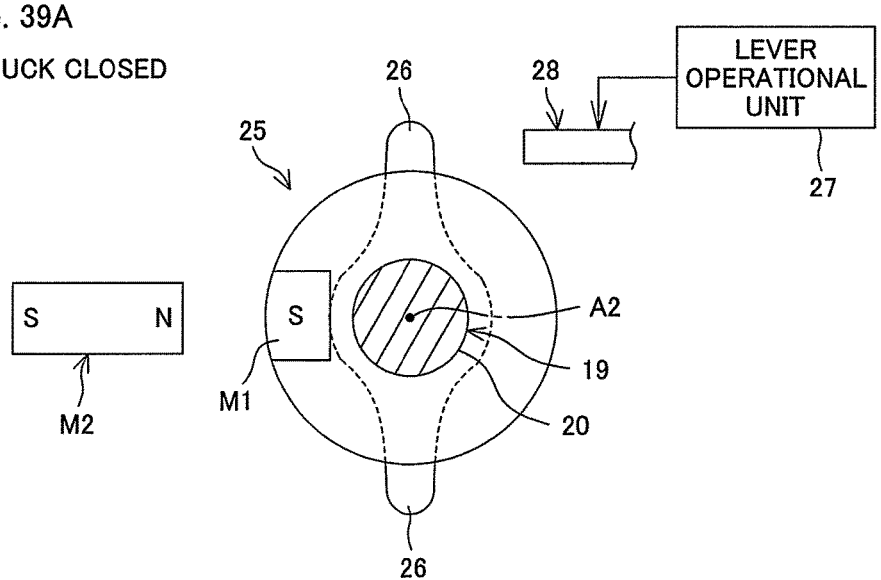
FIG. 39A is a cross-sectional view taken along the line IX-IX in FIG. 38, showing a state where the movable pin is at a closed position.
Figure 39B:
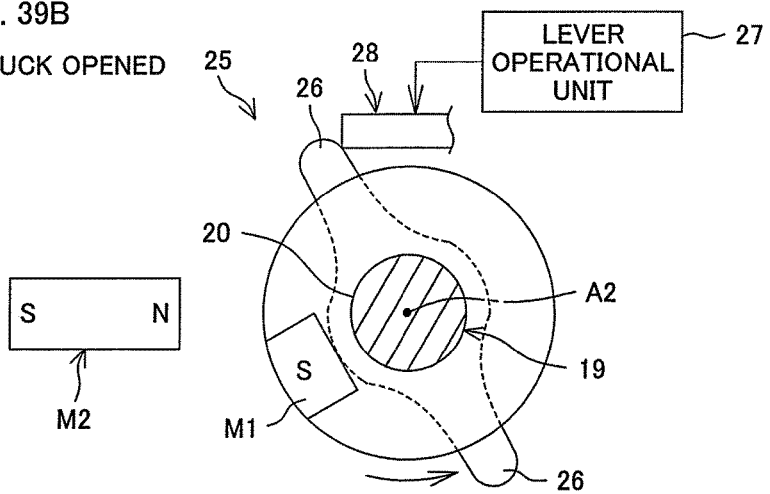
FIG. 39B is a cross-sectional view taken along the line IX-IX in FIG. 38, showing a state where the movable pin is at an open position.

The chuck opening/closing unit 25 is a constantly-closing unit arranged to move the movable pin 19 from the closed position only when it is necessary. As shown in FIGS. 39A and 39B, the chuck opening/closing unit 25 includes a movable magnet M1 rotatable about the rotational axis A2 together with the movable pin 19 and a fixed magnet M2 arranged to provide a magnetic force for moving the movable pin 19 to the closed position to the movable magnet M1. Both the movable magnet M1 and the fixed magnet M2 are permanent magnets. The movable magnet M1 and the fixed magnet M2 correspond to a closing unit arranged to move the movable pin 19 to the closed position.

The movable magnet M1 is held on the movable pin 19 and movable with respect to the support ring 23. The fixed magnet M2 is fixed to the support ring 23 and not movable with respect to the support ring 23. The movable pin 19 is urged toward the closed position by a repulsive force or an attractive force acting between the movable magnet M1 and the fixed magnet M2. Hence, when no force acts on the movable pin excluding the magnetic force acting between the movable magnet M1 and the fixed magnet M2, the movable pin 19 is located at the closed position.

As shown in FIGS. 39A and 39B, the chuck opening/closing unit 25 includes two to-be-operated pieces 26 rotatable about the rotational axis A2 together with the movable pin 19, a lever operational unit 27 arranged to generate power for moving the movable pin 19 to the open position, and an operating lever 28 arranged to transmit power from the lever operational unit 27 to one of the two to-be-operated pieces 26. The to-be-operated pieces 26, the lever operational unit 27, and the operating lever 28 correspond to an opening unit arranged to move the movable pin 19 to the open position.

As shown in FIGS. 39A and 39B, the two to-be-operated pieces 26 are disposed in a manner spaced by 180 degrees, that is, symmetrically with respect to the rotational axis A2 to correct weight imbalance. The lever operational unit 27 is an air cylinder including, for example, a cylinder main body held on the hot plate 30 and a rod movable with respect to the cylinder main body, though not shown. The operating lever 28 is fixed to the rod. The lever operational unit 27 and the operating lever 28 are arranged to be raised/lowered vertically together with the hot plate 30.

Figure 38:
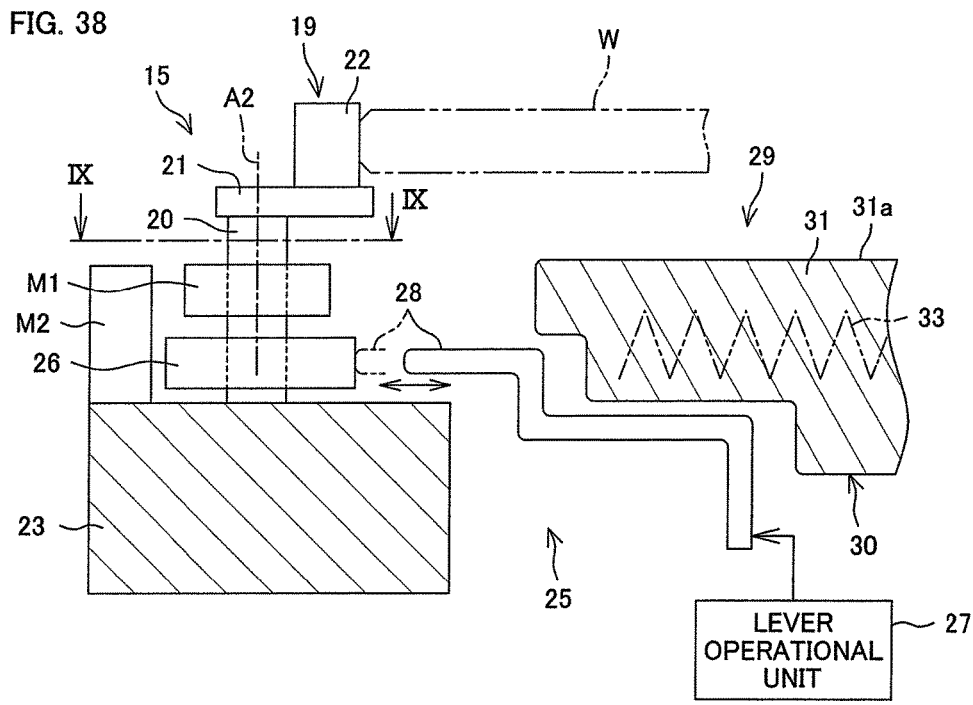
FIG. 38 is a schematic view of a movable pin and a chuck opening/closing unit when viewed horizontally.

As shown in FIG. 38, the leading end portion of the operating lever 28 extends outward from the hot plate 30 (away from the rotational axis A1). The leading end portion of the operating lever 28 is arranged to, by being opposed horizontally to one of the to-be-operated pieces 26, press and rotate the to-be-operated piece 26 to move the movable pin 19 from the closed position to the open position. As will be described hereinafter, the hot plate 30 moves vertically from a first substrate transferring step (step S7) to a second substrate transferring step (step S10) and, accordingly, the leading end portion of the operating lever 28 also moves vertically. The leading end portion of the operating lever 28 and the to-be-operated pieces 26 each have a sufficient vertical thickness such that the leading end portion of the operating lever 28 is constantly contactable with the to-be-operated pieces 26 even when the leading end portion of the operating lever 28 may thus move vertically.

In order to move the movable pin 19 to the open position, the controller 3 controls the rotational angle of the support ring 23 and the height of the hot plate 30 such that the leading end portion of the operating lever 28 is opposed horizontally to one of the to-be-operated pieces 26, as shown in FIG. 39B. When the operating lever 28 moves outward with the leading end portion of the operating lever 28 being opposed horizontally to one of the to-be-operated pieces 26, the to-be-operated piece 26 is pressed by the operating lever 28 and the movable pin 19 moves toward the open position, as shown in FIG. 39B. The movable pin 19 thus moves from the closed position to the open position.

The delivery robot CR is arranged to place the substrate W supported by the hand H (see FIG. 1) onto the fixed support portions 17 of the multiple fixed pins 16 and scoop the substrate W supported by the fixed support portions 17 of the multiple fixed pins 16 with the hand H. When the movable pin 19 is moved from the open position to the closed position with the substrate W being supported by the multiple fixed pins 16, the movable gripping portion 22 of the movable pin 19 is pressed against the peripheral portion of the substrate W, so that the substrate W moves horizontally away from the movable pin 19. This causes the peripheral portion of the substrate W to be pressed against the fixed gripping portion 18 of the fixed pin 16 at the position opposite to that of the movable pin 19 and thus the substrate W to be gripped by the fixed pin 16 and the movable pin 19. As a result, the substrate W is maintained solidly in the horizontal attitude.

As shown in FIG. 32, the second substrate holding unit 29 includes the hot plate 30 serving as a support plate arranged to support the substrate W in the horizontal attitude, a support table 34 supporting the hot plate 30, and a plate raising/lowering unit 37 arranged to vertically move the support table 34 to vertically raise/lower the hot plate 30.

As shown in FIG. 32, the hot plate 30 includes a plate main body 31 having a horizontal and flat circular upper surface 31a, multiple support pins 32 arranged to support the substrate W over the plate main body 31 with the lower surface of the substrate W being proximal to the upper surface 31a of the plate main body 31, and multiple heaters 33 arranged to heat the underside of the substrate W held on the multiple support pins 32 at a temperature higher than the room temperature (20 to 30° C., for example). The multiple heaters 33 are an example of the substrate heating unit.

As shown in FIG. 33, the plate main body 31 has an outer diameter smaller (by 6 mm, for example) than that of the substrate W. The plate main body 31 can vertically pass through the space inside the support ring 23. The support pins 32 each include a semi-spherical protruding portion protruding upward from the upper surface 31a of the plate main body 31. The multiple support pins 32 are arranged to support the substrate W over the plate main body 31 with the lower surface of the substrate W and the upper surface 31a of the plate main body 31 being in parallel or approximately in parallel with each other through point contact between the protruding portions and the lower surface of the substrate W.

The support pins 32 may be integrated with or separated from the plate main body 31. Also, the support pins 32 may have the same height or have their respective different heights. In the event of bending of the substrate W, the way of the bending (whether the central portion becomes convex upward or downward) may be predictable to some extent based on the processing that the substrate W had already undergone. Accordingly, the height of each support pin 32 may be adjusted in advance according to the bending of the substrate W such that the substrate W is supported evenly on the multiple support pins 32.

As shown in FIG. 33, the multiple heaters 33 are disposed inside the plate main body 31. The multiple heaters 33 are arranged to heat the entire upper surface 31a of the plate main body 31. The multiple heaters 33 are arranged to heat multiple regions of the upper surface of the substrate W at an independent temperature for each region. Hence, the controller 3 can control the multiple heaters 33 to heat the entire upper surface 31a of the plate main body 31 at the same temperature or generate a temperature difference in the upper surface 31a of the plate main body 31. The heaters 33 include a central heater arranged to heat a central portion of the upper surface 31a of the plate main body 31, an intermediate heater arranged to heat an annular intermediate portion of the upper surface surrounding the central portion of the upper surface 31a of the plate main body 31, and a peripheral heater arranged to heat an annular peripheral portion of the upper surface surrounding the intermediate portion of the upper surface 31a of the plate main body 31.

As shown in FIG. 32, the multiple support pins 32 are arranged to support the substrate W over the plate main body 31 such that the lower surface of the substrate W is opposed to the upper surface 31a of the plate main body 31 with a space of, for example, about 0.1 mm therebetween. Heat from the heaters 33 is transferred to the upper surface 31a of the plate main body 31. Heat from the heaters 33 is transferred to the substrate W through the space between the substrate W and the plate main body 31. Heat from the heaters 33 is also transferred to the substrate W through the support pins 32 in point contact with the lower surface of the substrate W. Since the substrate W and the plate main body 31 are proximal to each other, it is possible to prevent the efficiency of heating the substrate W from decreasing. Further, since the contact area between the substrate W and the support pins 32 is small, it is possible to prevent the uniformity of the temperature of the substrate W from decreasing.

If the lower surface of the substrate W were in plane contact with the upper surface 31a of the plate main body 31, the substrate W might be adsorbed to the plate main body 31 due to a negative pressure occurring therebetween when the lower surface of the substrate W moves vertically away from the upper surface 31a of the plate main body 31. In this preferred embodiment, the substrate W is supported by the multiple support pins 32 with the lower surface of the substrate W being set away from the upper surface 31a of the plate main body 31. It is therefore possible to suppress or prevent such a phenomenon from occurring. Furthermore, since the lower surface of the substrate W is set away from the upper surface 31a of the plate main body 31, it is possible to suppress or prevent foreign matter on the upper surface 31a of the plate main body 31 from adhering to the substrate W.

As shown in FIG. 32, the support table 34 includes a disk-shaped table portion 35 supporting the hot plate 30 and a shaft portion 36 extending downward from a central portion of the table portion 35 along the rotational axis A1. The shaft portion 36 extends from inside to outside the inner chamber 7 through the bottom wall portion 9 of the inner chamber 7. The gap between the shaft portion 36 of the support table 34 and the bottom wall portion 9 of the inner chamber 7 is sealed with an annular sealing member SL2. The plate raising/lowering unit 37 is connected to the shaft portion 36.

The substrate W, when carried into the processing unit 2, is first held on the multiple fixed pins 16 of the first substrate holding unit 15. During this time, the hot plate 30 is retracted to a position lower than that of the first substrate holding unit 15. Thereafter, the hot plate 30 is raised. In the course of the hot plate 30 thus being raised, the substrate W is transferred from the first substrate holding unit 15 to the hot plate 30. When the hot plate 30 is further raised, the substrate W moves to a position higher than the position at which the substrate W is supported by the multiple fixed pins 16. When the hot plate 30 is lowered in this state, the substrate W is transferred from the hot plate 30 to the multiple fixed pins 16. The substrate W is thus transferred between the multiple fixed pins 16 and the hot plate 30 as the hot plate 30 is raised/lowered.

As shown in FIGS. 32 and 35, the plate raising/lowering unit 37 is arranged to move the support table 34 to vertically raise/lower the hot plate 30 between an upper position (as shown in FIG. 35) and a lower position (as shown in FIG. 32). At the upper position, the position at which the substrate W is supported by the multiple fixed pins 16 is over the position at which the substrate W is supported by the hot plate 30. At the lower position, the position at which the substrate W is supported by the multiple fixed pins 16 is lower than the position at which the substrate W is supported by the hot plate 30. At the lower position, the hot plate 30 is retracted downward from the position at which the substrate W is supported by the multiple fixed pins 16. The plate raising/lowering unit 37 can position the hot plate 30 at any height between the upper position and the lower position.

As shown in FIGS. 32 and 35, when the plate raising/lowering unit 37 raises the hot plate 30 to a position higher than the lower surface of the substrate W with the substrate W being supported by the multiple fixed pins 16 of the first substrate holding unit 15 (the gripping of the substrate W being released), the substrate W is transferred from the multiple fixed pins 16 to the hot plate 30. On the contrary, when the plate raising/lowering unit 37 lowers the hot plate 30 to a position lower than the multiple fixed pins 16 with the substrate W being supported by the hot plate 30, the substrate W is transferred from the hot plate 30 to the multiple fixed pins 16.

As shown in FIG. 32, the processing unit 2 includes a lower gas pipe 41 arranged to supply gas therethrough to an upward discharge port 40 opened in a central portion of the upper surface of the hot plate 30, a lower gas valve 42 installed in the lower gas pipe 41, and an inline heater arranged to heat gas to be supplied through the lower gas pipe 41 to the upward discharge port 40. The gas to be supplied to the upward discharge port 40 is nitrogen gas. The gas to be supplied to the upward discharge port 40 is not limited to nitrogen gas, but may be inert gas other than nitrogen gas, such as argon gas, or alternatively dried air or cleaned air. The temperature of the gas to be supplied to the upward discharge port 40 may be equal to or higher than the room temperature.

As shown in FIG. 32, the processing unit 2 includes a scan nozzle arranged to discharge processing liquid or processing gas downward therethrough, a nozzle arm 49 with the scan nozzle attached to the leading end portion thereof, and an arm swinging unit 50 arranged to move the nozzle arm 49. FIG. 32 shows an example in which the processing unit 2 includes two scan nozzles (chemical solution nozzle 43 and rinse liquid nozzle 46). The chemical solution nozzle 43 is connected to a chemical solution pipe 44 with a chemical solution valve 45 installed therein. The rinse liquid nozzle 46 is connected to a rinse liquid pipe 47 with a rinse liquid valve 48 installed therein.

An example of chemical solution to be discharged through the chemical solution nozzle 43 is liquid containing at least one of sulfuric acid, acetic acid, nitric acid, hydrochloric acid, hydrofluoric acid, ammonia water, oxygenated water, organic acid (such as citric acid, oxalic acid), organic alkali (such as TMAH (tetramethylammonium hydroxide)), surface-active agent, and corrosion inhibitor.

The rinse liquid to be discharged through the rinse liquid nozzle 46 is pure water (deionized water). The rinse liquid to be discharged through the rinse liquid nozzle 46 is not limited to pure water, but may be any one of carbonated water, electrolyzed ionic water, hydrogen water, ozone water, and hydrochloric acid water with a dilute concentration (of about 10 to 100 ppm, for example).

The arm swinging unit 50 is arranged to move the leading end portion of the nozzle arm 49 between the inside and outside of the inner chamber 7 through the space between the chamber main body 8 of the inner chamber 7 and the top lid 11 of the inner chamber 7. This causes the scan nozzle to move horizontally between a processing position at which the processing liquid discharged through the scan nozzle lands on the upper surface of the substrate W and a retracted position at which the scan nozzle is retracted to around the substrate W. The processing position includes a central position at which the processing liquid lands on a central portion of the upper surface of the substrate W and a peripheral position at which the processing liquid lands on a peripheral portion of the upper surface of the substrate W.

As shown in FIG. 32, the processing unit 2 includes a fixed nozzle arranged to discharge processing liquid or processing gas downward therethrough. FIG. 32 shows an example in which the processing unit 2 includes three fixed nozzles (upper rinse liquid nozzle 51, upper solvent nozzle 54, and upper gas nozzle 57). The upper rinse liquid nozzle 51, the upper solvent nozzle 54, and the upper gas nozzle 57 are held on the top lid 11 and arranged to be vertically raised/lowered together with the top lid 11. The upper rinse liquid nozzle 51, the upper solvent nozzle 54, and the upper gas nozzle 57 are disposed with a through hole vertically penetrating the central portion of the top lid 11. The upper rinse liquid nozzle 51 is connected to an upper rinse liquid pipe 52 with an upper rinse liquid valve 53 installed therein. The upper solvent nozzle 54 is connected to an upper solvent pipe 55 with an upper solvent valve 56 installed therein. The upper gas nozzle 57 is connected to an upper gas pipe 58 with an upper gas valve 59 installed therein.

The rinse liquid to be discharged through the upper rinse liquid nozzle 51 is pure water. The rinse liquid to be discharged through the upper rinse liquid nozzle 51 is not limited to pure water, but may be another rinse liquid such as described above.

The solvent liquid to be discharged through the upper solvent nozzle 54 is room-temperature IPA liquid. The IPA liquid is an example of a low-surface-tension liquid having a surface tension lower than that of water and a boiling point lower than that of water. The low-surface-tension liquid is not limited to IPA, but may be HFE (hydrofluoroether) liquid.

The gas to be supplied to the upper gas nozzle 57 is room-temperature nitrogen gas. The gas to be supplied to the upper gas nozzle 57 is not limited to nitrogen gas, but may be inert gas other than nitrogen gas, such as argon gas, or alternatively dried air or cleaned air. The temperature of the gas to be supplied to the upper gas nozzle 57 may be higher than the room temperature.

As shown in FIG. 32, the cup 38 can be raised/lowered vertically between an upper position (as shown in FIG. 32) and a lower position. The upper position is a processing position at which the upper end of the cup 38 is positioned at a height between the upper end of the lower peripheral wall portion 10 of the inner chamber 7 and the nozzle arm 49. The lower position is a retracted position at which the upper end of the cup 38 is positioned lower than the upper end of the lower peripheral wall portion 10 of the inner chamber 7. The processing unit 2 includes a cup raising/lowering unit (not shown) arranged to vertically raise/lower the cup 38 between the upper position and the lower position. When the top lid 11 and the cup 38 are at the upper position, the processing liquid discharged from the substrate W that is held on the first substrate holding unit 15 to around the substrate W is received by and collected in the cup 38. The processing liquid collected in the cup 38 is then sent to recovery equipment or waste liquid equipment not shown.

Figure 36:
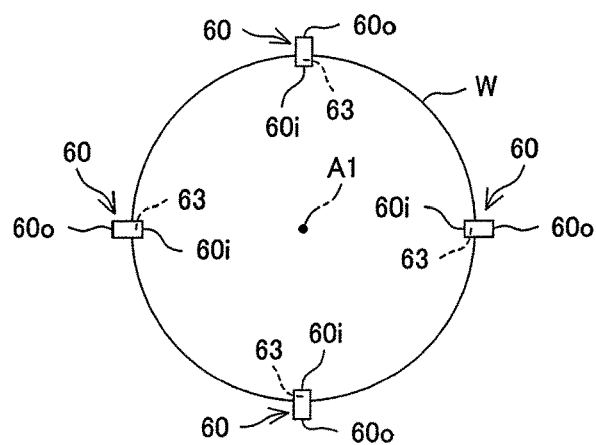
FIG. 36 is a plan view showing the positional relationship between multiple guiding members and the substrate.

As shown in FIG. 36, the processing unit 2 includes multiple (three or more, four, for example) guiding members 60 arranged to guide outward liquid on the substrate W. As shown in FIG. 35, the guiding members 60 each have a vertically extending first portion 61 and a second portion 62 extending inward (toward the rotational axis A1) from the first portion 61. The guiding members 60 are held on the top lid 11 and arranged to be vertically raised/lowered together with the top lid 11. As shown in FIG. 36, the multiple guiding members 60 are arranged in an equally spaced manner in the circumferential direction of the substrate W. The inner end 60i of each guiding member 60 is located at a position overlapping the substrate W in a plan view. The outer end 60o of each guiding member 60 is located at a position not overlapping the substrate W (around the substrate W) in a plan view.

The description of the guiding members 60 will hereinafter be continued based on the state where the top lid 11 is at the lower position. As shown in FIG. 35, each of the guiding members 60 has an inner surface opposed in a spaced manner to the upper surface and the peripheral portion of the substrate W. The inner surface of the guiding member 60 has an outward guiding surface 63 extending obliquely downward and outward and a downward guiding surface 64 extending vertically downward from the outer end 63o (lower end) of the outward guiding surface 63. The height of the inner end 63i of the outward guiding surface 63 is set to be at a higher position than the flat portion of the upper surface of the substrate W in an organic solvent heating step and an organic solvent removing step to be described hereinafter. The outer end 63o of the outward guiding surface 63 is located on the outer side of the substrate W. The height of the outer end 63o of the outward guiding surface 63 is set to be at a position lower than the upper surface of the substrate W and higher than the lower surface of the substrate W in the organic solvent heating step and the organic solvent removing step. The lower end of the downward guiding surface 64 is located lower than the substrate W in the organic solvent heating step and the organic solvent removing step.

As shown in FIG. 16A, the substrate W to be processed in the processing unit 2 is, for example, a silicon wafer with a pattern 101 formed on the front surface (upper surface 100) thereof serving as a pattern formed surface.

As shown in FIG. 16A, the pattern 101 may have convex (columnar) structures 102 arranged in a matrix manner. In this case, the width W1 of the structures 102 is, for example, about 10 to 45 nm. The gap W2 between adjacent the structures 102 is, for example, about 10 nm to a few micrometers. The film thickness T (see FIG. 16A) of the pattern 101 is, for example, about 50 nm to 5 μm. The aspect ratio (the ratio of the film thickness T to the width W1) of the pattern 101 may be, for example, about 5 to 500 (typically about 5 to 50).

The pattern 101 includes, for example, an insulating film. The pattern 101 may also include a conductor film. More specifically, the pattern 101 may be formed of a multi-layer film of multiple layered films. The multi-layer film may include an insulating film and a conductor film. The pattern 101 may alternatively be formed of a single-layer film. The insulating film may be a silicon oxide film ($SiO_2$ film) or a silicon nitride film (SiN film). The conductor film may be an amorphous silicon film into which impurities are introduced for resistance reduction or a metal film (metal wiring film, for example).

It is noted that the pattern 101 may include repetitively arranged linear patterns each defined by a fine trench. Alternatively, the pattern 101 may be defined by providing multiple fine holes (voids or pores) in a thin film.

Next will be described an example of processing to be performed on the substrate W in the processing unit 2. Hereinafter, reference will be made to FIGS. 32 and 40. For processing of the substrate W in the processing unit 2, a carry-in step (step S1 in FIG. 40) is performed to carry the substrate W into the outer chamber 4.

Specifically, the controller 3 causes the hand H of the delivery robot CR holding the substrate W to enter the outer chamber 4 with the top lid 11, the nozzle arm 49, and the cup 38 being retracted. The controller 3 then controls the delivery robot CR such that the substrate W on the hand H is placed on the multiple fixed pins 16. During this time, the hot plate 30 is located at a height at which the chuck opening/closing unit 25 can drive the movable pins 19, while at a position lower than the height at which contactable with the lower surface (rear surface) of the substrate W. Further, the chuck opening/closing unit 25 sets the movable pins 19 at the open position. The controller 3 retracts the hand H of the delivery robot CR from inside the outer chamber 4 after the substrate W is placed on the multiple fixed pins 16 with the front surface, that is, the pattern formed surface facing upward.

After the substrate W is placed on the fixed support portions 17 of the multiple fixed pins 16, the controller 3 controls the chuck opening/closing unit 25 to move the movable pins 19 from the open position to the closed position. This causes the movable gripping portions 22 of the movable pins 19 to be pressed against the peripheral portion of the substrate W and the fixed gripping portions 18 of the fixed pins 16 to be pressed against the peripheral portion of the substrate W. As a result, the substrate W is gripped by the fixed pins 16 and the movable pins 19 in the horizontal attitude. After the substrate W is thus gripped, the controller 3 then controls the ring rotating unit 24 to start rotating the substrate W. Further, the controller 3 raises the cup 38 to the upper position at which the cup 38 can receive the processing liquid discharged from the substrate 3.

Next, a chemical solution supplying step (step S2 in FIG. 40) is performed to supply chemical solution onto the substrate W.

Specifically, the controller 3 controls the arm swinging unit 50 to move the nozzle arm 49 from the retracted position to the processing position with the top lid 11 being retracted to the upper position and the hot plate 30 being set away from the substrate W. This causes the chemical solution nozzle 43 to move over the substrate W through between the lower peripheral wall portion 10 of the inner chamber 7 and the upper peripheral wall portion 13 of the inner chamber 7. After thus moving the chemical solution nozzle 43 over the substrate W, the controller 3 opens the chemical solution valve 45 to cause the chemical solution nozzle 43 to discharge chemical solution therethrough onto the upper surface of the rotating substrate W. In this state, the controller 3 controls the arm swinging unit 50 to move the chemical solution landing position on the upper surface of the substrate W between the central portion and the peripheral portion. When a predetermined time has elapsed since the opening of the chemical solution valve 45, the controller 3 then closes the chemical solution valve 45 to stop the discharge of the chemical solution.

The chemical solution discharged through the chemical solution nozzle 43 lands on the upper surface of the substrate W and then, under a centrifugal force, flows outward along the upper surface of the substrate W. The chemical solution splattering from the peripheral portion of the substrate W to around the substrate W then passes over the lower peripheral wall portion 10 of the inner chamber 7 to be received by the cup 38. The chemical solution is supplied onto the entire upper surface of the substrate W to form a liquid film covering the entire upper surface of the substrate W. Further, since the controller 3 moves the chemical solution landing position on the upper surface of the substrate W between the central portion and the peripheral portion with the substrate W rotating, the chemical solution landing position runs across the upper surface of the substrate W. As a result, the upper surface of the substrate W is processed uniformly with the chemical solution.

Next, a first rinse liquid supplying step (step S3 in FIG. 40) is performed to supply pure water, an example of the rinse liquid, onto the substrate W.

Specifically, the controller 3 opens the rinse liquid valve 48 with the rinse liquid nozzle 46 held on the nozzle arm 49 being positioned over the substrate W and the hot plate 30 being set away from the substrate W. This causes pure water to be discharged through the rinse liquid nozzle 46 toward the central portion of the upper surface of the rotating substrate W. As a result, the chemical solution on the substrate W is rinsed off by the pure water and a liquid film of pure water is formed covering the entire upper surface of the substrate W. When a predetermined time has elapsed since the opening of the rinse liquid valve 48, the controller 3 then closes the rinse liquid valve 48 to stop the discharge of the pure water. Thereafter, the controller 3 controls the arm swinging unit 50 to move the nozzle arm 49 from the processing position to the retracted position.

Next, an inner chamber sealing step (step S4 in FIG. 40) is performed to close the inner chamber 7.

Specifically, the controller 3 controls the lid raising/lowering unit 14 to move the top lid 11 from the upper position to the lower position with the nozzle arm 49 being retracted to the retracted position and the entire upper surface of the substrate W being covered with the liquid film of pure water. This causes the gap between the upper peripheral wall portion 13 of the top lid 11 and the lower peripheral wall portion 10 of the chamber main body 8 to be sealed. During this time, the substrate W is gripped by the fixed pins 16 and the movable pins 19. Also, the hot plate 30 is set away from the substrate W at a height at which heat from the heaters 33, if may be generated, is not sufficiently transferred to the substrate W.

Next, a second rinse liquid supplying step (step S5 in FIG. 40) is performed to supply pure water, an example of the rinse liquid, onto the substrate W.

Specifically, after the top lid 11 is moved to the lower position, the controller 3 opens the upper rinse liquid valve 53 to cause the upper rinse liquid nozzle 51 to discharge pure water therethrough toward the central portion of the upper surface of the rotating substrate W. This causes a liquid film covering the entire upper surface of the substrate W to be formed by the pure water discharged through the upper rinse liquid nozzle 51. The pure water splattering from the peripheral portion of the substrate W to around the substrate W is discharged through the bottom wall portion 9 of the chamber main body 8. When a predetermined time has elapsed since the opening of the upper rinse liquid valve 53, the controller 3 closes the upper rinse liquid valve 53 to stop the discharge of the pure water.

Next, an organic solvent supplying step (step S6 in FIG. 40) is performed to supply IPA liquid, an example of the organic solvent, onto the substrate W with the inner chamber 7 being closed.

Specifically, the controller 3 opens the upper solvent valve 56 with the inner chamber 7 being closed and the entire upper surface of the substrate W being covered with the liquid film of pure water. During this time, the substrate W is gripped by the fixed pins 16 and the movable pins 19 and the hot plate 30 is set away from the substrate W. The IPA liquid discharged through the upper solvent nozzle 54 lands on the central portion of the upper surface of the rotating substrate W and flows outward along the upper surface of the substrate W. This causes the pure water on the substrate W to be replaced with the IPA liquid and an IPA liquid film to be formed covering the entire upper surface of the substrate W. When a predetermined time has elapsed since the opening of the upper solvent valve 56, the controller 3 then closes the upper solvent valve 56 to stop the discharge of the IPA.

While the upper solvent nozzle 54 discharges the IPA liquid therethrough, the rotational speed of the substrate W may be constant or change. For example, the substrate W may be rotated at a replacement accelerating speed (800 rpm, for example) only in the early period of the discharge of the IPA liquid to accelerate the replacement of pure water with IPA, and then rotated at a post-replacement speed lower than the replacement accelerating speed. After the completion of the replacement with IPA, an IPA puddle covering the entire upper surface of the substrate W may be maintained on the substrate W with the discharge of the IPA being stopped. Specifically, the discharge of the IPA through the upper solvent nozzle 54 may be stopped after reducing the rotational speed of the substrate W to a puddling speed (higher than 0 but lower than 50 rpm, 20 rpm, for example) or stopping the rotation of the substrate W. In this case, since the amount of IPA discharge from the substrate W decreases with a reduction in the centrifugal force, an IPA puddle with a predetermined film thickness is maintained on the substrate W.

Next, a first substrate transferring step (step S7 in FIG. 40) is performed to move the substrate W from the first substrate holding unit 15 to the second substrate holding unit 29. Specifically, the controller 3 controls the rotational angle of the support ring 23 and the height of the hot plate 30 to move the chuck opening/closing unit 25 and the movable pins 19 to a position at which the chuck opening/closing unit 25, which is held on the hot plate 30, can drive the movable pins 19 on the support ring 23. The controller 3 then controls the chuck opening/closing unit 25 to move the movable pins 19 from the closed position to the open position. This causes the gripping of the substrate W by the fixed pins 16 and the movable pins 19 to be released, so that the substrate W is supported by the multiple fixed pins 16 without being gripped thereby. The controller 3 controls the plate raising/lowering unit 37 to move the hot plate 30 upward. This causes the substrate W to be raised by the support pins 32 of the hot plate 30 away from the multiple fixed pins 16. The controller 3 raises the hot plate 30 to a position short of where the IPA liquid film on the substrate W comes into contact with the outward guiding surface 63 and the downward guiding surface 64 of the guiding member 60 (see FIG. 35).

Next will be described in detail the temperature setting for the heaters 33 in an organic solvent heating step (step S8 in FIG. 40).

If the pattern formed on the front surface of the substrate W has a small height as shown in FIG. 43A, the controller 3 sets the liquid film raising temperature (the temperature of the hot plate 30) lower within the range equal to or higher than the boiling point of IPA. As needed, the controller 3 further performs at least one of (1 L) reducing the time for which the hot plate 30 heats the substrate W at the liquid film raising temperature for lower power consumption and (2 L) reducing the thickness of the IPA liquid film formed on the substrate W, that is, the amount of the IPA liquid on the substrate W in the organic solvent supplying step (step S6 in FIG. 40) for lower consumption of the IPA liquid.

On the contrary, if the pattern formed on the front surface of the substrate W has a large height as shown in FIG. 43B, the controller 3 sets the liquid film raising temperature higher within the range equal to or higher than the boiling point of IPA. As needed, the controller 3 further performs at least one of (1H) increasing the time for which the hot plate 30 heats the substrate W at the liquid film raising temperature for more reliably raising of the IPA liquid film and (2H) increasing the thickness of the IPA liquid film formed on the substrate W, that is, the amount of the IPA liquid on the substrate W in the organic solvent supplying step (step S6 in FIG. 40) for reliably covering of the entire pattern with the IPA liquid film.

If the pattern has a small and uniform height as shown in FIG. 43A, the controller 3 performs all of, for example, a reduction in the liquid film raising temperature (heating temperature), a reduction in the heating time, and a reduction in the amount of IPA liquid. The controller 3 further causes the hot plate 30 to heat the upper surface of the substrate W uniformly.

If the pattern has a large and uniform height as shown in FIG. 43B, the controller 3 performs all of, for example, an increase in the liquid film raising temperature (heating temperature), an increase in the heating time, and an increase in the amount of IPA liquid. The controller 3 further causes the hot plate 30 to heat the upper surface of the substrate W uniformly.

If the pattern has a non-uniform height as shown in FIG. 43C, the controller 3 controls the multiple heaters 33 to adjust the temperature distribution of the hot plate 30 according to the height of the pattern. For example, if the pattern has a smaller height in the central portion of the upper surface of the substrate W but has a larger height in the peripheral portion of the upper surface of the substrate W, the controller 3 controls the multiple heaters 33 such that the peripheral portion of the hot plate 30 has a temperature higher than that of the central portion of the hot plate 30. The controller 3 further performs an increase in the heating time and an increase in the amount of IPA liquid.

Figure 45:
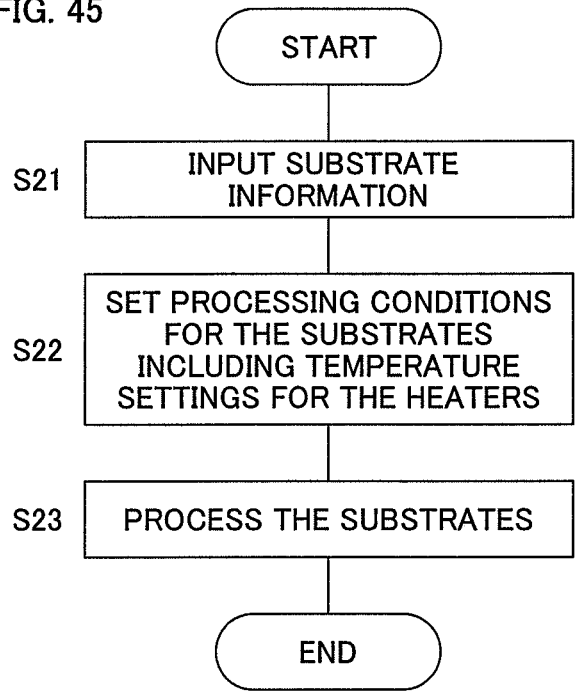
FIG. 45 is a process chart showing an example of flow from the input of substrate information into the substrate processing apparatus to the processing of the substrate.

When a carrier C (see FIG. 1) housing therein multiple substrates W included in one lot is placed on the load port LP of the substrate processing apparatus 1, substrate information indicating information on the substrates W in the carrier C is sent from a host computer to the controller 3 (step S21 in FIG. 45). The host computer is arranged to control multiple semiconductor processing apparatuses installed in the semiconductor manufacturing facility. As will be described hereinafter, the controller 3 sets processing conditions for the substrates W based on the substrate information sent from the host computer (step S22 in FIG. 45). The controller 3 then causes the substrate processing apparatus 1 to process the substrates W in the carrier C according to the set processing conditions (step S23 in FIG. 45). When a different carrier C is placed on a load port LP, the flow sequence is repeated. That is, the processing conditions for the substrates W are set for each lot.

The substrate information includes at least one of the shape, size, and material of the pattern. The pattern shape represents, for example, whether the pattern formed on the substrate W is linear or cylindrical. If the pattern formed on the substrate W is linear, the pattern size includes the height, width, and length of the pattern. If the pattern formed on the substrate W is cylindrical, the pattern size includes the outer diameter, inner diameter, and height of the pattern. The pattern material represents, for example, whether the pattern is formed of a metal or insulating material. If the pattern is composed of a multi-layer film, the pattern material includes the material of each film included in the multi-layer film.

Figure 44:
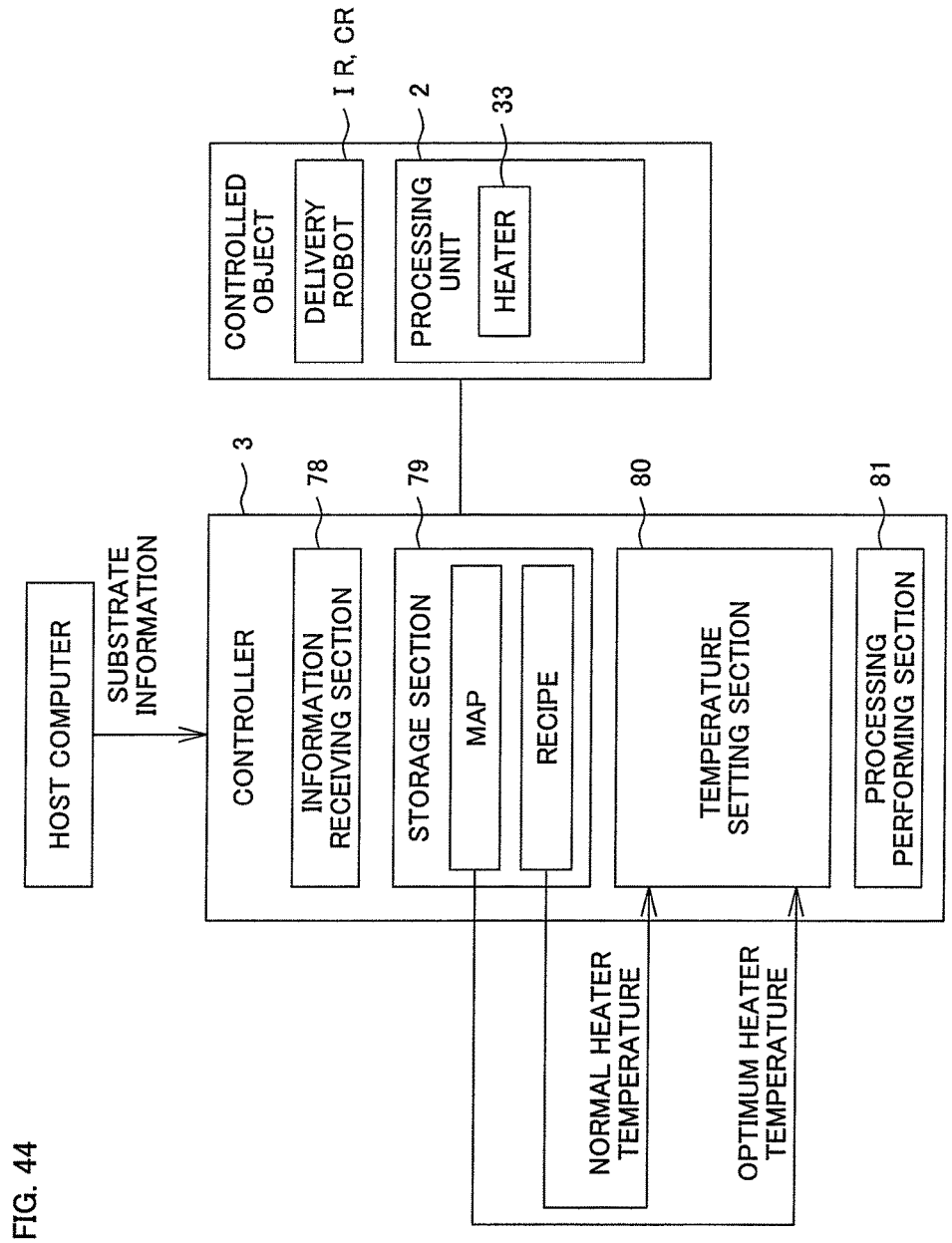
FIG. 44 is a block diagram for illustrating the electrical configuration of the substrate processing apparatus.

As shown in FIG. 44, the controller 3 includes an information receiving section 78 arranged to receive substrate information, a storage section 79 in which a map indicating the relationship between the substrate information and the preset temperature for the multiple heaters 33 and a recipe indicating processing conditions for the substrates W are stored, a temperature setting section 80 arranged to set a temperature for each of the multiple heaters 33 based on the substrate information received by the information receiving section 78, and a processing performing section 81 arranged to cause the substrate processing apparatus 1 to process the substrates W based on the conditions specified in the recipe. The substrate information received by the information receiving section 78 may be sent from an external device such as a host computer or may be received by the information receiving section 78 through an input device included in the substrate processing apparatus 1.

The substrate information sent from the host computer is received by the information receiving section 78 of the controller 3. The temperature setting section 80 of the controller 3 retrieves the preset temperature for the multiple heaters 33 corresponding to the substrate information received by the information receiving section 78 from the map stored in the storage section 79 of the controller 3 and compares the retrieved temperature setting and the preset temperature specified in the recipe. If the preset temperatures are different, the temperature setting section 80 changes the preset temperature specified in the recipe to the preset temperature corresponding to the substrate information. The processing performing section 81 of the controller 3 then causes the substrate processing apparatus 1 to process the substrates W as shown in FIG. 40 based on the recipe sent from the temperature setting section 80 (after being modified if the preset temperature retrieved by the temperature setting section 80 is different from the preset temperature specified in the recipe).

If the heat capacity of the pattern and/or the heat transfer coefficient between the pattern and liquid vary, the temperature of the surface of the pattern increases or decreases even if the temperature of the hot plate 30 may be constant. If the temperature of the surface of the pattern is lower than the boiling point of IPA, the IPA liquid is not vaporized sufficiently on the surface of the pattern, and thus the gaseous phase formed between the IPA liquid film and the upper surface of the substrate W does not have a sufficient thickness. Also, if the temperature of the surface of the pattern is too high, the IPA liquid may boil and/or a crack or the like may occur in the IPA liquid film.

The heat capacity of the pattern varies depending on the mass and the specific heat of the pattern. The mass of the pattern depends on the density and the volume of the pattern. The specific heat of the pattern depends on the material of the pattern. The heat transfer coefficient between the pattern and liquid depends on the surface area of the pattern. The surface area of the pattern depends on the shape and the volume of the pattern.

For example, if the pattern has a high aspect ratio, the contact area between the surface of the pattern and the IPA liquid increases and the efficiency of heat transfer from the substrate W to the IPA liquid also increases, resulting in that the temperature of the substrate W can easily decrease. On the contrary, if the pattern has a low aspect ratio, the temperature of the substrate W can easily increase. Further, if the pattern has a high aspect ratio, the amount of IPA liquid existing within the pattern increases, so that it is necessary to provide a larger amount of heat to the substrate W to remove the IPA liquid within the pattern in a short time.

As described above, in the second preferred embodiment, the controller 3 sets a temperature of the multiple heaters 33 based on the substrate information including the surface condition of the substrate W such as the size of the pattern. This allows the temperature of the entire upper surface of the substrate W to be uniformized regardless of the surface condition of the substrate W. Further, the controller 3 sets a temperature of the multiple heaters 33 for each lot. Substrates W belonging to the same rod undergo the same processing and therefore have the same surface condition. Different rods may have their respective different surface conditions of the substrate W. It is therefore possible to uniformize the quality of processed substrates W by setting a temperature of the multiple heaters 33 for each lot.

Also, in the second preferred embodiment, the outward guiding surfaces 63 of the guiding members 60 come into contact with the peripheral portion of the IPA liquid film on the substrate W with the gaseous phase existing between the IPA liquid film and the upper surface of the substrate W. The IPA liquid coming into contact with the outward guiding surfaces 63 is discharged to around the substrate W along the guiding members 60. With this contact between the guiding members 60 and the liquid film, an outward flow toward the peripheral portion of the substrate W is formed in the IPA liquid film, so that the film of the IPA liquid film on the substrate W is removed from the substrate directly as a mass without being split into a number of small droplets. This allows the IPA liquid film to be removed quickly from the substrate in a short time.

Furthermore, in the second preferred embodiment, the substrate W is dried with the IPA liquid, an example of the low-surface-tension liquid, being positioned on the substrate W. Since the liquid on the substrate W before drying has a low surface tension, even if a liquid surface across two adjacent structures may be formed temporarily, only a low surface tension is applied on the pattern 101. It is therefore possible to reduce the occurrence of pattern destruction. Further, since the volatile liquid (IPA liquid) is supplied onto the substrate W, it is possible to form a gaseous phase between the IPA liquid film and the upper surface of the substrate W while avoiding a rise in the temperature of the heaters 33.

Also, in the second preferred embodiment, the inner chamber 7 to house the first substrate holding unit 15 and the second substrate holding unit 29 therein is disposed within the outer chamber 4. Since the inner chamber 7 is openable/closable, the interior of the inner chamber 7 can be isolated from the interior of the outer chamber 4 excluding the inner chamber 7 as needed. It is therefore possible to form a space with a high degree of sealing with a double enclosure provided by the inner chamber 7 and the outer chamber 4 as needed. It is thus possible to perform processing such as heating of the substrate W within the space of such a high degree of sealing. Further, since only by opening the inner chamber 7, a nozzle arranged to discharge gas or liquid therethrough can be transferred between the inside and outside of the inner chamber 7, there is no need to dispose such a nozzle within the inner chamber 7. It is therefore possible to suppress or prevent the inner chamber 7 from growing in size.

Further, in the second preferred embodiment, since inert gas can be supplied into the inner chamber 7 housing the first substrate holding unit 15 and the second substrate holding unit 29, the air inside the inner chamber 7 can be replaced with the inert gas and the concentration of oxygen within the inner chamber 7 can be lowered. It is therefore possible to prevent the occurrence of problems caused by oxygen, such as watermarks.

While the second preferred embodiment of the present invention has heretofore been described, the present invention is not limited to the disclosure of the second preferred embodiment, but may be modified variously within the scope of the present invention.

Although the second preferred embodiment has been described, for example, based on the case where the guiding members 60 are brought into contact with the IPA liquid film on the substrate W, liquid film of the IPA is removed from the substrate W, a processing liquid removing unit other than the guiding members 60 may be used.

Figure 40:
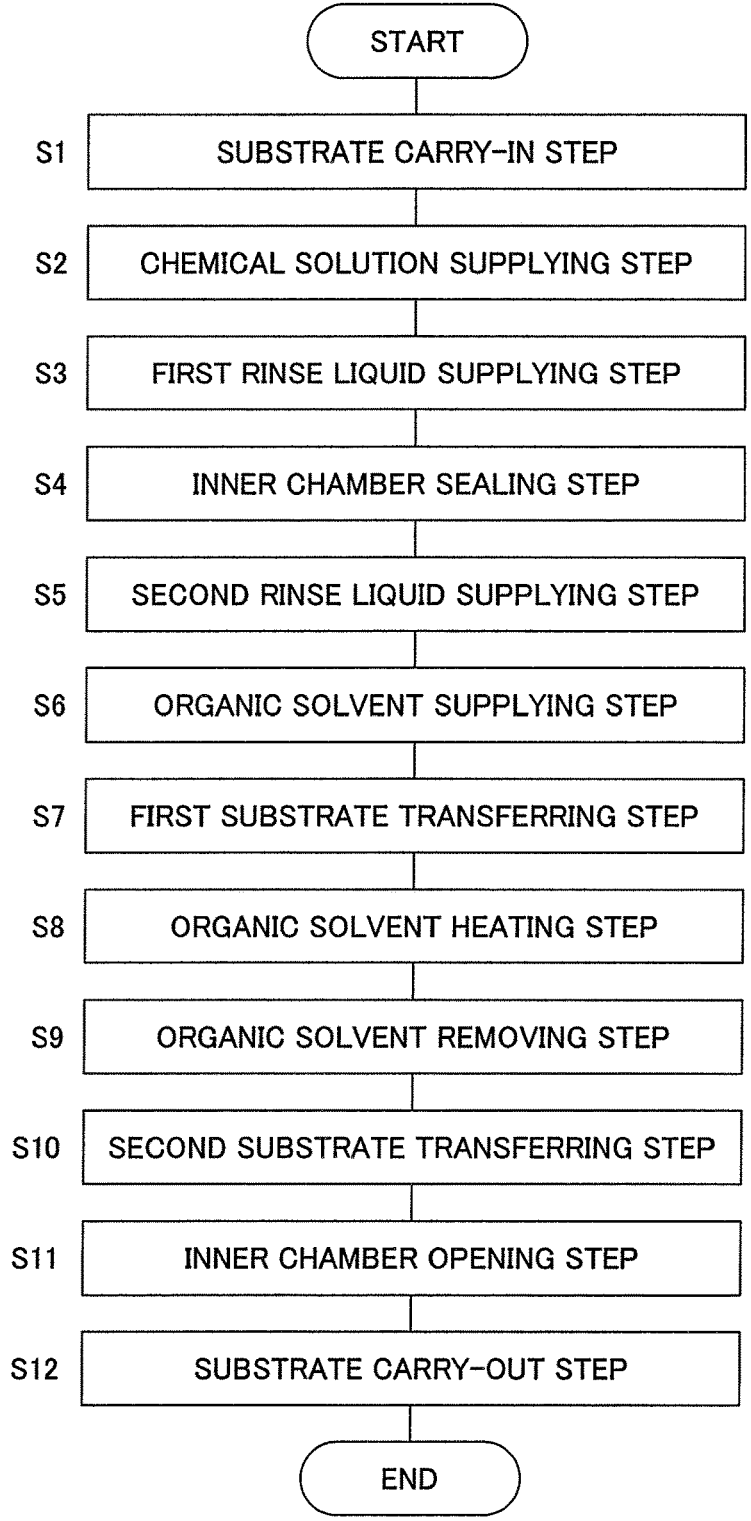
FIG. 40 is a process chart for illustrating an example of processing to be performed on the substrate in the processing unit.
Figure 41:
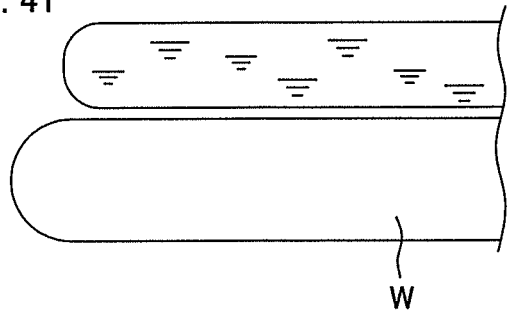
FIG. 41 is a schematic view showing a state where a film of IPA liquid is raised over the upper surface of the substrate.
Figure 42:
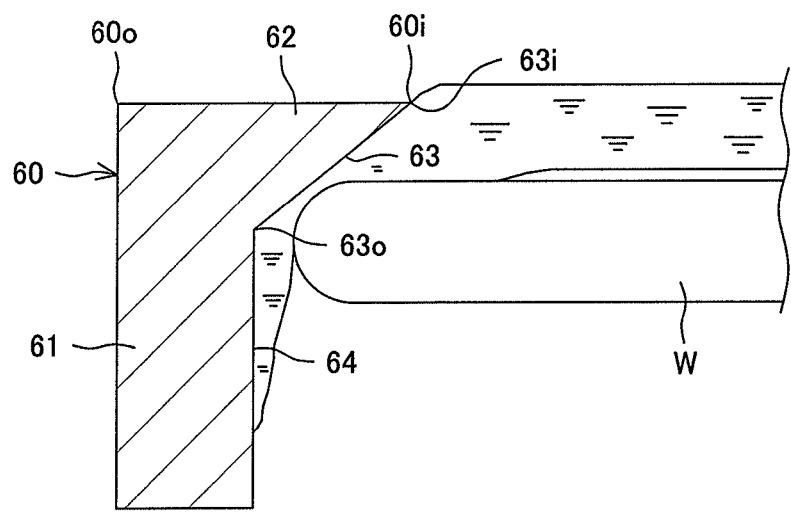
FIG. 42 is a schematic view showing a state where the film of IPA liquid on the substrate is guided by the guiding member.
Figure 46:
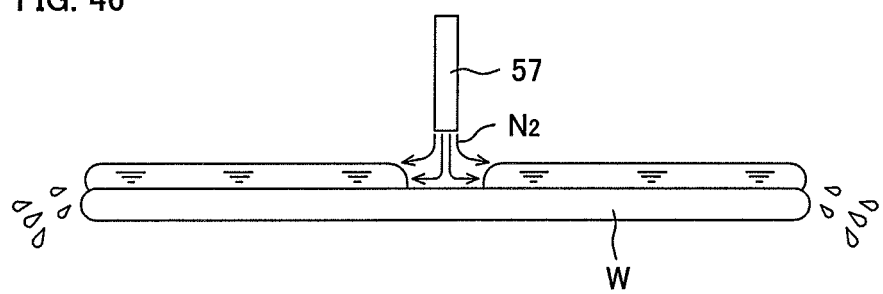
FIG. 46 is a schematic view showing an organic solvent removing step according to a first exemplary variation of the second preferred embodiment of the present invention.

Specifically, as shown in FIG. 46, the controller 3 may open the upper gas valve 59 to cause the upper gas nozzle serving as a processing liquid removing unit to discharge nitrogen gas therethrough in the organic solvent removing step (step S9 in FIG. 40). In this case, the nitrogen gas may have a room temperature or a temperature equal to or higher than the boiling point of IPA (preferably equal to or higher than the temperature of the hot plate 30). The discharge of nitrogen gas may also be continued until the IPA liquid film goes off the substrate W or may be stopped before the IPA liquid film goes off the substrate W.

In accordance with the arrangement above, nitrogen gas is blown to the central portion (blow position) of the upper surface of the substrate W, with the gaseous phase being formed between the IPA liquid film and the upper surface of the substrate W. When the nitrogen gas is thus supplied, the IPA liquid at the blow position is displaced to the periphery. This causes a dried region to be formed at the blow position. Further, when the nitrogen gas is thus supplied, the IPA liquid moves from the blow position to the periphery, and an outward flow toward the peripheral portion of the substrate W occurs in the IPA liquid film. Under the flow, the IPA liquid film on the substrate W is removed from the substrate W directly as a mass without being split into a number of small droplets. It is therefore possible to remove the IPA liquid film quickly from the substrate W in a short time. Further, if the nitrogen gas has a temperature equal to or higher than the boiling point of IPA, it is possible to prevent the temperature of the IPA liquid film from decreasing. Alternatively, it is possible to heat the IPA liquid film.

Figure 47A:
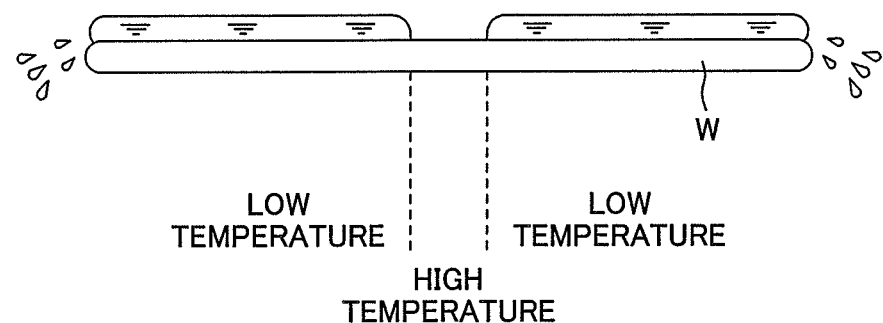
FIG. 47A is a schematic view showing an organic solvent removing step according to a second exemplary variation of the second preferred embodiment of the present invention, showing a state where a low-temperature region and a high-temperature region are formed in the upper surface of a substrate.
Figure 47B:
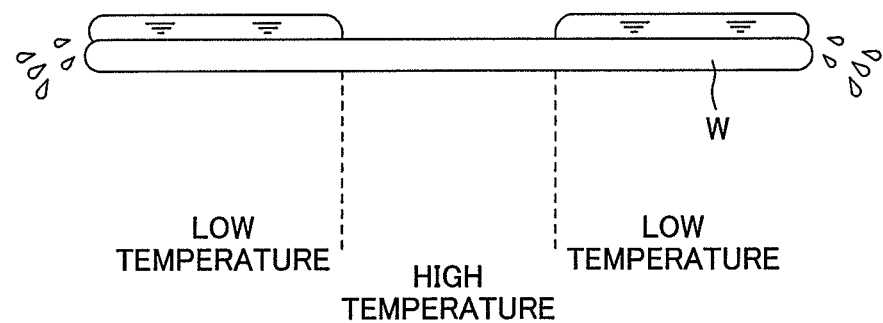
FIG. 47B is a schematic view showing a state where a high-temperature region is enlarged outward in an organic solvent removing step according to a third exemplary variation of the second preferred embodiment of the present invention.

Also, as shown in FIGS. 47A and 47B, the controller 3 may control the preset temperature for the multiple heaters serving as a processing liquid removing unit to heat the substrate W uniformly at a temperature equal to or higher than the boiling point of IPA in the organic solvent heating step (step S8 in FIG. 40) and to form, in the upper surface of the substrate W, a low-temperature region with a temperature equal to or higher than the boiling point of IPA and a high-temperature region with a temperature higher than that of the low-temperature region in the organic solvent removing step (step S9 in FIG. 40). For example, after forming the high-temperature region in the central portion of the upper surface of the substrate W and the low-temperature region surrounding the high-temperature region, the controller 3 may move the annular boundary between the low-temperature region and the high-temperature region toward the low-temperature region. That is, the controller 3 may increase the diameter of the boundary between the low-temperature region and the high-temperature region.

In the case above, the central portion of the IPA liquid film covering the central portion of the upper surface of the substrate W has a temperature higher than that of the portion surrounding the central portion. The IPA liquid in the liquid film tends to move toward the lower temperature. Therefore, a radial flow toward the peripheral portion of the liquid film occurs in the IPA liquid film. As a result, a hole is formed in the central portion of the IPA liquid film, as shown in FIGS. 47A and 47B, and the outer diameter of the hole increases. It is therefore possible to remove the IPA liquid film quickly from the substrate W in a short time by utilizing both the generation of temperature difference and the guiding member 60. Further, when the boundary between the low-temperature region and the high-temperature region is moved toward the low-temperature region, the flow toward the lower temperature is facilitated in the liquid film. This allows the IPA liquid film on the substrate W to be removed efficiently.

Figure 48A:
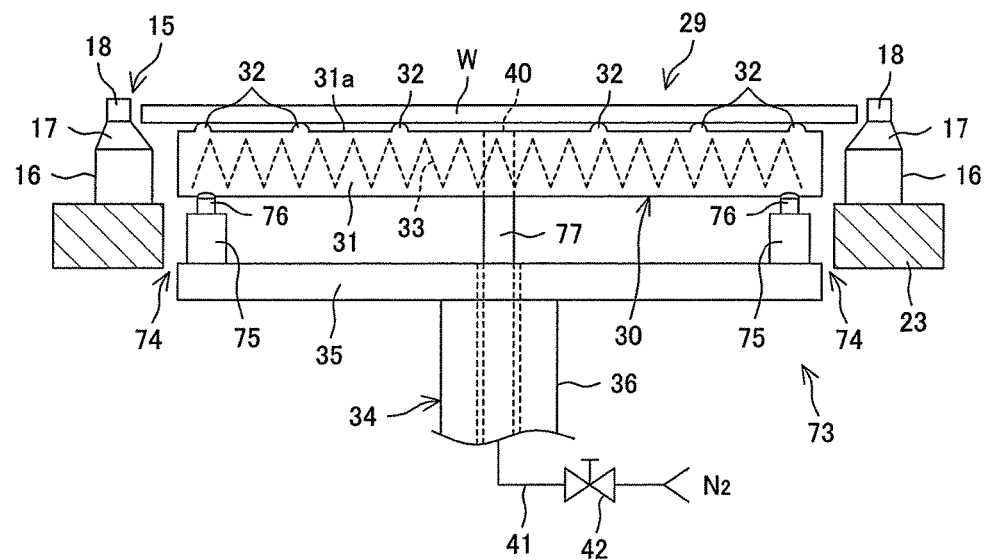
FIG. 48A is a schematic view of an attitude changing unit according to a fourth exemplary variation of the second preferred embodiment of the present invention when viewed horizontally.
Figure 48B:
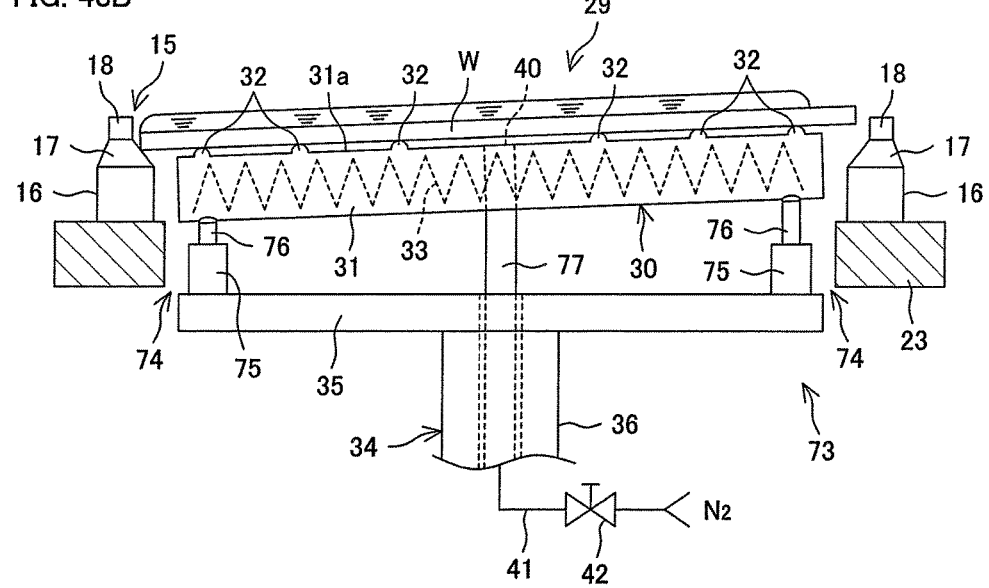
FIG. 48B is a schematic view showing a state where the substrate and the hot plate are tilted by the attitude changing unit.

As shown in FIGS. 48A and 48B, if the guiding member is not provided in the processing unit 2, the processing unit 2 may further include an attitude changing unit 73 arranged to cause the substrate W and the hot plate 30 to undergo an attitude change between a horizontal attitude in which the upper surface of the substrate W is horizontal and a tilted attitude in which the upper surface of the substrate W is tilted with respect to the horizontal surface, while keeping constant the space between the lower surface of the substrate W and upper surface of the hot plate 30 (the upper surface 31a of the plate main body 31).

The attitude changing unit 73 serving as a processing liquid removing unit includes multiple (three or more) extensible units 74 disposed between the hot plate 30 and the support table 34. The multiple extensible units 74 are disposed on the table portion 35 of the support table 34. The multiple extensible units 74 are arranged in an equally spaced manner in the circumferential direction in a peripheral portion of the upper surface of the table portion 35. Each of the extensible units 74 is, for example, an air cylinder. The extensible unit 74 is not limited to an air cylinder, but may be a unit including an actuator such as an electric motor and a transmitting unit (ball screw mechanism, for example) arranged to transmit power from the actuator to the hot plate 30.

The extensible unit 74 includes a cylinder main body 75 fixed to the table portion 35 of the support table 34 and a rod 76 vertically movable with respect to the cylinder main body 75. The cylinder main body 75 is disposed between the hot plate 30 and the support table 34. The rod 76 protrudes upward from the cylinder main body 75. The hot plate 30 is supported by the multiple extensible units 74 through contact between each rod 76 and the lower surface of the hot plate 30. The upward discharge port 40 opened in the central portion of the upper surface of the hot plate 30 is connected to an elastically deformable lower pipe 77 extending downward from a central portion of the hot plate 30. The lower pipe 77 is inserted in a passage provided inside the shaft portion 36 of the support table 34 and connected to the lower gas pipe 41.

The amount of protrusion of the rod 76 from the cylinder main body 75 is set by the controller 3 for each extensible unit 74. The controller 3 adjusts the amount of protrusion of each rod 76 to change the attitude of the substrate W and the hot plate 30 between the horizontal attitude and the tilted attitude. The tilt angle (with respect to the horizontal) of the upper surface of the hot plate 30 at the tilted attitude is as small as about 1 degree, for example. The substrate W is therefore held by a frictional force acting between the lower surface of the substrate W and the hot plate 30. Even if the substrate W may slide with respect to the hot plate 30, the movement of the substrate W with respect to the hot plate 30 can be restricted if stoppers such as the fixed pins 16 and/or the movable pins 19 are positioned around the substrate W, as shown in FIG. 48B.

As shown in FIG. 48B, the controller 3 changes the attitude of the substrate W and the hot plate 30 to the tilted attitude in the organic solvent removing step (step S9 in FIG. 40). Since the substrate W is thus tilted, the IPA liquid film on the substrate W flows downward along the upper surface of the substrate W. It is therefore possible to remove the IPA liquid film quickly from the substrate W in a short time. In addition, since the space between the heaters 33 and the substrate W in a direction perpendicular to the upper surface of the substrate W is kept constant, uneven heating is less likely to occur compared to the case where only the substrate W is tilted, whereby it is possible to continuously heat the substrate W stably.

Although in the second preferred embodiment, the case where the IPA liquid film is raised in the organic solvent heating step (step S8 in FIG. 40) has been described, a liquid film of liquid other than IPA may be raised. For example, a liquid film of pure water may be raised in a liquid film heating step corresponding to the organic solvent heating step, and the liquid film of pure water may be removed in a liquid film removing step corresponding to the organic solvent removing step.

In the organic solvent heating step (step S8 in FIG. 40), IPA liquid may be added appropriately to the upper surface of the substrate W to prevent the upper surface of the substrate W from being exposed partially.

Although in the preferred embodiments above, the case where the substrate processing apparatus 1 is arranged to process disk-shaped substrates has been described, the substrate processing apparatus 1 may be arranged to process polygonal substrates.

Features of two or more of the various preferred embodiments described above may be combined.

This application corresponds to Japanese Patent Application No. 2014-056768 filed in the Japan Patent Office on Mar. 19, 2014, and Japanese Patent Application No. 2014-063697 filed in the Japan Patent Office on Mar. 26, 2014, the disclosures of which are incorporated herein by reference in its entirety.

While the present invention has been described in detail by way of the embodiments thereof, it should be understood that embodiments are merely illustrative of the technical principles of the present invention but not limitative of the invention. The spirit and scope of the present invention are to be limited only by the appended claims.

What is claimed is:

1. A substrate processing method of drying an upper surface of a substrate that is held horizontally, the substrate processing method comprising:
   a processing liquid supplying step of supplying processing liquid onto the upper surface of the substrate;
   a substrate heating step of heating the substrate to heat the processing liquid on the upper surface of the substrate;
   a processing liquid removing step of removing the processing liquid from the upper surface of the substrate;
   a processing liquid condition detecting step of detecting a height of a liquid surface of a liquid film of the processing liquid on the upper surface of the substrate in parallel with at least one of the processing liquid supplying step, the substrate heating step, and the processing liquid removing step; and
   a controlling step of controlling at least one of the processing liquid supplying step, the substrate heating step, and the processing liquid removing step based on a detection result in the processing liquid condition detecting step.

2. The substrate processing method according to claim 1, wherein
the processing liquid condition detecting step detects the height of the liquid surface of the liquid film of the processing liquid covering the upper surface of the substrate in parallel with the processing liquid supplying step, and wherein
the controlling step stops a supply of the processing liquid in the processing liquid supplying step based on the height of the liquid surface of the liquid film detected in the processing liquid condition detecting step.

3. The substrate processing method according to claim 1, wherein
the processing liquid condition detecting step detects the height of the liquid surface of the liquid film of the processing liquid covering the upper surface of the substrate in parallel with the substrate heating step, and wherein
the controlling step stops a heating of the processing liquid in the substrate heating step based on the height of the liquid surface of the liquid film detected in the processing liquid condition detecting step.

4. The substrate processing method according to claim 1, wherein the substrate heating step causes the upper surface of the substrate to reach a temperature equal to or higher than a boiling point of the processing liquid, with the upper surface of the substrate being covered with a liquid film of the processing liquid, to form a gaseous phase of the processing liquid across the upper surface of the substrate between the liquid film of the processing liquid and the upper surface of the substrate and raise the film of the processing liquid over the substrate.

5. The substrate processing method according to claim 1, wherein the processing liquid condition detecting step detects the height of the liquid surface of the liquid film of the processing liquid on the upper surface of the substrate based on whether the liquid film of the processing liquid on the upper surface of the substrate has reached a light emitted from a light emitting device toward a light receiving device.

6. A substrate processing method of drying an upper surface of a substrate that is held horizontally, the substrate processing method comprising:
a processing liquid supplying step of supplying processing liquid onto the upper surface of the substrate;
a substrate heating step of heating the substrate to heat the processing liquid on the upper surface of the substrate;
a processing liquid removing step of removing the processing liquid from the upper surface of the substrate;
a processing liquid condition detecting step of detecting a condition of the processing liquid on the upper surface of the substrate in parallel with at least one of the processing liquid supplying step, the substrate heating step, and the processing liquid removing step; and
a controlling step of controlling at least one of the processing liquid supplying step, the substrate heating step, and the processing liquid removing step based on a detection result in the processing liquid condition detecting step,
wherein
the processing liquid condition detecting step detects a form of a liquid film of the processing liquid on the upper surface of the substrate in parallel with the substrate heating step, and wherein
the controlling step determines whether or not the form of the liquid film of the processing liquid is abnormal based on the form of the liquid film detected in the processing liquid condition detecting step.

7. The substrate processing method according to claim 6, wherein the substrate heating step causes the upper surface of the substrate to reach a temperature equal to or higher than a boiling point of the processing liquid, with the upper surface of the substrate being covered with a liquid film of the processing liquid, to form a gaseous phase of the processing liquid across the upper surface of the substrate between the liquid film of the processing liquid and the upper surface of the substrate and raise the film of the processing liquid over the substrate.

8. A substrate processing method of drying an upper surface of a substrate that is held horizontally, the substrate processing method comprising:
a processing liquid supplying step of supplying processing liquid onto the upper surface of the substrate;
a substrate heating step of heating the substrate to heat the processing liquid on the upper surface of the substrate;
a processing liquid removing step of removing the processing liquid from the upper surface of the substrate;
a processing liquid condition detecting step of detecting a condition of the processing liquid on the upper surface of the substrate in parallel with at least one of the processing liquid supplying step, the substrate heating step, and the processing liquid removing step; and
a controlling step of controlling at least one of the processing liquid supplying step, the substrate heating step, and the processing liquid removing step based on a detection result in the processing liquid condition detecting step,
wherein
the processing liquid condition detecting step detects a condition of the processing liquid on the upper surface of the substrate in parallel with the processing liquid removing step, and wherein
the controlling step determines whether or not droplets of the processing liquid remain on the upper surface of the substrate based on the condition of the processing liquid detected in the processing liquid condition detecting step.

9. The substrate processing method according to claim 8, wherein the substrate heating step causes the upper surface of the substrate to reach a temperature equal to or higher than a boiling point of the processing liquid, with the upper surface of the substrate being covered with a liquid film of the processing liquid, to form a gaseous phase of the processing liquid across the upper surface of the substrate between the liquid film of the processing liquid and the upper surface of the substrate and raise the film of the processing liquid over the substrate.

* * * * *